United States Patent
Li et al.

(10) Patent No.: US 8,773,909 B2
(45) Date of Patent: Jul. 8, 2014

(54) CAM NAND WITH OR FUNCTION AND FULL CHIP SEARCH CAPABILITY

(71) Applicant: SanDisk Technologies Inc., Plano, TX (US)

(72) Inventors: Yan Li, Milpitas, CA (US); Steven T. Sprouse, San Jose, CA (US)

(73) Assignee: SanDisk Technologies Inc., Plano, TX (US)

( * ) Notice: Subject to any disclaimer, the term of this patent is extended or adjusted under 35 U.S.C. 154(b) by 0 days.

(21) Appl. No.: 13/957,219

(22) Filed: Aug. 1, 2013

(65) Prior Publication Data

US 2014/0136763 A1    May 15, 2014

Related U.S. Application Data

(63) Continuation-in-part of application No. 13/827,407, filed on Mar. 14, 2013, which is a continuation-in-part of application No. 13/756,076, filed on Jan. 31, 2013, which is a continuation-in-part of application No. 13/749,361, filed on Jan. 24, 2013, now Pat. No. 8,634,247.

(60) Provisional application No. 61/724,401, filed on Nov. 9, 2012, provisional application No. 61/730,884, filed on Nov. 28, 2012.

(51) Int. Cl.
*G11C 16/04* (2006.01)

(52) U.S. Cl.
USPC ............................................. 365/185.17

(58) Field of Classification Search
USPC ........................................ 365/185.01–185.33
See application file for complete search history.

(56) References Cited

U.S. PATENT DOCUMENTS

| | | |
|---|---|---|
| 5,602,789 A | 2/1997 | Endoh et al. |
| 5,642,322 A | 6/1997 | Yoneda |

(Continued)

FOREIGN PATENT DOCUMENTS

| | | |
|---|---|---|
| EP | 1720168 | 11/2006 |
| EP | 1988474 | 11/2008 |
| WO | WO 2011/007304 | 1/2011 |

OTHER PUBLICATIONS

Maeda et al., "Multi-Stacked 1G Cell-Layer Pipe-Shaped BiCS Flash Memory," 2009 Symposium on VLSI Circuits, pp. 22-23.

(Continued)

*Primary Examiner* — Harry W Byrne
(74) *Attorney, Agent, or Firm* — Davis Wright Tremaine LLP

(57) ABSTRACT

Various techniques for extending the capabilities of CAM NAND type memories are discussed. Multi-block or even full chip search operations can be performed. In addition to the inherent AND property of NAND strings, the memory array has an inherent OR property between NAND string from different blocks along the same bit line that can be exploited through multi-block CAM-type operations. To reduce data-dependent word line to word line effects, in multiple data dependent sensing operations, the sensing can be broken up into sub-operations that avoid data dependent values on adjacent word lines. To improve data protection, subsequent to writing a memory block with indices, the word lines are read back and compared bit-by-bit with their intended values and the results are accumulated to determine whether any of indices include error. A bloom filter can also be used as an initial check during data search operations in order to provide increased data protection.

26 Claims, 52 Drawing Sheets

(56) References Cited

U.S. PATENT DOCUMENTS

| | | | |
|---|---|---|---|
| 6,157,558 A | 12/2000 | Wong | |
| 6,166,938 A | 12/2000 | Wong | |
| 6,317,349 B1 | 11/2001 | Wong | |
| 6,970,988 B1 | 11/2005 | Chung | |
| 7,005,350 B2 * | 2/2006 | Walker et al. | 438/268 |
| 7,206,230 B2 | 4/2007 | Li et al. | |
| 7,237,058 B2 | 6/2007 | Srinivasan | |
| 7,292,476 B2 * | 11/2007 | Goda et al. | 365/185.17 |
| 7,400,532 B2 * | 7/2008 | Aritome | 365/185.17 |
| 7,403,421 B2 * | 7/2008 | Mokhlesi et al. | 365/185.19 |
| 7,412,561 B2 | 8/2008 | Argyres et al. | |
| 7,450,422 B2 * | 11/2008 | Roohparvar | 365/185.17 |
| 7,489,546 B2 * | 2/2009 | Roohparvar | 365/185.17 |
| 7,505,321 B2 * | 3/2009 | Scheuerlein et al. | 365/185.17 |
| 7,746,700 B2 * | 6/2010 | Roohparvar | 365/185.21 |
| 8,102,705 B2 | 1/2012 | Liu et al. | |
| 2001/0010057 A1 | 7/2001 | Yamada | |
| 2002/0171652 A1 | 11/2002 | Perego | |
| 2003/0007408 A1 | 1/2003 | Lien et al. | |
| 2003/0012063 A1 | 1/2003 | Chien | |
| 2003/0018868 A1 | 1/2003 | Chung | |
| 2003/0117851 A1 | 6/2003 | Lee et al. | |
| 2003/0163509 A1 | 8/2003 | McKean et al. | |
| 2004/0124466 A1 * | 7/2004 | Walker et al. | 257/344 |
| 2004/0125629 A1 * | 7/2004 | Scheuerlein et al. | 365/17 |
| 2004/0240484 A1 | 12/2004 | Argyres et al. | |
| 2005/0078514 A1 | 4/2005 | Scheuerlein et al. | |
| 2005/0141387 A1 | 6/2005 | Cernea et al. | |
| 2007/0047314 A1 * | 3/2007 | Goda et al. | 365/185.18 |
| 2007/0058407 A1 | 3/2007 | Dosaka et al. | |
| 2007/0140012 A1 * | 6/2007 | Roohparvar | 365/185.17 |
| 2007/0189073 A1 * | 8/2007 | Aritome | 365/185.18 |
| 2007/0236990 A1 * | 10/2007 | Aritome | 365/185.01 |
| 2007/0263462 A1 * | 11/2007 | Roohparvar | 365/198 |
| 2007/0291542 A1 * | 12/2007 | Aritome | 365/185.18 |
| 2008/0031044 A1 * | 2/2008 | Roohparvar | 365/185.05 |
| 2008/0062763 A1 | 3/2008 | Park et al. | |
| 2008/0158989 A1 | 7/2008 | Wan et al. | |
| 2008/0266957 A1 | 10/2008 | Moogat et al. | |
| 2009/0141566 A1 | 6/2009 | Arsovski | |
| 2009/0190404 A1 | 7/2009 | Roohparvar | |
| 2009/0254694 A1 | 10/2009 | Ehrman et al. | |
| 2009/0303767 A1 | 12/2009 | Akerib et al. | |
| 2010/0329007 A1 | 12/2010 | Chibvongodze | |
| 2011/0002169 A1 | 1/2011 | Li et al. | |
| 2011/0051485 A1 | 3/2011 | Chang et al. | |
| 2011/0096601 A1 | 4/2011 | Gavens et al. | |
| 2011/0096607 A1 | 4/2011 | Roohparvar | |
| 2011/0103153 A1 | 5/2011 | Katsumata et al. | |
| 2011/0134676 A1 | 6/2011 | Breitwisch et al. | |
| 2012/0005419 A1 | 1/2012 | Wu et al. | |
| 2012/0102298 A1 | 4/2012 | Sengupta et al. | |
| 2012/0250424 A1 | 10/2012 | Yoshihara et al. | |
| 2013/0028021 A1 | 1/2013 | Sharon et al. | |
| 2013/0042055 A1 | 2/2013 | Kinoshita et al. | |

OTHER PUBLICATIONS

U.S. Appl. No. 13/463,422, entitled Column Redundancy Circuitry for Non-Volatile Memory, filed May 3, 2012, 50 pages.

U.S. Appl. No. 13/420,961 entitled Techniques for Accessing Column Selecting Shift Register with Skipped Entries in Non-Volatile Memories, filed Mar. 15, 2012, 52 pages.

U.S. Appl. No. 61/713,038, entitled "Use of High Endurance Non-Volatile Memory for Read Accleration," filed Oct. 12, 2012, 93 pages.

U.S. Appl. No. 13/794,398, entitled De-Duplication Techniques Using NAND Flash Based Content Addressable Memory, filed Mar. 11, 2013, 80 pages.

U.S. Appl. No. 13/794,428 entitled "De-Duplication System Using NAND Flash Based Content Addressable Memory," filed Mar. 11, 2013, 80 pages.

U.S. Appl. No. 13/756,076 entitled "On-Device Data Analytics Using NAND Flash Based Intelligent Memory," filed Jan. 31, 2013, 67 pages.

Black, Jr., et al., "A High Performance Low Power CMOS Channel Filter," IEEE Journal of Solid-State Circuits, vol. SC-15, No. 6, Dec. 1980, pp. 929-938.

Lu et al., Bloomstore: Bloom Filter Based Memory-Efficient Key-Value Store for Indexing of Data Deduplication on Flash, Mass Storage Systems and Technologies, Apr. 16, 2012, IEEE 28$^{th}$ Symposium, pp. 1-11.

Wei et al., "DBA: A Dynamic Bloom Filter Array for Scalable Membership Representation of Variable Large Data Sets," Jul. 25-27, 2011, IEEE 19$^{th}$ Annual International Symposium of Modeling, Analysis and Simulation of Computer and Telecommunication Systems (Mascots 2011), pp. 466-468.

Communication Relating to the Results of the Partial International Search, Int'l Appl. No. PCT/US2013/068448 mailed Feb. 26, 2014, 1 page.

Notification of Transmittal of the International Search Report and the Written Opinion of the International Searching Authority, or the Declaration for Int'l Appl. No. PCT/US2013/068448 mailed May 16, 2014, 19 pages.

* cited by examiner

| | WL | BL | BLB | | BL | BLB | BL | BLB | |
|---|---|---|---|---|---|---|---|---|---|
| Sense 1 | Low | 1 | 0 | | 0 | 1 | 1 | 0 | |
| | Hi | 1 | 0 | | 0 | 1 | 0 | 1 | |
| | Hi | 1 | 0 | | 0 | 1 | 0 | 1 | |
| | Low | 1 | 0 | | 0 | 1 | 1 | 0 | |
| | Low | 1 | 0 | | 0 | 1 | 1 | 0 | |
| | Hi | 1 | 0 | | 0 | 1 | 0 | 1 | |
| | Low | 1 | 0 | | 0 | 1 | 1 | 0 | |
| | sense 1 | c | nc | | nc | c | c | nc | |
| Sense 2 | Hi | 1 | 0 | | 0 | 1 | 1 | 0 | |
| | Low | 1 | 0 | | 0 | 1 | 0 | 1 | |
| | Low | 1 | 0 | | 0 | 1 | 0 | 1 | Reverse WL Bias |
| | Hi | 1 | 0 | | 0 | 1 | 1 | 0 | |
| | Hi | 1 | 0 | | 0 | 1 | 1 | 0 | |
| | Low | 1 | 0 | | 0 | 1 | 0 | 1 | |
| | Hi | 1 | 0 | | 0 | 1 | 1 | 0 | |
| | Sense 2 | c | nc | | nc | c | nc | c | |
| | XOR1&2 | 1 | 1 | | 1 | 1 | 0 | 0 | |

Search for 00 pattern -- output column address --> data block

|      | D0 | D1 | D3 | D4 | D5 | D6 | D7 | D8 |                |
|------|----|----|----|----|----|----|----|----|----------------|
| Low  | 1  | 0  |    |    | 0  | 1  | 1  | 0  |                |
| Hi   | 1  | 0  |    |    | 0  | 1  | 0  | 1  |                |
| Hi   | 1  | 0  |    |    | 0  | 1  | 0  | 1  |                |
| Low  | 1  | 0  |    |    | 0  | 1  | 1  | 0  |                |
| Low  | 1  | 0  |    |    | 0  | 1  | 1  | 0  |                |
| Hi   | 1  | 0  |    |    | 0  | 1  | 0  | 1  |                |
| Low  | 1  | 0  |    |    | 0  | 1  | 1  | 0  |                |
| Hi   | 0  | 1  |    |    | 1  | 0  | 0  | 1  |                |
| Low  | 0  | 1  |    |    | 1  | 0  | 1  | 0  |                |
| Low  | 0  | 1  |    |    | 1  | 0  | 1  | 0  |                |
| Hi   | 0  | 1  |    |    | 1  | 0  | 0  | 1  | Reverse pattern|
| Hi   | 0  | 1  |    |    | 1  | 0  | 0  | 1  |                |
| Low  | 0  | 1  |    |    | 1  | 0  | 1  | 0  |                |
| Hi   | 0  | 1  |    |    | 1  | 0  | 0  | 1  |                |
| Sense| nc | nc |    |    | nc | nc | c  | nc |                |

| In range | XDL=0 UDL=0 |
|---|---|
| Match | XDL=1 UDL=1 |
| Out Bound | XDL=0 UDL=1 |

FIG. 19

Search for >010011001

| Data | Read MSB9 | Set 1 | Read MSB8 | Set 2 | Read MSB6 | Set 3 | Final Search |
|---|---|---|---|---|---|---|---|
| 100110111 | 1>0 | XDL=1 UDL=1 | ignore read | no update | no update | | 1 |
| 10100110 | 0=0 | XDL=0 UDL=0 | 1=1 | XDL=0 UDL=0 | 1>0 | XDL=1 UDL=1 | 1 |
| 1011010 | 0=0 | XDL=0 UDL=0 | 1>0 | XDL=0 UDL=1 | no update | | 0 |
| 11100 | 0=0 | XDL=0 UDL=0 | 1>0 | XDL=0 UDL=1 | no update | | 0 |

FIG. 20

Search 123<x<231

| | Read MSB1 | Set 1 | Read 2 | Set 2 | Read 3 | Set 3 | Final Search |
|---|---|---|---|---|---|---|---|
| 467 | 4>2 | XDL=0 UDL=1 | ignore read | no update | no update | | 0 |
| 246 | 2=2 | XDL=0 UDL=0 | 4>3 | XDL=0 UDL=1 | no update | | 0 |
| 132 | 1<2(upper) | XDL=0 UDL=0 | 1=1(lower) | XDL=0 UDL=1 | 3=3(upper) | XDL=1 UDL=1 | 1 |
| 34 | 0<2(upper) | XDL=0 UDL=0 | 0<1(lower) | XDL=0 UDL=1 | 3>2(upper) | no update | 0 |

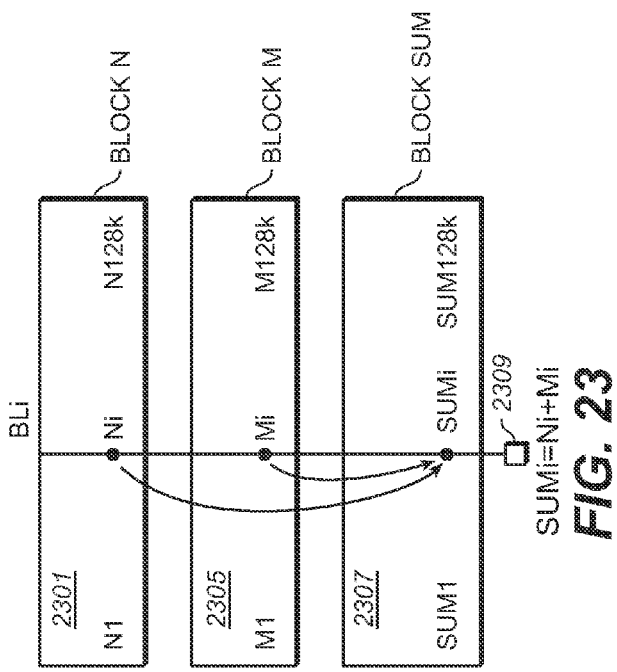

Example 10+3=13

| | 10 | + | 3 | = ? |
|---|---|---|---|---|
| | 1010b | | 0011b | |

| | T0 | T1 | T2 | T3 |
|---|---|---|---|---|
| Block A | 0 | 0 | | |
| | 1 | | 1 | |
| | 0 | | | 0 |
| | 1 | | | | 1 |

| | T0 | T1 | T2 | T3 |
|---|---|---|---|---|
| Block B | 1 | 1 | | |
| | 1 | | 1 | |
| | 0 | | | 0 |
| | 0 | | | | 0 |

XDL "Carry"   0   1   0   0

| | T0 | T1 | T2 | T3 | |
|---|---|---|---|---|---|
| Block C | | 1 | | | 1 |
| | | | 0 | | 0 |
| | | | | 1 | 1 |
| | | | | | 1 | 1 |

Example 10-3=7
```
  10         1  0  1  0
 3c+1        1  1  0  1
   7      [1] 0  1  1  1   discard the overflow bits
```

FIG. 25B

The multiplication can be done using bit shift and addition. 10x3
```
  10         1  0  1  0
   3    x          1  1
               1  0  1  0
            1  0  1  0
            1  1  1  1  0
```

FIG. 25C

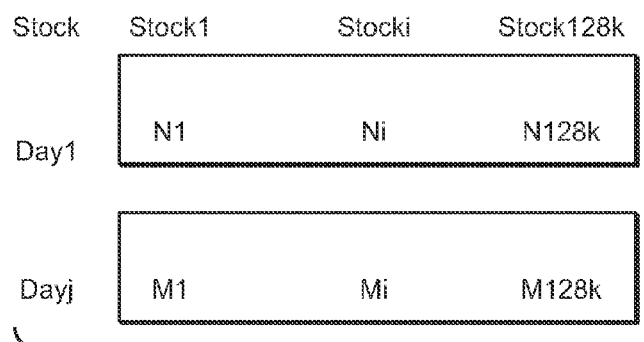
FIG. 26A  FIG. 26B
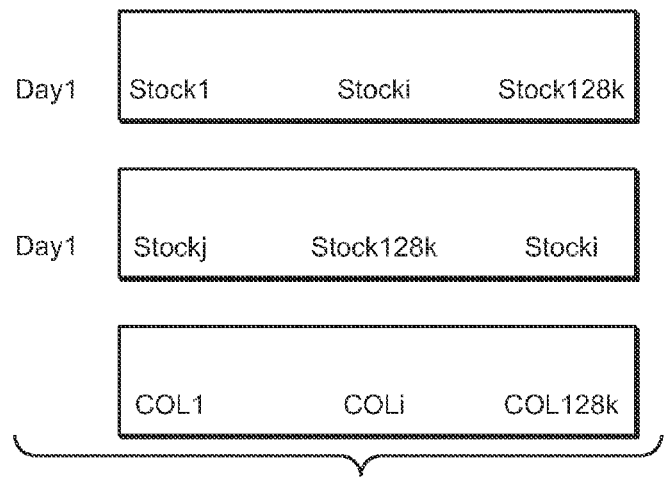
FIG. 27
FIG. 28

▶ SELECT
  • l_returnflag,
  • l_linestatus,
  • avg (l_quantity) as avg_qty,
  • avg (l_extendedprice) as avg_price,
  • avg (l_discount) as avg_disc,
  • count (*) as count_order
▶ FROM
  • lineitem
▶ WHERE
  • l_shipdate <= date '1995-12-01'
▶ GROUP BY
  • l_returnflag,
  • l_linestatus
▶ ORDER BY
  • l_returnflag,
  • l_linestatus;

FIG. 38A

Data Arrangement

| | item1 | item2 | item3 | item4 | item5 | item6 | item7 | digits |
|---|---|---|---|---|---|---|---|---|
| | quantity | quantity | quantity | quantity | quantity | quantity | quantity | 8 |
| | price | price | price | price | price | price | price | 32 |
| date1 | Discount | Discount | Discount | Discount | Discount | Discount | Discount | 8 |
| | quantity | quantity | quantity | quantity | quantity | quantity | quantity | |
| | price | price | price | price | price | price | price | |
| date2 | Discount | Discount | Discount | Discount | Discount | Discount | Discount | |
| | quantity | quantity | quantity | quantity | quantity | quantity | quantity | |
| | price | price | price | price | price | price | price | |
| date3 | Discount | Discount | Discount | Discount | Discount | Discount | Discount | |
| | quantity | quantity | quantity | quantity | quantity | quantity | quantity | |
| | price | price | price | price | price | price | price | |
| date4 | Discount | Discount | Discount | Discount | Discount | Discount | Discount | |

FIG. 38B

120 Days Sum of Quantity

In NAND:
| | | |
|---|---|---|
| plane/die | 4 | |
| die/package | 8 | |
| package/ch | 1 | |
| ch/blade | 8 | |
| item/quantity | 32768000 | |
| CAL time | 570.8034 | ms |

In Controller:
| | | |
|---|---|---|
| 200MHZ CPU | 5 | ns |
| total CPU | 19660.8 | ms |
| shift data | 81.92 | ms |
| flash HEMi | 2457.6 | ms |

0.057407G (addition)/s

*FIG. 38C*

120 Days Sum of Discount
price = price * (1-discount)

In NAND:
| | | |
|---|---|---|
| plane/die | 4 | |
| die/package | 8 | |
| package/ch | 1 | |
| ch/blade | 8 | |
| item/price | 32768000 | |
| CAL time | 25808.3444 | ms |

In Controller:
| | | |
|---|---|---|
| 200 MHZ CPU | 5 | ns |
| total CPU | 39321.6 | ms |
| shift data | 409.6 | ms |
| flash HEMi | 4915.2 | ms |

*FIG. 38D*

- The Minimum Cost Supplier Query finds, in a given region, for each part of a certain type and size, the supplier who can supply it at minimum cost.

SELECT
- s_acctbal,
- s_name,
- s_name,
- p_partkey,
- p_mfgr,
- s_address,
- s_phone,
- s_comment

FROM
- part,
- supplier,
- partsupp,
- nation,
- region

WHERE
- p_partkey = ps_partkey
- and s_suppkey = ps_suppkey
- and p_size = [SIZE]
- and p_type like '%[TYPE]'
- and s_nationkey = n_nationkey
- and n_regionkey = r_regionkey
- and r_name = '[REGION]'
- and ps_supplycost = (

SELECT
- min (ps_supplycost)

FROM
- partsupp, supplier,
- nation, region

WHERE
- p_partkey = ps_partkey
- and s_suppkey = ps_suppkey
- and s_nationkey = n_nationkey
- and n_regionkey = r_regionkey
- and r_name = '[REGION]'
 )

ORDER BY
- s_acctbal desc,
- n_name,
- s_name,
- p_partkey;

*FIG. 40A*

| digits | lineitem | lineitem | lineitem | lineitem | lineitem | | lineitem |
|---|---|---|---|---|---|---|---|
| 12 | suppkey1 | suppkey1 | suppkey1 | suppkey2 | suppkey2 | | suppkeyN |
| 12 | region | region | region | region | region | | region |
| 24 | partkey | partkey | partkey | partkey | partkey | | partkey |
| 12 | type | type | type | type | type | | type |
| 12 | size | size | size | size | size | | size |
| 18 | price | price | price | price | price | | price |

*FIG. 40B*

| Steps | | cycle | time | unit |
|---|---|---|---|---|
| 1 | search region | 1 | 50 | us |
| 2 | search part | 2 | 100 | us |
| 3 | search type | 1 | 50 | us |
| 4 | search size | 1 | 50 | us |
| 5 | search Min Price | 18 | 1080 | us |
| 6 | Merge Min from all die | | 500 | us? |
| 7 | read out the (100) pages | 100 | 5000 | us |
| 8 | sort acct balance in controller | | 500 | us? |
| | total time/search | | 7.33 | ms |

Controller Operations (rows 6–8)

*FIG. 40C*

| plane/die | 2 | |
|---|---|---|
| die/package | 8 | |
| package/ch | 1 | |
| ch/blade | 8 | |
| item/search | 16384000 | |
| search time | 7.33 | ms |

*FIG. 40D*

| Line Item | 1 | 2 | 3 | 4 | 5 | 6 | 7 | | | n |
|---|---|---|---|---|---|---|---|---|---|---|
| Supplier | 1 | 1 | 2 | 3 | 1 | 4 | 1 | | 2 | 2 |
| Region | region1 | region2 | region1 | region3 | region1 | region1 | region5 | region6 | region1 | region7 |
| Search | 1 | 0 | 1 | 0 | 1 | 1 | 0 | 0 | 1 | 0 |
| AND | 1 | 0 | 0 | 0 | 1 | 0 | 0 | 0 | 0 | 0 |
| | partNo5 | partNo1 | partNo3 | partNo3 | region1 | partNo1 | partNo5 | partNo6 | partNo1 | partNo7 |
| Search | 0 | 1 | 0 | 0 | 1 | 1 | 0 | 0 | 1 | 0 |
| AND | 0 | 0 | 0 | 0 | 1 | 0 | 0 | 0 | 0 | 0 |

FIG. 41A

| Steps | Function () |
|---|---|
| 1 | search (region) |
| 2 | search (part) |
| 3 | search (type) |
| 4 | search (size) |
| 5 | Min (Price) |

FIG. 41B

| Col | 0 | 1 | 2 | 3 | 4 | | 128k |
|---|---|---|---|---|---|---|---|
| Blocks | 0 | 0 | 0 | 0 | 0 | | 0 |
| | 0 | 0 | 0 | 0 | 0 | | 0 |
| | 0 | 0 | 0 | 0 | 0 | | 0 |
| | 0 | 0 | 1 | 0 | 0 | | 0 |
| | 0 | 0 | 0 | 0 | 0 | | 0 |
| | 0 | 0 | 0 | 0 | 0 | | 0 |
| | 0 | 0 | 0 | 0 | 0 | | 0 |
| | 0 | 0 | 0 | 0 | 0 | | 0 |
| SA | 0 | 0 | 1 | 0 | 0 | | 0 |

*FIG. 56*

| Block 0 | Block 0 | Block 0 | Block 0 |
|---|---|---|---|
| Block 1 | Block 1 | Block 1 | Block 1 |
| | | | |
| | | | |
| | | | |
| | | | |
| Block N | Block N | Block N | Block N |

*FIG. 57*

| Y | Y10 | Y2 | Y3 | Y2 | Y5 | | YN |
|---|---|---|---|---|---|---|---|
| | 1 | 0 | 0 | 1 | 1 | | 0 |
| X | X2 | X4 | X2 | X1 | X5 | | XM |
| | 0 | 0 | 0 | 1 | 0 | | 1 |
| | 1 | 0 | 0 | 1 | 1 | | 1 |

*FIG. 58*

Differential Data for Error Protection

| | | D0 | D1 | D3 | D4 | D5 | D6 | D7 | D8 | |
|---|---|---|---|---|---|---|---|---|---|---|
| BlockN | Low | 1 | 0 | | | 0 | 1 | 1 | 0 | |
| | Hi | 1 | 0 | | | 0 | 1 | 0 | 1 | |
| | Hi | 1 | 0 | | | 0 | 1 | 0 | 1 | |
| | Low | 1 | 0 | | | 0 | 1 | 1 | 0 | |
| | Low | 1 | 0 | | | 0 | 1 | 1 | 0 | |
| | Hi | 1 | 0 | | | 0 | 1 | 0 | 1 | |
| | Low | 1 | 0 | | | 0 | 1 | 1 | 0 | |
| SA | | 1 | 0 | | | 0 | 0 | 1 | 0 | |
| BlockM (Data Bar) | Hi | 0 | 1 | | | 1 | 0 | 0 | 1 | |
| | Low | 0 | 1 | | | 1 | 0 | 1 | 0 | |
| | Low | 0 | 1 | | | 1 | 0 | 1 | 0 | Reverse Pattern |
| | Hi | 0 | 1 | | | 1 | 0 | 0 | 1 | |
| | Hi | 0 | 1 | | | 1 | 0 | 0 | 1 | |
| | Low | 0 | 1 | | | 1 | 0 | 1 | 0 | |
| | Hi | 0 | 1 | | | 1 | 0 | 0 | 1 | |
| SA | | 0 | 1 | | | 1 | 0 | 1 | 0 | |

| Data | 1 | 1 | 0 | 0 |
|---|---|---|---|---|
| Data Bar | 1 | 0 | 1 | 0 |
| | Match | No | No | No |

| | | D0 | D1 | D3 | D4 | D5 | D6 | D7 | D8 |
|---|---|---|---|---|---|---|---|---|---|
| BlockN | Low | 1 | 0 | | | 0 | 1 | 1 | 0 |
| | Hi | 1 | 0 | | | 0 | 1 | 0 | 1 |
| | Hi | 1 | 0 | | | 0 | 1 | 0 | 1 |
| | Low | 1 | 0 | | | 0 | 1 | 1 | 0 |
| | Low | 1 | 0 | | | 0 | 1 | 1 | 0 |
| | Hi | 1 | 0 | | | 0 | 1 | 0 | 1 |
| | Low | 1 | 0 | | | 0 | 1 | 1 | 0 |
| SA | | 1 | 0 | | | 0 | 0 | 1 | 0 |
| BlockM | Low | 1 | 0 | | | 0 | 1 | 1 | 0 |
| | Hi | 1 | 0 | | | 0 | 1 | 0 | 1 |
| | Hi | 1 | 0 | | | 0 | 1 | 0 | 1 |
| | Low | 1 | 0 | | | 0 | 1 | 1 | 0 |
| | Low | 1 | 0 | | | 0 | 1 | 1 | 0 |
| | Hi | 1 | 0 | | | 0 | 1 | 0 | 1 |
| | Low | 1 | 0 | | | 0 | 1 | 1 | 0 |
| SA | | 1 | 0 | | | 0 | 0 | 1 | 0 |

Margin Low

The Single Word Line Bias

X  Hi
[0] Low Normal
X  Hi

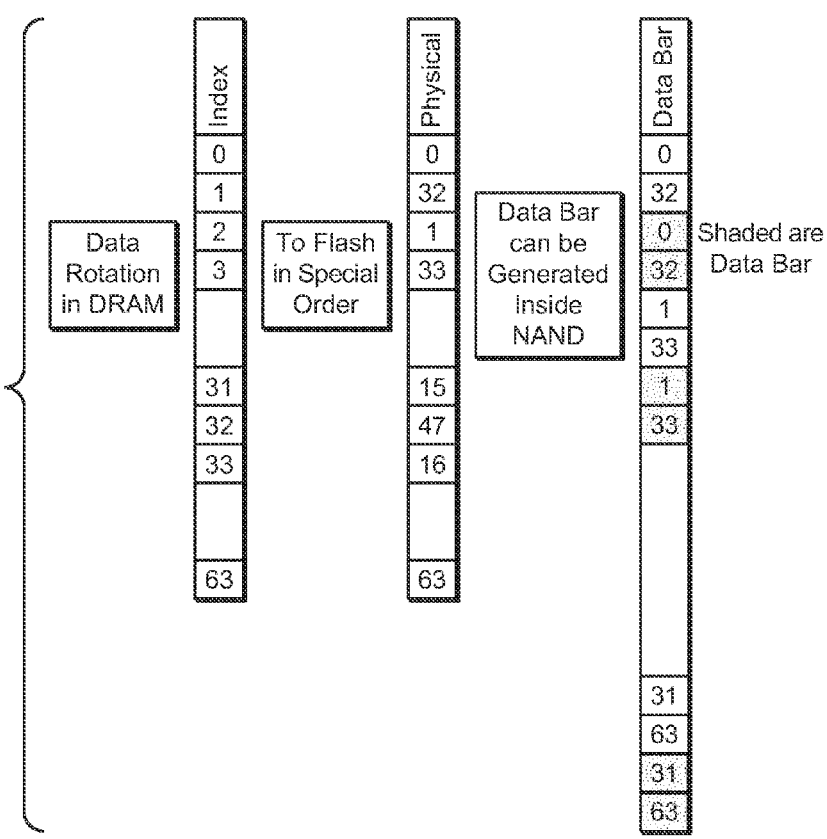

| 1 | Low | |
|---|---|---|
| 0 | Hi | Shift UP |
| 0 | Hi | Normal |
| 0 | Hi | Shift UP |
| 1 | Low | Normal |
| 0 | Hi | Shift UPUP |
| 1 | Low | |

| Sense | 1/0 | 0 | 0 | 0 |
|---|---|---|---|---|
| | 1 | 0 | 0 | 0 |
| OR | C | NC | NC | NC |

| | Data Pattern | Read Margin | Correct |
|---|---|---|---|
| 1WL Sensing in 2 Block | Same Data | Margin Low | "0" Correct |
| 2WL Sensing in 1 Block | Same Data | Margin High | "1" Correct |
| Multiple WL Sensing in 2 Block | Data/Data | Margin High | "1" Correct |
| Multiple WL Sensing in 1 Block | Data/Data | Margin High | "1" Correct |

CAM NAND WITH OR FUNCTION AND FULL CHIP SEARCH CAPABILITY

CROSS-REFERENCE TO RELATE APPLICATION

This application is related to a pair of US patent applications entitled "CAM NAND with OR Function and Full Chip Search Capability" and "Use of Bloom Filter and Improved Program Algorithm for Increased Data Protection in CAM NAND Memory", both by Yan Li and Steven Sprouse filed concurrently with the present application, and is a Continuation-In-Part of U.S. patent application Ser. No. 13/827,407, filed on Mar. 14, 2013, that is a Continuation-In-Part of U.S. patent application Ser. No. 13/756,076, filed on Jan. 31, 2013, which is itself a Continuation-In-Part of U.S. patent application Ser. No. 13/749,361, filed on Jan. 24, 2013, which in turn claims priority from U.S. Provisional Applications Nos. 61/724,401, filed on Nov. 9, 2012, and 61/730,884 filed on Nov. 28, 2012, which are all hereby incorporated in their entirety by this reference.

FIELD OF THE INVENTION

This invention relates generally to non-volatile memories and, more specifically, to using non-volatile memory of a NAND-type architecture in operations related to content addressable memory (CAM).

BACKGROUND OF THE INVENTION

Content addressable memories, also known as associative memories, are different from standard memories in the way that data is addressed and retrieved. In a conventional memory, an address is supplied and the data located at this specified address is retrieved. In contrast, in a content addressable memory (CAM), data is written as a key-data pair. To retrieve the data, a search key is supplied and all the keys in the memory are searched for a match. If a match is found, the corresponding data is retrieved.

Content Addressable Memories, or CAMs, can be implemented in several ways. In one sort of embodiment, a CAM is implemented using a conventional memory and an associated CPU which searches through the memory to find a matching key. The keys in the memory may be sorted, in which case a binary search can be used; or they can be unsorted, in which case they are usually hashed into buckets and each bucket is searched linearly. A CAM can also be implemented as a semiconductor memory, where every memory location contains an n-bit comparator. When an n-bit key is provided, each entry in the CAM will compare the search key with the entry's key, and signal a match if the two are equal.

SUMMARY OF INVENTION

In a first set of aspects a memory circuit has an array of non-volatile memory cells arranged along a plurality of word lines and a plurality of M bit lines into a NAND type of architecture, the array formed of multiple blocks, each of the blocks including a plurality of M NAND strings connected along a corresponding one of the M bit lines and each having a plurality of N memory cells connected in series with a plurality of N word lines spanning the M NAND strings, each of the N word lines connected to a corresponding one of the N memory cells of the NAND strings of the block. The circuit also includes word line driving circuitry connectable to the word lines, whereby one or more word lines in a plurality of blocks can be concurrently and individually be set to one of a plurality of data dependent read values corresponding to a respective data pattern for each of the plurality of blocks. Sensing circuitry is connectable to the M bit lines individually determine those of the M bit lines where at least one of the NAND strings connected there along are conducting in response the word line driving circuitry applying said respective data patterns to the corresponding plurality of blocks.

Additional aspects relate to a method of operating a memory system, where the memory system includes a memory circuit an array of non-volatile memory cells arranged into a plurality of blocks, each of the blocks including a first plurality NAND strings and a plurality word lines spanning the NAND strings, each of the word lines connected to a corresponding one of the memory cells thereof, where a first plurality of bit lines span the blocks with each of the blocks having one of the NAND strings thereof connected along a corresponding one of the bit lines. The method includes receiving for each of a first plurality of the blocks a corresponding first search data pattern from a host device to which the memory system is connected. One or more word lines of the first plurality of blocks are concurrently biased according to the corresponding first search data patterns. The method concurrently determines those of the bit lines that conduct in response to the one or more word lines of the first plurality of blocks being concurrently biased according to the first corresponding first data search patterns.

Further aspects also present a method of operating a memory system, the memory system including an array of non-volatile memory cells arranged into a NAND type of architecture, including a plurality NAND strings and a plurality word lines spanning the NAND strings, each of the word lines connected to a corresponding one of the memory cells of the NAND strings. The method includes receiving a search data pattern; splitting the search data pattern into a plurality of sub-patterns including at least first and second sub-patterns respectively corresponding to first and second sets of non-adjacent ones of the word lines; and performing first and second determinations. The performing of a first determination includes: biasing the corresponding first set of the word lines according to the first sub-pattern; and concurrently determining those of the NAND strings that conduct in response to the corresponding first set of the word lines biased according to the first sub-pattern being applied thereto. The performing of a performing a second determination includes: biasing the corresponding second set of the word lines according to the second sub-pattern; and concurrently determining those of the NAND strings that conduct in response to the corresponding second set of the word lines biased according to the second sub-pattern being applied thereto. The method subsequently combines the results of the first and second determinations to determine those of the NAND strings that conduct in response to the word lines biased according to the first and second sub-patterns being applied thereto.

Aspects of a particular set of embodiments concern a method of operating a memory system, the memory system including a memory circuit having an array of non-volatile memory cells arranged into a plurality of blocks, each of the blocks including a first plurality NAND strings and a plurality word lines spanning the NAND strings, each of the word lines connected to a corresponding one of the memory cells thereof, where a first plurality of bit lines span the blocks with each of the blocks having one of the NAND strings thereof connected along a corresponding one of the bit lines. The method include storing a plurality of data patterns each along a bit line of the memory array, where each of the data patterns are stored in inverted and non-inverted forms along the same bit line, the bits of the non-inverted form of the data patterns being stored along a first set of word lines and the bits of the inverted form of the data patterns being stored along a second set of word lines. The memory system receives a search pattern and performs a determination of whether any of the stored data patterns match the search pattern. The determination includes applying the search pattern to the first set of word lines and applying the search pattern in inverted form to the second set of word lines, wherein the search pattern and inverted form of the search pattern are applied in a plurality of sensing operations in which a plurality of non-adjacent word lines for one or more blocks are concurrently biased to a data dependent voltage level based upon the search pattern.

Aspects of another set of embodiments concern a method of operating a memory system, the memory system including a memory circuit having an array of non-volatile memory cells arranged into a plurality of blocks, each of the blocks including a first plurality NAND strings and a plurality word lines spanning the NAND strings, each of the word lines connected to a corresponding one of the memory cells thereof, where a first plurality of bit lines span the blocks with each of the blocks having one of the NAND strings thereof connected along a corresponding one of the bit lines. The method includes storing a plurality of data patterns each along a bit line of the memory array, where each of the data patterns a first copy and a second copy are stored along the same bit line, the bits of the first copy being stored along a first set of word lines and the bits of the second copy being stored along a second set of word lines. The memory system receives a data search query and performs a search operation on the stored data patterns based upon the data search query. The search operation includes concurrently biasing first and second word lines respectively from the first and second sets of word lines to a voltage level based upon the data search query, where the first and second word lines correspond to the same bit of the data patterns respectively from the first and second copies thereof.

According to still further aspects, a method is presented of operating a memory system including a memory circuit having an array of non-volatile formed according to a NAND type of architecture where each of a first plurality of data patterns is stored along one of a corresponding first plurality of NAND strings of the memory array. A first bloom filter corresponding to first plurality of data patterns can also be stored on the memory circuit. An ECC protected copy of each of the first plurality of data patterns is also stored on the memory circuit. A search operation is then performed, where the search operation includes: receiving a search pattern; performing a comparison of the search pattern against the first bloom filter; in response to a positive result from the comparison of the search pattern against the first bloom filter, performing a determination of which of the first plurality of NAND strings conduct in response to the memory cells thereof being biased according to the search pattern; and in response to a negative result from the determination, searching the copies of the first plurality of data patterns for a match with the search pattern.

Other aspects concern a method of operating a memory circuit including an array of non-volatile memory cells having a NAND type of architecture and include receiving one or more indices and writing the one or more indices along a corresponding one or more NAND strings of a first block of the memory array. Subsequently, a plurality of word lines of the array are individually read back to determine the value of the corresponding bit stored there along for each of the indices. For each of the word lines read back, a comparison is performed of the value of the corresponding bit stored there along with the value of the corresponding bit as received for each of the indices and, based upon the comparisons, the method determines whether any of the bits as read back contain error. The error determined based upon the comparisons for the plurality of word lines is individually accumulated for each NAND string to determine whether the bits of the index stored along the corresponding NAND string contain one or more errors.

Various aspects, advantages, features and embodiments of the present invention are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

BRIEF DESCRIPTION OF THE DRAWINGS

FIGS. 6A-C shows another embodiment for how keys can be written along bit lines of an NAND array and searched.

FIG. 18 is an example of data latch assignments for the process illustrated by FIG. 17.

FIGS. 19 and 20 illustrate some steps of two search processes.

FIGS. 21 and 22 illustrate a maximum and a minimum search operation.

FIGS. 23 and 24 respectively give a schematic representation of an on-chip arithmetical operation and a corresponding latch utilization.

FIGS. 25A-C illustrate some detail of how arithmetic operations can be performed.

FIGS. 26A and 26B show how more latches can be used to perform arithmetic operations involving more n FIGS. 27 and 28 illustrate an application to financial data analysis.

FIGS. 38A-D illustrate various aspects related performing to a "price summary report" query.

FIGS. 40A-D illustrate various aspects related performing to a "minimum cost supplier" query.

FIGS. 41A and 41B is a schematic representation of the division of tasks between the controller and NAND memory for the query of FIGS. 40A-D.

FIG. 56 illustrates an example of doing a full chip search simultaneously applying the same search key to all blocks.

FIG. 57 schematically illustrates a binary search to determine the block to which conducting NAND string.

FIG. 58 illustrates an example of using the inherent OR functionality between different searches.

FIG. 67 looks at the word line to word line effect of simultaneously multiple word lines.

FIG. 68 looks at avoiding of the distribution shift up due to adjacent word line voltage bias.

FIG. 69 illustrates some of the steps of data manipulations for 64 bits index that is to be stored as data/data bar.

DESCRIPTION OF THE PREFERRED EMBODIMENTS

Figure 1:
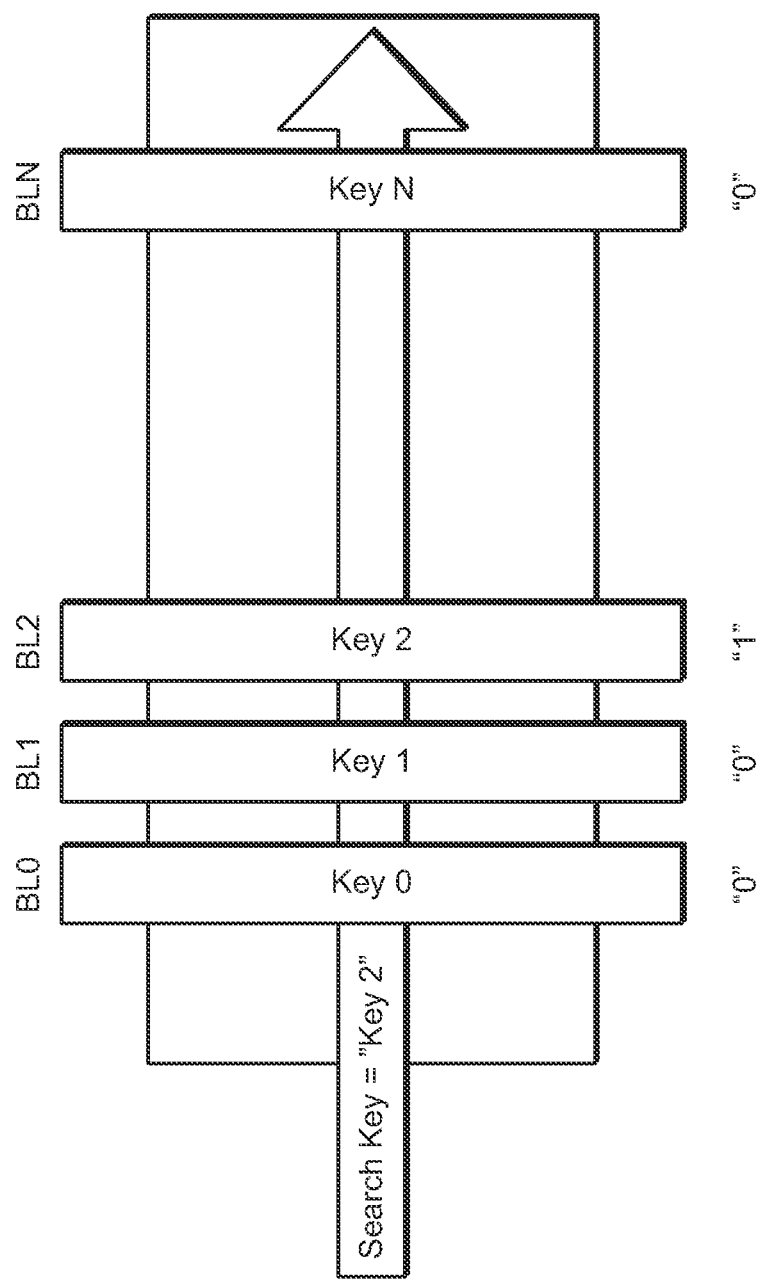
FIG. 1 is a schematic representation of a NAND array used as a CAM memory.

Content Addressable Memory Based on NAND Flash Memory

The following presents a method of using a Flash based NAND memory array as a content addressable memory (CAM) that can be realized in both binary and ternary embodiments. As described in more detail below, keys can be programmed along the bit lines of a block. The search key is then input along the word lines of the blocks, so that a bit line on which a corresponding key has been programmed will be conducting. This allows for all the keys of a block to be checked at the same time.

The typical way by which a NAND memory array is read is that data is read out a single word line (or portion of a word line) at a time, with the non-selected word lines along the NAND strings being biased so that they are fully turned on regardless of the data state, removing the non-selected memory from affecting the read operation. In this way, the data content of the memory is read out a page (the unit of read) at a time. In contrast, to use a NAND flash memory as a content addressable memory, all of the word lines are set to a specific data dependent value, where the data is the key, and the memory determines which bit lines then conduct, thereby determining particular bit lines correspond to the input key, rather that the data of individual cells. An operation where sensing voltages are applied to multiple word lines in the context of an enhanced post-write read operation is given in U.S. patent application Ser. No. 13/332,780 filed on Dec. 21, 2011, (and which also presents more detail on NAND flash memory in general); however, even in that case only a few of the word lines receive a sensing voltage. Also, in prior art NAND memories, data was aligned along word lines, where data pages (for both read and write) are aligned along the word lines. Here, data is aligned along bit lines and many, or even all, of the word lines along the bit lines can receive either a high voltage sufficient to turn on a cell in a programmed state, or a low voltage sufficient to turn on a cell in the erased state. The following discussion will use the EEPROM based flash memory as the exemplary embodiment, but other memory devices having a NAND type of architecture, including 3D NAND (such as described in T. Maeda et al., "Multi-stacked 1G cell/layer Pipe-shaped BiCS flash memory", 2009 Symposium on VLSI Circuits, pages 22-23) for example, can also be used.

In a binary, EEPROM based flash memory, in a write operation each cell is either left in an erased state or charge is placed on the cell's floating gate to put the cell in a programmed state, which here are respectively taken as the 1 and 0 states. When a low value for the read voltage is applied to its control gate, only a cell in the erased, or 1, state will conduct. For cells in the programmed, or 0, state, a high value of the read voltage needs to be applied to the control gate for a cell to conduct. The keys will be arranged along bit lines of a block of the memory array. Since a cell in the 1 state will conduct for either read voltage, each key needs to be written twice, in inverted and non-inverted form. As discussed below, this can be done by writing the target key along one bit line and its inverse along another, or writing half the bit line with the (non-inverted) target key and the other half of the bit line with the inverted target key. More key info can be compressed into the NAND chain using multiple bits programming. For example, in a 2-3 bits per cell case, the key can be sorted in the controller RAM and the bits will be programmed as lower, (middle) or upper pages. The following discussion will mostly be given in terms of a binary embodiment, with some specifics of the multi-state case are discussed later.

The general concept can be illustrated by FIG. 1. Target keys Key 0, Key 1, . . . are programmed down bit lines BL0, BL1, . . . of a NAND block. Data is programmed in a separate location that can be indexed by the target key's column address number. To search the block for a key, the search key is broadcasted on the block's word lines by setting all of the word lines according to either the high or low read voltage according to the search key. (In addition to setting the word line voltages according to the key, the select gates at the end of the NAND string will also need to be turned on.) Each BL effectively compares itself to the WL key pattern for all of the bit lines in the block at the same time. If the bit line key matches the search key, the whole of the bit line will be conducting and a "1" will be read out. (Note that, as discussed further, this discussion is somewhat simplified for the reasons discussed in the last paragraph.) Once the column index of the key is found, it can be used to fetch the corresponding data from a "data" block. The key can be the hash code of the data page that will lead to the right data page by the column address of the matched NAND chain. For content matching applications, such as data compression or de-duplication, each 16 KB, say, of content can generate a corresponding hash code that can be stored along the NAND chain. If the key along the NAND chain is matched, then the data page will be compared with the comparing data along the word line to avoid hash collision cases. In other cases, the content along the word line may not be a hash value, but characteristics of the data elements that can be searched as a keys to data; or the bits lines themselves main be the elements of the data themselves, rather than a pointer to a data base.

Under the arrangement illustrated by FIG. 1, all of the bit lines of the array, and consequently all of the keys, are searched at the same time. In arrays that do not use an all bit line type of architecture, the number of keys searched simultaneously would be the number of bit line sensed in parallel, such as half of the total in an odd-even arrangement. The size of the key is the number of word lines. In practice, these maximum values of the keys will typically be somewhat less, since some column are usually set aside for defects, for instance.

As noted above, since a memory cell in either the 0 or 1 state will conduct for a high read voltage, the key will need to be entered twice, both non-inverted and inverted. This can be done by either programming the target key on two bit lines, reducing the number of keys by half, or programming both versions of the key on the same bit line, reducing the key size by half. However, given the size of available NAND blocks, even with these reductions the number of keys that can be checked in parallel is quite large. Relative to some other memory technologies, NAND flash memory has relatively large latencies in its operation, but in many applications this would more than be offset by the number of keys (bit lines) that can be checked in parallel (128K, for example). The process can all be done on-chip and, as only the bit lines that meet the matching case conducting current, with relatively low power consumption, so that compared to toggling out all of the data from the memory and doing the compare in the controller, it is a process of relatively low power and higher speed.

Looking at some implementation detail, an exemplary embodiment can be based on a flash memory where the indices are saved on the 128 Gb NAND chains. An all bit line (ABL) architecture is used where one sensing operations will perform a match operation on all of the indices on a block at the same time. Extra column redundancy is included to avoid any bad columns (more detail on such redundancy and the accessing of columns, as well as flash memory in general, can be found in the following US patent publication/application numbers: US-2005-0141387-A1; US-2008-0266957-A1; US-2011-0002169-A1; US-2010-0329007-A1; 13/463,422; and 13/420,961.) Two copies of the same data, Data and Data Bar, are written into the NAND chain. In the example, this allows for 16 KB/2/2=32000 sets of information with a 128 bit key.

When writing in the keys, these will be typically written on a page by page basis, although in memories that allow it, partial page programming can be used to write part of the keys, with more added later. Such partial page programming is typically more limited for multi-states implementations than in binary blocks. As one example, the data can be shifted on to the memory and the inverted data can be generated on the memory to save effort on the controller for these data manipulations, where the data and data bar can be written without shifting in the data twice, with the data being written first, and the generated inverse next. Both the keys and the data can be input into the memory system, or in some cases the keys could be generated on the memory system by the controller from the data, such as by generating hash values from the data to use as keys. If the keys are to be sorted before being written along the bit lines, this will typically be done on the controller due to the amount of data involved, such as multiple blocks' worth of data. For example, the data could initially be written in a particular area, say die 0, plane 0, blocks 0-15, and then sorted and written into the blocks having been sorted to the block level. Alternately, the keys could be assembled in RAM (either on the controller or on a separate chip) or cache NAND memory (such as described in U.S. provisional application No. 61/713,038) before sorting them to the desired level of granularity and writing them into a set of blocks.

As discussed further below, the data/data bar pairs can be written on two bits lines or on a single bit line. When the data/data bar pairs are written on two bit lines, such as discussed with respect to FIG. 4, the pairs can be written next to each other or in other patterns, such as writing the data bit lines in one area and the inverted data bit lines in another zone. When both parts of the pair on written on the same bit line, as discussed below with respect to FIG. 6A, they can be written in a top/bottom format or interleaved. For example, when the data and inverted data are interleaved to alternates down the word lines, this has the advantage that at most two elements in a row are the same down the bit line; further, interleaving can lead to efficient data transfer on to the memory as first a page of data is transferred on the memory and the next page can just be generated in the latches by inverting all the bits, as the next page is the inverted data of the first page.

The matched index can then be linked to other data corresponding to the determined column address; for instance, the keys could be a hash value, such as from a Secure Hash Algorithm (SHA), used to point to the actual data that can also be stored elsewhere on the memory itself. All the matching can be done inside of the NAND chip and, when the match is found, the column address can also be transferred out if needed or just the data, if also stored on the NAND chip, can be transferred out.

To efficiently implement the use of a NAND array as a CAM memory, changes can be made to the word line driving circuitry. To broadcast a search key down the word lines of a block, in addition to turning on the select gates on either end of the NAND strings, each word line of the block needs to be set to either the high or low read voltage according to the search key. This is in contrast to typical NAND operation, where only a single word line at a time is selected for a read voltage, with all of the other word lines receiving a pass voltage sufficient to remove them from influencing the sensing regardless of their data state.

Figure 2:
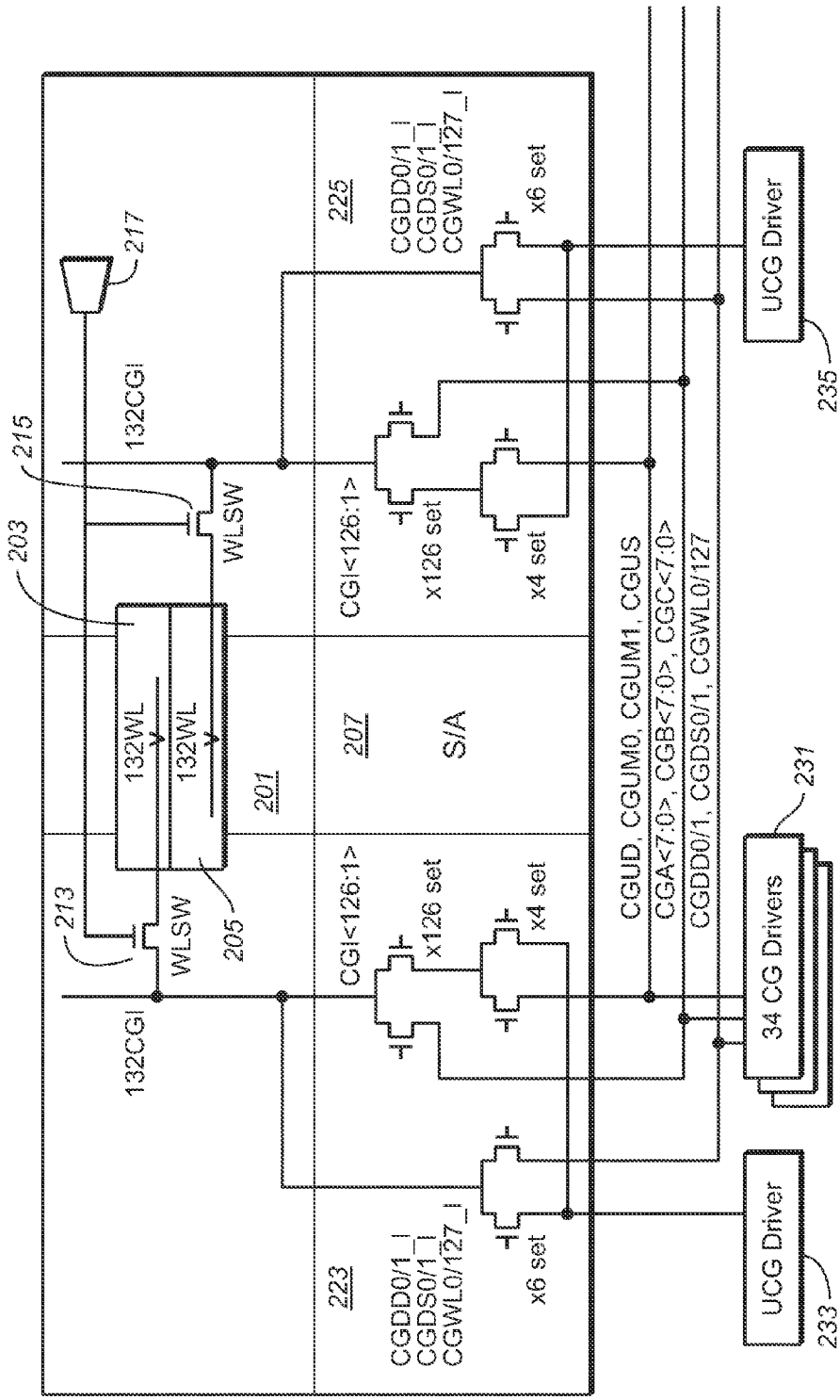
FIG. 2 is a schematic illustration of the network of some of the elements to supply the word line in a NAND array for conventional operation.

FIG. 2 is a schematic illustration of the network of some of the elements to supply the word line in a NAND array for conventional operation. At 201 is the cell array for a plane of a NAND chip, with two blocks explicitly marked out at 203 and 205. Each block's word lines are feed by a word line select gate WLSW 213 or 215 as controlled from select circuitry at 217. The bit lines are not indicated, but would run down to the sense amp block S/A 207. The various control gate voltage CGI are then supplied to the select gates 213 and 215 from the drivers CG drivers 231 and UCG drivers 233 and 235 by way of switches 223 and 225, respectively. In the exemplary embodiment shown here, a block is taken to have 132 word lines, where a pair of dummy word lines are included on both the drain and source sides of the NAND strings. The UCG Drivers 233 and 235 are for supplying the pass voltages used on unselected word lines during program, (standard, non-CAM) read or verify operations. As this level is used on the large majority of word lines, these can be lumped together for a single driver. The selected control gates are biased to VPGM at program, CGR voltage at read or verify. In FIG. 2, CGI<126:1> is the decoded global CG lines. CGI<0> and CGI<127>, that are here biased differently from other 126 word lines due to edge word line effects. The dummy word line bias CGD0/1 is for the drain side dummy word lines and CGDS0/1 is for the source side ones.

Figure 3:
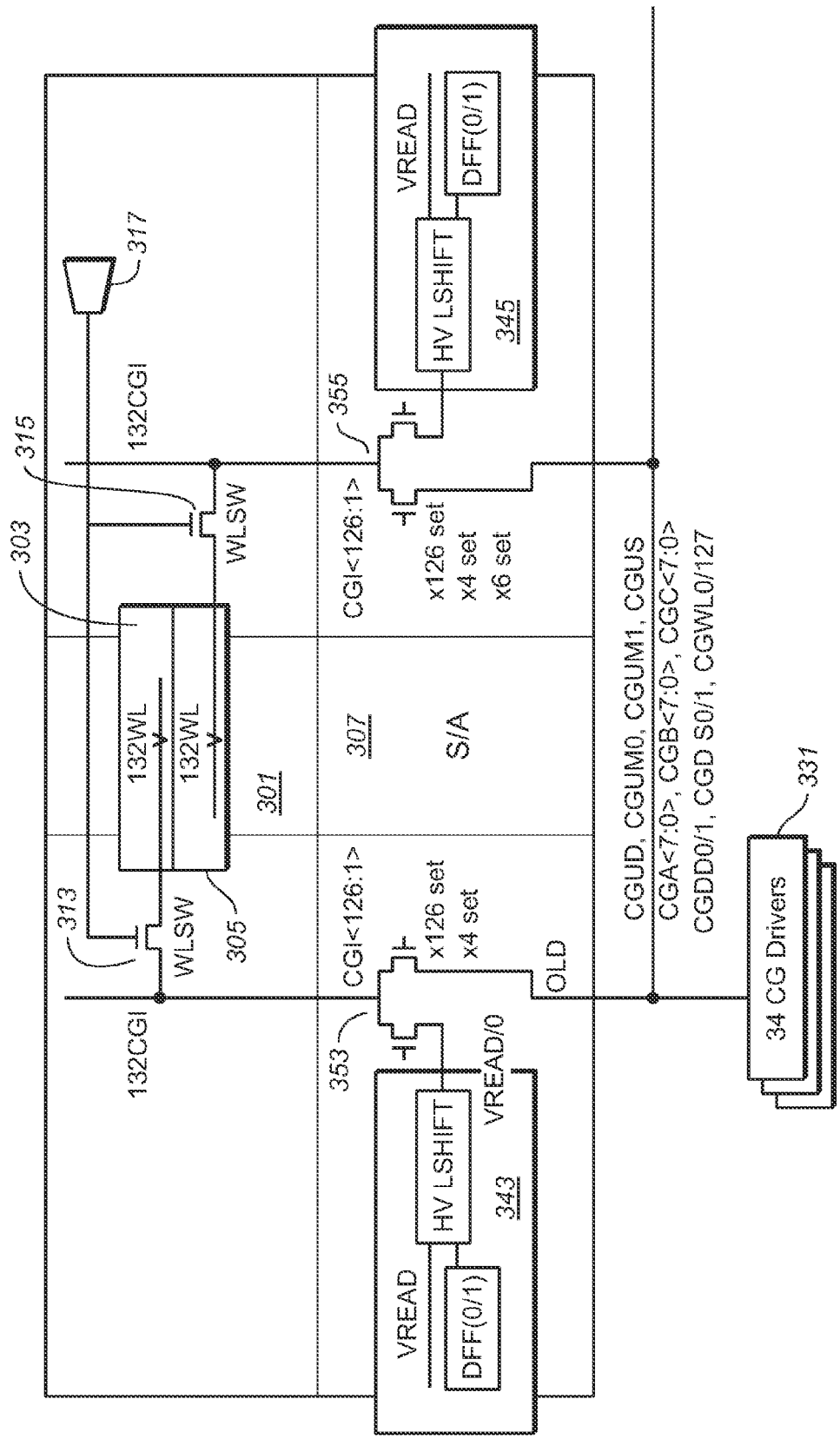
FIG. 3 is a schematic illustration of the network of some of the elements to supply the word line in a NAND array for CAM operation.

For a typical NAND memory operation, only a few word lines at a time are individually biased. In addition to a selected word line, adjacent or edge word lines may receive special bias levels to improve operations. Consequently, existing word line drivers are arranged so that they can only take care of a handful of word lines. With logic changes, it may be possible to drive up to perhaps two dozen or so word lines. However, to drive all the word lines of a block (here 128, ignoring dummies) will require additional analog drivers. FIG. 3 illustrates some of these changes.

The array 301, blocks 303 and 305, select circuitry 317, CG Drivers 331, and switches 313 and 315 can be the same as in FIG. 2. The additional word line drivers are shown at 343 and 345 and can supply the word lines through respective switches at 353 and 355. In each of 343 and 345, the level shifter HVLSHIFT receives the voltage VREAD and a digital value DFF(0/1) for each word line. The level shifter then converts the digital values of 0, 1 for the broadcast key to the analog high and low word line levels. As the memory cells will still need to be written (both programmed and program verified), the other circuit sketched out in FIG. 2 will still be present, though not shown in FIG. 3 to simplify the discussion. It may also be preferable to make some changes to the sensing circuitry S/A 307 to more efficiently perform the XOR operation described below between the pairs of bit lines holding a key and its inverse.

Figures 4, 5:
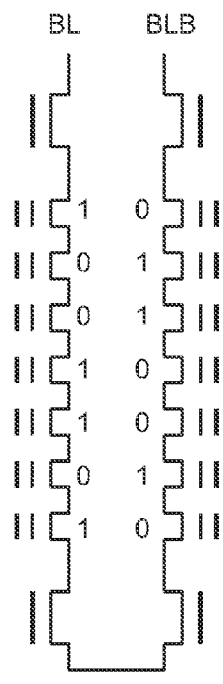
FIG. 4 shows one embodiment for how keys can be written along bit lines of an NAND array and searched.
FIG. 5 given some detail on how a key/inverse pair from FIG. 4 is programmed into a pair of NAND strings.

FIG. 4 shows the encoding of the keys along bit lines, where the key is entered twice, in non-inverted and inverted form. Here the bit lines are labeled BL for the non-inverted key and BLB for the inverted version. Here the pairs are shown as being adjacent, although this need not be the case, but will typically make XOR-ing and keeping track of data easier. Also, this arrangement readily lends itself to NAND arrays using an odd/even BL arrangement. As shown in the half of FIG. 4, for reference a key of all 1s is written along BL1 and a key of all 0s is written along BLn, with the corresponding inverted keys at BLB1 and BLBn. For the defective bit lines, the bit line either stuck "0" or stuck "1" regardless of the word line voltage bias. The XOR results between the two read results will always yield "1". The BL and BLB data pattern will eliminate the defected bit lines from yielding match results mistakenly. In this example, only seven word lines are used. A more interesting key of (1001101) is entered on BLn+1, with its inverted version at BLBn+1, as also illustrated in FIG. 5.

FIG. 5 shows the two corresponding NAND strings, where 0 is a programmed cell, 1 a cell left in its erased state, the cells being connected in series down the NAND strings to the common source line CELSRC. To search for this key, it is encoded as low read voltage for the 0 entries and high read voltage for the 1s. The search key is shown at the left of the top of FIG. 5. When put onto the word lines, this correspondingly finds that BLn+1 is conducting (and BLBn+1 is non-conducting), as shown by the "c" (and "nc") in the sense 1 row. However, BL1 and BLBn are also both conducting, as a cell in the 1 state will conduct for either read value.

The second sensing (these can be performed in either order) is then made with the search reversed. Although BL1 and BLBn are still conducting, the result from the key actually sought has changed: BLn+1 is now non-conducting and BLBn+1 conducts. By taking the result of the two reads and XOR-ing them, the sought key will give a 0 on the corresponding bit line and also on its inverted version. Consequently, by searching for the 00 pattern in the XOR data, the output column address can be found and the corresponding data block accessed. Under the sort of embodiment used in FIG. 4, two reads are needed for the pattern match and internal pattern detection on the NAND device can judge if there is a match. The redundancy of the BL/BLB pairs provides redundancy to help protect from bad bit lines, but a second pair can also be kept for further protection. A copy of the key can also be kept with any associated data and used to check the match, where this copy can be ECC protected. Additional protection can also be provided by each bit line including several (8, for example) parity bits, for error detection and correction purposes, where the redundancy bit are preferable along the same bit lines for all of the keys so that these parity bits can either be read or taken out to the comparisons by use of a "don't care" value applied to these word lines, as described below. For example, the data can be read when checking when checking the data, as either part of a post-write read or other data integrity check, but ignored during CAM-type operations.

Generally, for both this and other embodiments described here, a post-write read can be used to insure that the keys have been successfully written into the NAND memory, as any error bits could prevent a NAND string from conducting and would give rise to "false negatives" when matching. If an error is found, the bad data can be rewritten. In the exemplary NAND flash example, the incorrectly written data can rewritten to another data block and any key-data correspondences updated accordingly. More detail on post-write read operations can be found in U.S. patent application Ser. No. 13/332, 780 and references cited therein.

In terms of performance, in the case of a 16 KB page of 128 bit keys, if two copies of the both the data and its inverse are stored, the corresponds to 4 KB of keys, or 32000 keys. (As all of the word lines are sensed at once, so that here, a "page" involves a sensing of all the word lines of a block rather than a single word line.) If this page of 32000 keys is sensed in 50 us, this is a rate of 0.64 GC (Giga-compares) per second per plane. If four planes are sensed in parallel, this can lead to 2.56GC/s at a consumption of about 200 mW.

FIG. 6A illustrates a second embodiment for how the key can be stored along a bit line. In this case, both the key and its inverse are written onto the same bit line. For a given block, this means that the maximum key size is only half the number of word lines, but this allows for the search key and inverted key to be broadcast at the same time. Consequently, the search can be done in a single read.

Referring to FIG. 6A, this shows 14 different word lines with the keys entered in the top half and the inverted versions of these same keys entered in inverted form in the bottom half of the same bit line. Thus, taking the bit line at D7, rows 1-7 hold a 7 bit key, and rows 8-14 the inverted version of the same key. (Although arranged similarly to FIG. 4, in FIG. 6A the top and bottom halves represent 14 different word lines where the top-bottom division is the key/inverted key boundary, whereas in FIG. 4, the top and bottom are the same seven word lines repeated twice for two different sensing operations.) For comparison purposes, the keys shown in FIG. 6A are the same as in FIG. 4, with the bit line of D7 holding the sought for key in the top half and its inverse in the bottom half, and D8 holding the inverted key so that these two halves are switched.

To search for a key, the search pattern is then broadcast on the top half word lines and its inverse on the bottom half word lines. Any bit lines with a matching keys, in this case D7, will then conduct, as shown at bottom where "nc" is non-conducting and "c" conducting. If redundancy is desired, the non-inverted version can also be programmed in as at D8 and then detected by broadcasting the non-inverted search key, and the bit lines reads searched for a 11 pattern, which can then be output as a data pointer. If further redundancy is wanted, the key or key/inverse pair can be written into the array a second time and parity bits can also be included, much the same way as discussed for the embodiments based on FIG. 4. The defective bit line should be isolated with isolation latch and not used. If some defect shows up as a stuck "0", it can potentially generate the "false" match. In this case, the data content should be compared in order to confirm whether this is a real match or a false match. The other most common reliability issue is that some cells may have lost some charges after some time, which will also produce a "false" match. Then a content match check will eliminate the "false" match error. The word line voltage bias can be budgeted a little higher to avoid "missing" a match, which is very harmful error. A "false" match can be double checked with the content check.

Figure 6B:
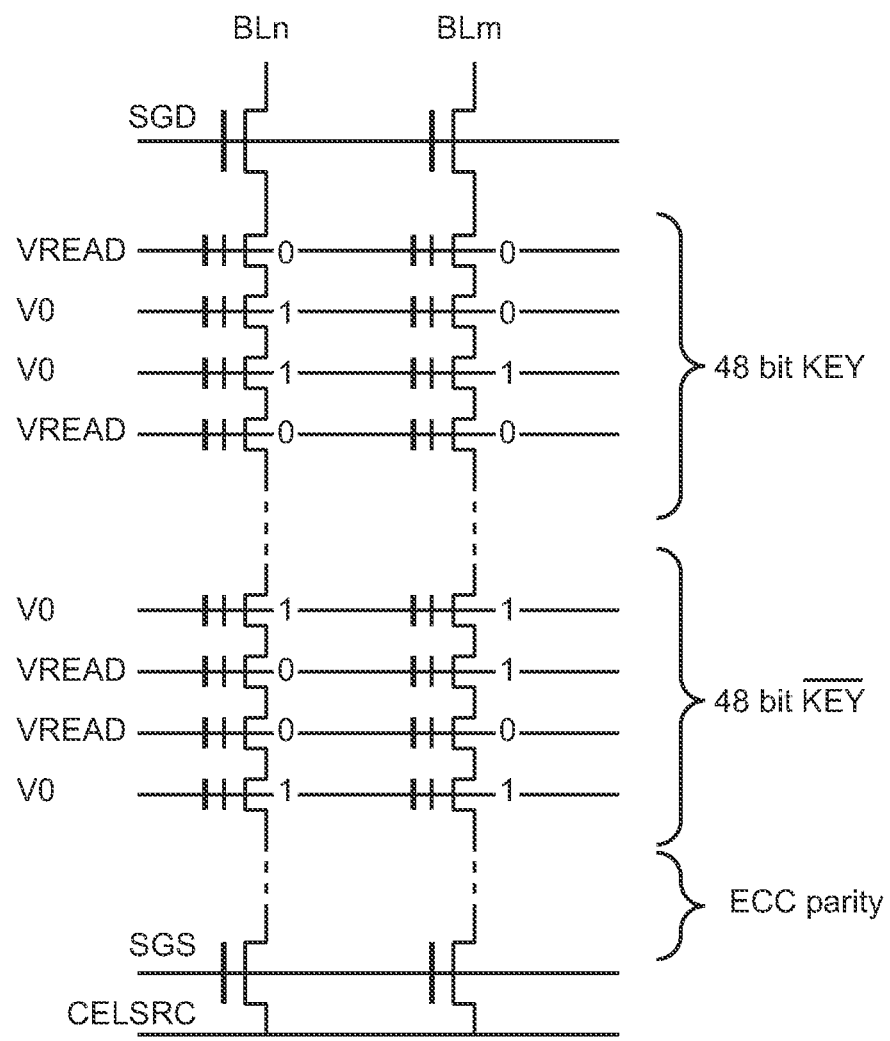

FIG. 6B schematically illustrates the key/inverse pairs along NAND strings. Two strings are shown (for bit lines BLn and BLm) each having a drain and source select gate (SOD, SGS) on either end, where the source ends are then connected along the source line CELSRC. In between are the memory cells on the strings connected in series. In this example, the stings has cell capacity to hold a 48 bit key, its 48 bit inverse, and some parity bits. Although shown here with the key along the first 48 word lines followed by the inverse along the next 48 word lines, more generally they can interleaved in various ways; for example, each of the key bits can be followed it inverse in the next word line as, when programming, this allows for a page to loading in and written, after which the programming data can be inverted in the latches and written into the next word line. The parity bits can also be variously located along the NAND string, although having them grouped can lead to easier decoding when searching the keys.

Each of bit lines BLn and BLm show a portion of a key along four adjacent word lines and the corresponding four adjacent word lines holding the inverse. To search the keys of the block, the word lines are then biased according to the search key, where the high sensing voltage used to checking for "0" values and the low sensing voltage to check for '1" values. The high value is here taken as VREAD, and can be the same used in a typical NAND memory for non-selected word lines, and the low sensing values is labeled as V0. The select gates will also need to be on and VREAD should also be applied to the word lines holding parity bits as these as used for data integrity checks and are not meant factor into key search operations.

To make the stored keys more robust, the memory can shift the sensing margins to favor "false" matches rather than misses. (Similarly, the programming parameters can be shifter relative to those typically used.) The "false" matches can be examined by the data check later to help remove any false positives. A duplicated key can be used to check for preventing error, where these duplicates can be stored on other NAND strings, with the associated data, or other locations on the system. Relative to a standard NAND memory, this arrangement will need to add extra circuitry, as described with respect to FIGS. 2 and 3.

Figure 6C:
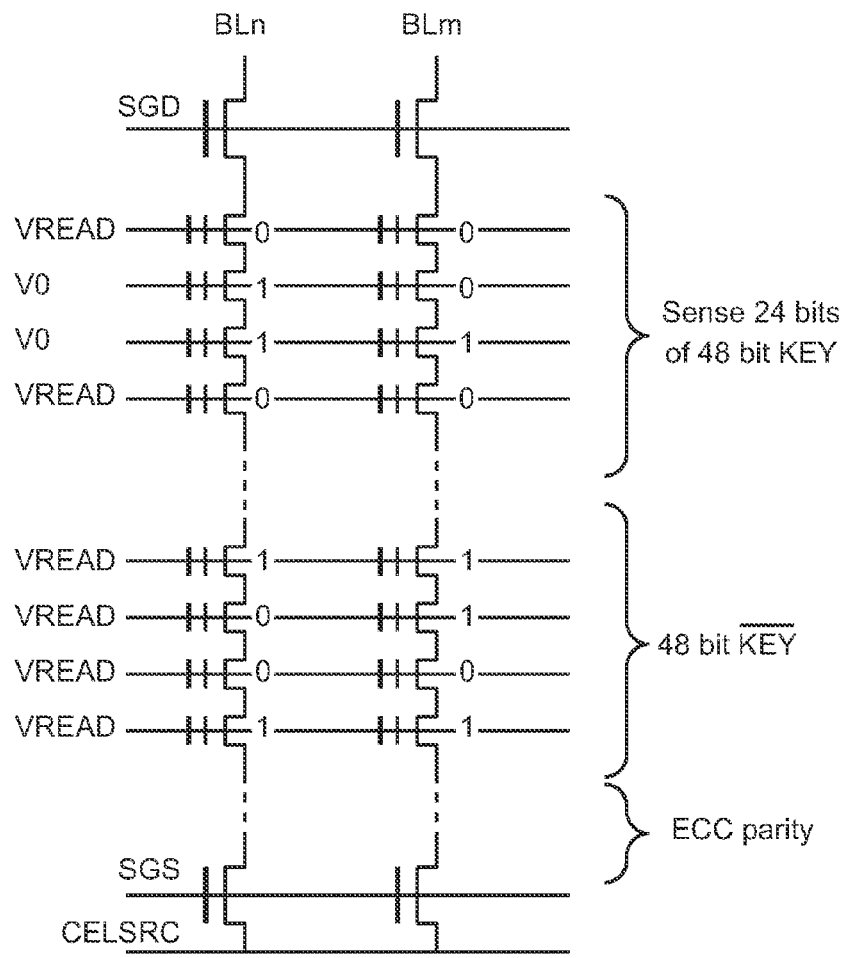

Rather than sense the search for the full key (or key/inverse) in a single sensing, a partial key can be searched, allowing the full key/inverse matching to be done incrementally. This can allows for the less independently settable word line levels, resulting in less circuitry changes relative to a standard NAND memory, but it can require some logic changes. The full key/inverse can be searched sequentially, where each subsequent sensing will be judged based on previous sensing results. For the example of FIG. 6B, rather than check all 24+24 word lines of the key/inverse in one go, a partially key check of, say 24 bits at a time can be done: if no matches are found, the process can move on to any other blocks holding keys; if a match is found, a second partial key can be checked, and so on. The subsequent checks can either do all of the NAND string again and compare the results of the partial searches, or only check those which have conducted in the previous partial key matches. FIG. 6C illustrated such a partial key comparison, where only 24 bits of the 48 bits in the key are being checked. The other bits of the key and its inverse are then set to the "don't care" value, as shown at the corresponding bits of the inverse that are set at VREAD.

As each key is written in twice (non-inverted, inverted) on a bit line, a block with 128 word lines can hold 64 bit keys, while 128 bit keys would need blocks of 256 word lines. Also, it should be noted that although the key/inverted keys are here shown as being written respectively into the top half/bottom half of the word lines. More generally, the keys and inverse pairs could be interleaved in any desired fashion, as long as it was consistent for all of the keys in the block; however, this would require keeping track of the arrangement. The interleaved pattern along the NAND chain may be preferred since the data can be inversely program in another WL without loading the data again. There are some other coupling effect may also benefit from interleaving the inverted and non-inverted data on adjacent word lines. In terms of performance for this type of embodiment, for a 16 KB page of 64 bit keys, if a duplicate key/inverted key pair is kept, this is 8 KB, or 64,000 keys. At 35 us per sensing, this gives 1.82C/s/plane. If 4 planes are operated in parallel, this is 7.3 CG/s at around 200 mW.

For either of the embodiments of FIG. 4 or FIG. 6A, the method uses the inherent "AND" functionality available in a NAND Flash memory to compare thousands of keys in a single sensing operation. This method has several major advantages over traditional CPU- or semiconductor-based CAM memories. For one, as the comparison is done "on die", there is no need to transfer the data out of the memory. This saves both time and IO power. Furthermore the actual comparison operations use less power than conventional memories. As all of the bit lines are sensed at the same time, with only the matching NAND chain is conducting current, the NAND based CAM is highly parallel; for example, in a NAND flash memory with 4×8 KB planes, (32K'8 bits/byte)/2=128K keys can be checked in one sense per die. If a sense can be done in 35 us, an even/odd sense as described above with respect to FIG. 4 will take 50 us. This is 128K keys in 50 us, so that an entire 8 GB die (2000 blocks) could be sensed in ~100 ms. The corresponding energy consumption is on the order of 200 mW. To increase performance, multiple die can be operated in parallel.

As noted in the Background section, keys can be stored in a CAM as either sorted, in which case a binary search can be used; or as unsorted, in which case a linear search is used. This is also true of a NAND based CAM, except that as NAND based CAM can be searched at the block level, in a sorted CAM the keys need only be sorted to the granularity of the block or the number of blocks that are sensed in parallel. The CAM allows for a binary search, but at the block level due to this parallelism. Even for linear searches, this degree of parallelism can make linear searching comparable or even faster than binary searches for fairly large data sets. Again, for any of these arrangements, performance here can also be improved by running multiple die in parallel.

The keys can be sorted based on a given number of most (or least) significant bits. A sorting based on significant bits is generally most useful when the key or content being searched is not a hash value, but a set of characteristics or data itself. In this case, the sorted data in each block would all share a certain number of most significant bits for their keys.

Content addressable memory exist in both binary form, where the search key consists of 0s and 1s as described above, and ternary form, where the search key can also include "don't care" value. As discussed above, when a high read value is broadcast along a word line, all of the cells along that word line will conduct regardless of its state. This property allows for a "don't care" value to be implemented by setting the corresponding word line to the high read voltage for both the key and its inverse; that is, when sensing with the key and its inverse (in either the second read of FIG. 4, or the lower half of the word lines), the don't care values are set to the high read value for both the key and its inverse, while the other values of the key are inverted as before.

These properties of a NAND based CAM also make it particularly suited to a number of other uses. For instance, as large numbers of keys can be searched in parallel, this allows for all copies of the same key in the searched blocks to be determined in the process, improving efficiency of de-duplication operations of the sort that are valuable in cleaning up data bases. The NAND structure also makes for a CAM useful as a Bloom filter as an intersection of multiple search keys can be formed by setting any values that differ between the keys to the high read voltage in the combined search key, which can then be used to search the horizontally stored keys of one or more blocks in parallel. (More detail on using bloom filter with the sort of memory can, be found in a US patent application entitled "Data Search Using Bloom Filters and NAND Based Content Addressable Memory" by Steven Sprouse and Yan Li filed on Mar. 14, 2013.)

The use of "don't care" values can also be used to perform a type of "iterative" search. This can be used the keys may have, or possibly have, some number of bit errors. One or a series of reduced keys, where some subset of values are set to "don't care" for different entries, are used for searching. Several different such keys, where a different subset of values is masked out in each, are then iteratively used to check for matches among the written keys.

Another example of where a series of reduced search keys can be employed is where the content is itself a data set, as opposed to say a hash value. For example, it could be values from image processing. In such a case, the content of the block could be searched to a desired number of significant bits, by setting bits of lower significance to "don't care". Similar arrangement could also be used for patterning matching of the content or for cases where the keys are properties of main data content.

Consequently, due to its parallelism, relatively low power consumption, or both, NAND based CAM can be used in many applications, such as data base searching, voice recognition, DNA matching/genome searches, cryptography and so on. It can lend itself to CAM based indexing and can be incorporated, for example into CAM indexed SSD systems.

So far the discussion has mainly considered the case of binary NAND memory for CAM use. More generally, multi-state (MLC) memory can also be used; for example, in a mixed binary-MLC memory, the keys could be stored in binary memory for CAM use, while data to which the keys pointed could be stored in MLC areas. It is also possible to use MLC NAND memory for CAM, using 2 to 3 bits per cell, for example, in key matching. Using 2 to 3 bits per cell, the NAND chain can store longer keys. In the sort of embodiment described with respect to FIG. 6A, where a key and its inverse are written into the same word line, a 128 cell NAND chain in binary operation can store 64 bit keys, while a 128 NAND chain with 2-bits per cell can store 128 bits keys. Similarly, 3-bits per cell operation can store 192 bit keys.

Figure 7:
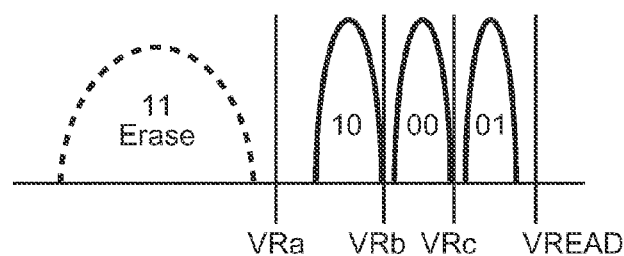
FIG. 7 shows an exemplary encoding of 2-bits per cells for four state memory cell operation.
Figure 8:
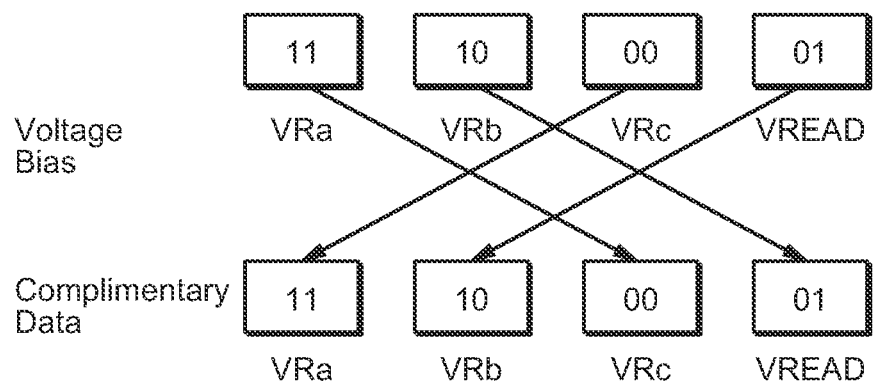
FIG. 8 shows how the data states and the complementary data used for the inverted keys correspond in the 2-bit per cell example.
Figure 9:
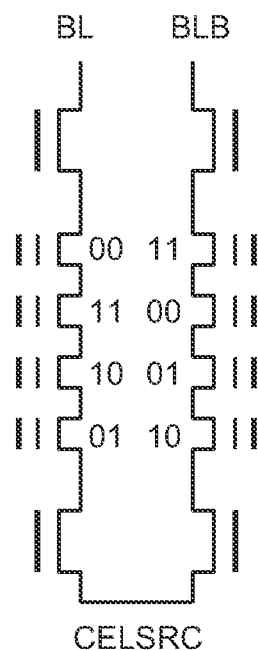
FIG. 9 shows an example of how a key would be encoded onto a 4 cell NAND string on bit line BL and its inverse on bit line BLB.

FIG. 7 shows an exemplary encoding of 2-bits per cells for four state memory cell operation. As shown, the erased state is encoded as 11, the first state up (or "a" state) is 10, followed by 00 (for the "b" state) and 01 (or "c" state). The various sensing levels are also shown. FIG. 8 shows how the data states and the complementary data used for the inverted keys correspond. FIG. 9 shows an example of how a key ({00111001}) would be encoded onto a 4 cell NAND string on bit line BL and its complement on bit line BLB. In the MLC CAM embodiment, the system can use one or two word lines along the NAND chains to store the parity bits of each NAND chain in order to check on the integrity of the NAND chain. As with the binary case, manufacture defective columns can be isolated out and more redundancy along the word lines (duplicated data) can further protect the keys' integrity. Also, the complementary data shifted as illustrated in the figures to provide more sensing margins.

In the above, keys were written down the bit lines of the array, with the search key broadcast along the word lines, allowing the keys along a block's bit lines to be searched in parallel. The arrangement can also be reversed, where NAND array can also be operated so that the content or key matching is in the word line direction. Under this arrangement, one or more keys would be written along each word line (that can be very long keys), an arrangement that can be useful in several different circumstances. Multiple short keys can be stored along the word line direction as well. If the keys are encoded so as to have significance as a 2D array of values, this would allow for content searching in both of the bit line and word line directions, although the more typical situation would just be for content matching in the word line direction. For instance, as word lines are much long than bit lines, a word line based CAM allows for the use of longer keys. Also, as data is written in page along word lines, it may be more convenient, at least initially, to write incoming key data along word lines. This would then allow for key to be searched as written along the word lines. If desired, the keys could then be rewritten along bit lines, where they could then be searched as described above. Due to the amount of data involved, to move the keys from a word line orientation onto a bit line orientation, once a block worth of the keys are assembled they could be read off of the NAND memory into the controller and then rearranged and written along bit lines; alternately, this rotation of the keys could be performed on the NAND device, although this will typically require the memory chip's structure to modified to accomplish this. This process of initially writing the keys along word lines, transferring the keys to the controller, and rearranging them to be rewritten onto bit lines can also include the sort of sorting process described above prior to rewriting them back in a bit line orientation.

Figure 10:
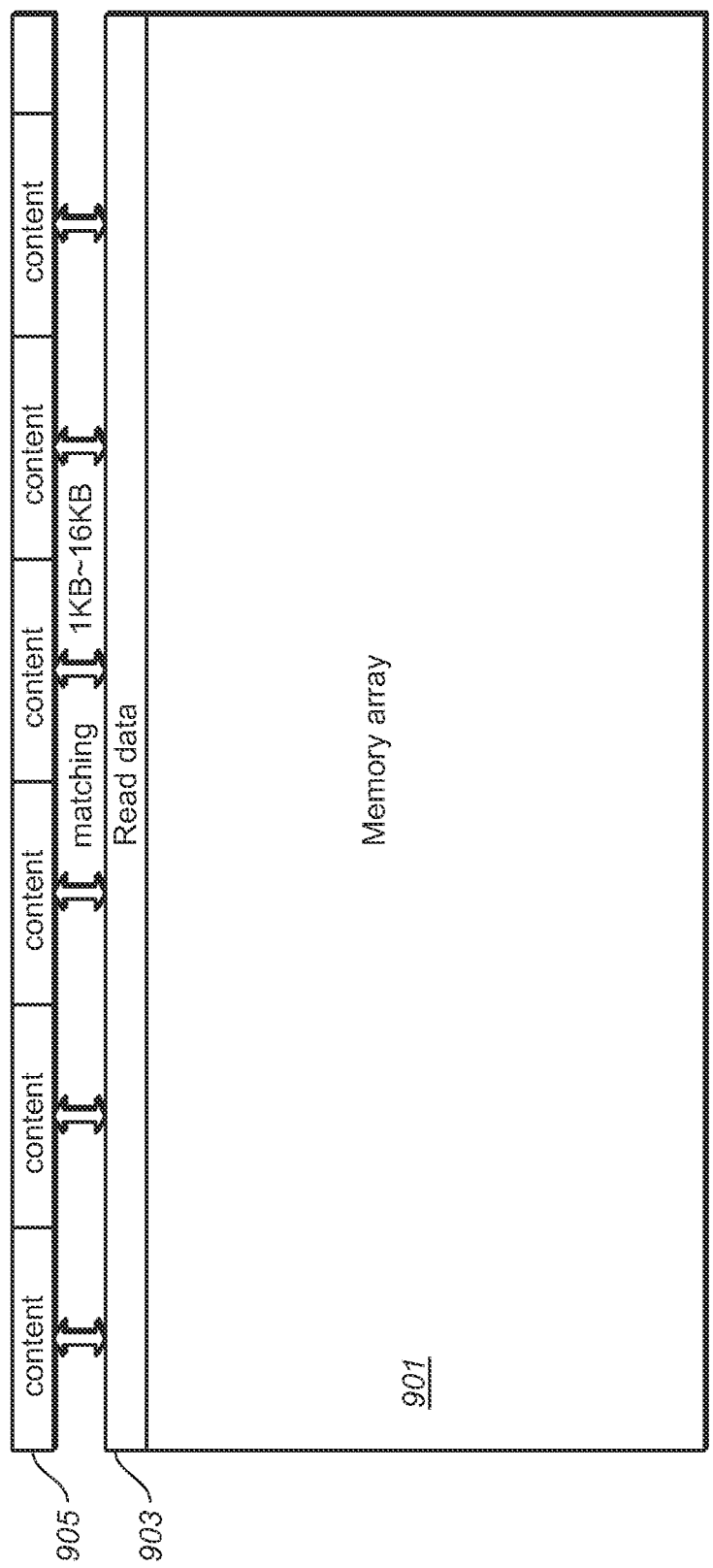
FIG. 10 illustrates the process of matching of content in word line direction.

The process of matching of content in word line direction is illustrated with respect to FIG. 10. As the system receives keys, these can be formed into pages of one or more keys and written into the memory array 901 along word lines. To match content, the system inputs the matching content of one or more search keys into a matching buffer or register 905, which can then be used to look for duplication content along the word line. The data along a word line is read from memory array 901 into a buffer or register 903. The memory can then perform internal match operations between the read data in buffer 903 and search data in buffer 905, where some number of bits ignored, if desired. The ignored bits can either be to "don't care" values, because some read error can occur on the read. These ignored bits can be corrected with error correction in the controller when a match is found. Typically, the smallest length of key/content along the word line that can be compared is 1 KB, while the longest length of key/content that can be compared in one plane is 16 KB. If the key length is smaller than 1 KB, the key can be duplicated in chunks patterns to do the pattern matching with more parallelism. Then the matched case will produce a group of "1" and the un-matched case will produce 50% "1"s. Circuitry can detect if a word is all "1"s to judge the match or miss. If there are some "0"s in a word, this word can be discarded as a miss. In order to prevent that some read errors produce a miss when it should be a match, a majority voting circuitry can be employed to choose the word with majority "1"s for matching. Some words can be masked out by marking the isolation latch to be "ignored". To simplify operations, it is typically preferable to write the beginning of a file to aligned with certain columns. After finishing a compare on one word line, the next word line content can be compared in a similar sequence.

Key-Value Addressed Storage Drive Using NAND Flash Based CAM

This section considers the incorporation of the sort of NAND Flash content addressable memory (CAM) or content addressable storage (CAS) described above in a storage drive. Conventional storage drives, such as solid state dives or hard-disk drives (SSD or HDD), are addressed by a logical block address (LBA) to read and write data stored on their physical media. These employ logical to physical address translation tables to locate the data, where the address translation table is stored on flash, in DRAM, or on magnetic media and is updated on the basis of sectors, bytes, or pages. Typical sizes for such addresses are 32, 48, or 64-bits. In some applications, such as in databases, it is desirable to have large keys (of hundreds or thousands of bits) that can address a space much larger than the number of elements in the database. In these cases a content addressable memory utilizing key-value pairs is used to index the elements stored in the device.

In a content addressable memory, data is written as a key-data pair. To retrieve the data, a search key is supplied; all the keys in the memory are searched for a match. If a match is found, the corresponding data is retrieved. This section presents a storage drive using a Flash based NAND array as described in the preceding section as a content addressable memory that is addressed using key-value pairs instead of a logical block address. This drive can provide both Binary and Ternary search capability, meaning that bit patterns in the key can have the values 1 or 0 as well as "don't care" entries. This type of NAND based CAS drive can then be used to replace other implementations of CAM or CAS functionality, such as those employing a database, that would usually include a host CPU, DRAM, and storage media.

Consequently, this section applies the of operation of a NAND flash memory as a pattern matching engine from the last section to a storage device that is indexed using key-value pairs instead of conventional logical block addresses. The device can use a standard transport protocol such as PCI-E, SAS, SATA, eMMC, SCSI, and so on. When used in a pattern matching mode, the NAND cells not only store values, but can also be used to compare their stored values with an input value. In the examples of this section, target patterns are stored along bit lines, although the word line based storage discussed above can also be used. In the bit line example, the pattern to be matched is broadcast down word lines. If all the elements in the NAND chain match their target pattern, the NAND chain (bit line) will conduct. The position of the conducting bit line can be used as an index in to another table that can be used to retrieve data that is associated with the target key. This is shown in FIG. 11, which expands upon FIG. 1.

Figure 11:
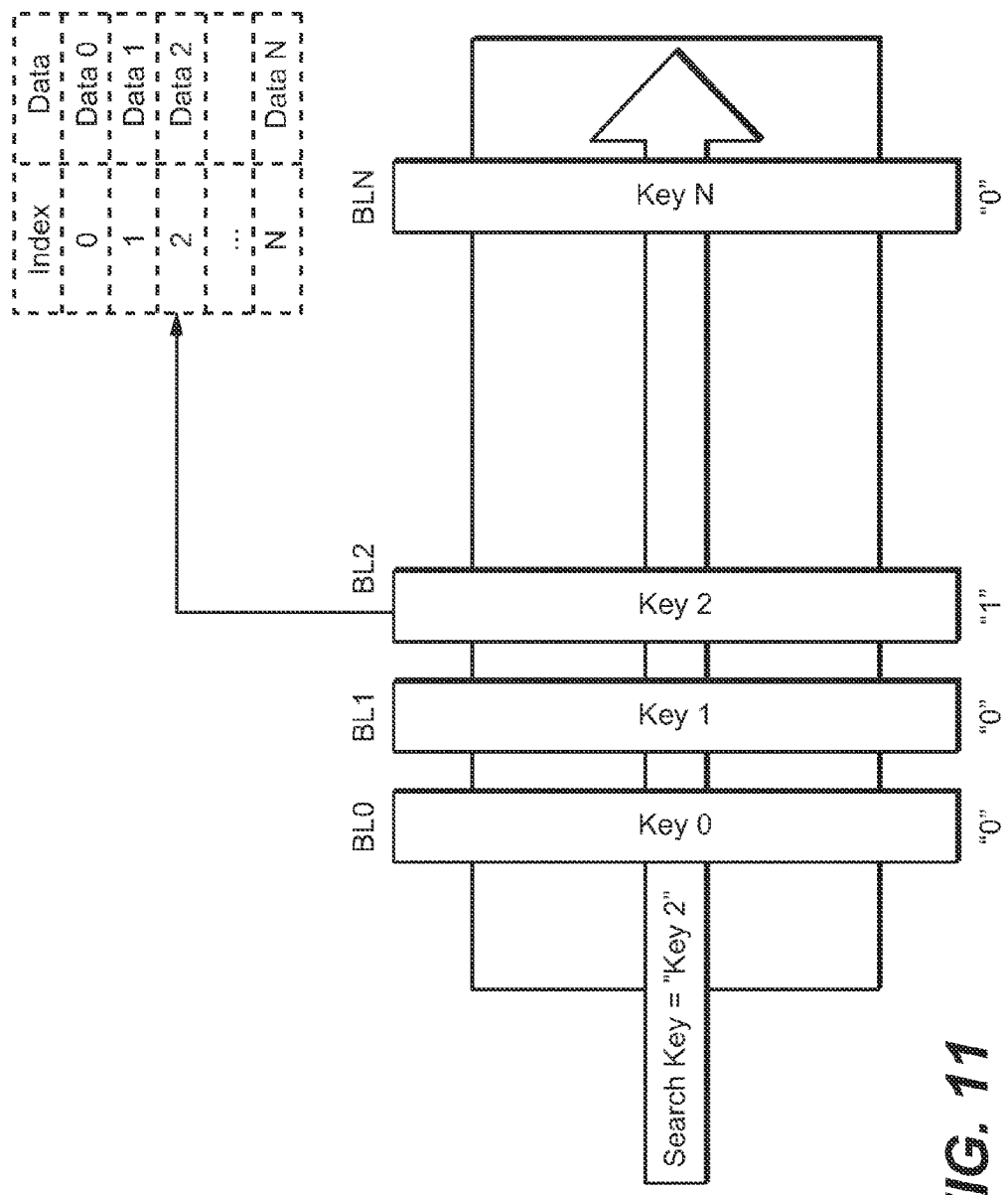
FIG. 11 illustrates how the position of a conducting bit line can be used as an index in to another table that can be used to retrieve data associated with the target key.

In FIG. 11, the bit lines BL0, BL1, . . . run down the columns of the array and are written with corresponding keys Key 0, Key 1, as previously described. The word lines are then biased according to the search key (here Key 2) so that it is broad to all of the bit lines spanned by the word lines. When a matching key or keys are found, the column address of the bit line is then input as an index to find the data set, also stored on the drive. A number of arrangements are possible, where, for example, the keys could be stored in binary or MLC arrays optimized for CAM use, while the data is stored in more standard MLC arrays.

A drive using such a mechanism can then be used to search for key-value pairs in a large search space, perform general pattern matching (using bloom filters), or be used for determining set membership. Some of the advantages of a drive using such a scheme include low power usage and high bandwidth. As data does not need to be moved from the NAND array to a separate computational module for comparison, power consumed on IO operations is reduced. Furthermore, since only bit lines that match a given search pattern will conduct, the NAND comparison operation is also low power. With respect to bandwidth, a single NAND die is capable of doing, say, 256K 64-bit comparisons in under 50 us, working out to under 200 ps per comparison. Additionally, multiple die can be operated in parallel to increase bandwidth or to increase the effective key-length. Potentially 8 Gb (~8G keys) of 64-bit keys can be searched in ~100 ms in a single die based on current design.

Figure 12:
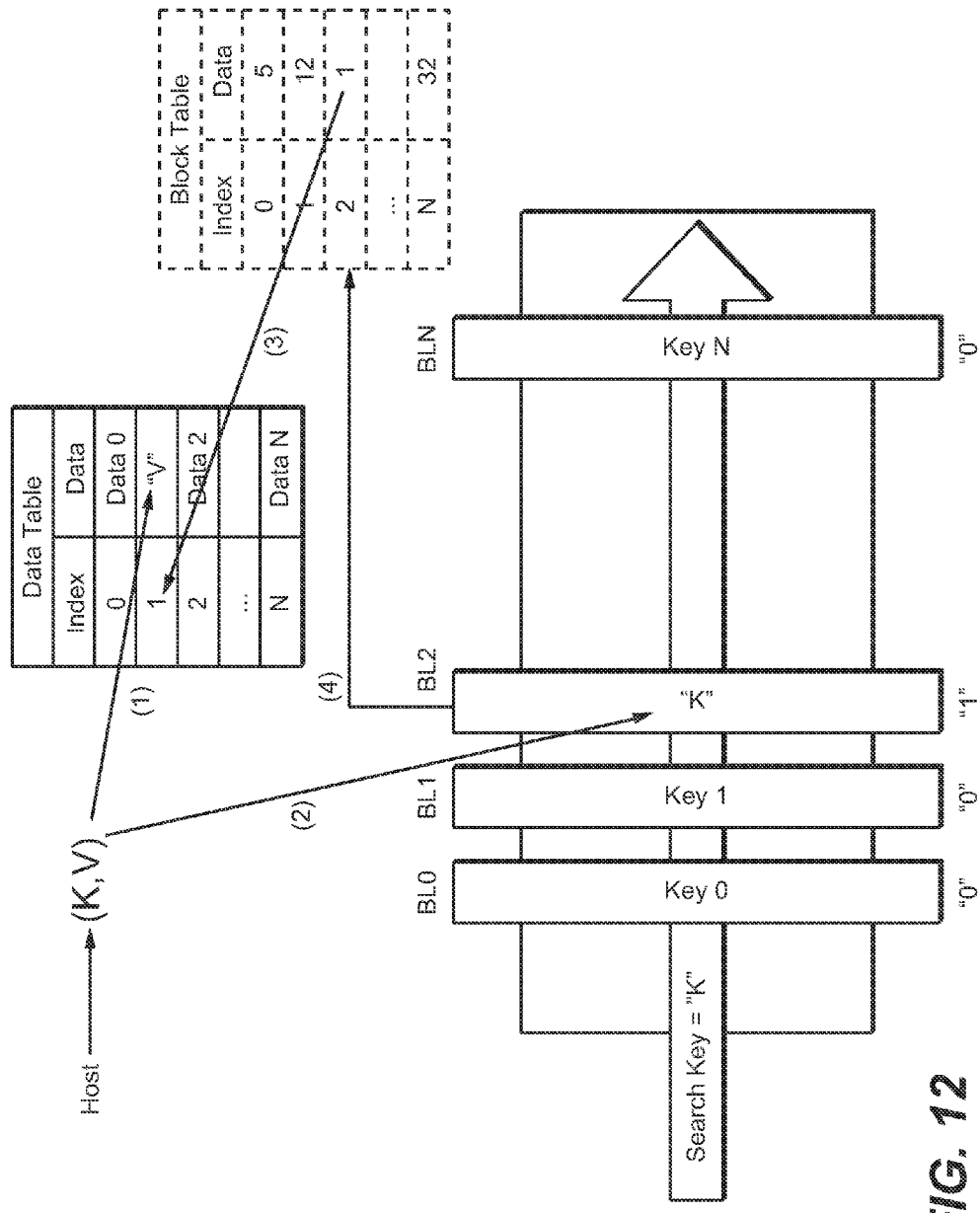
FIG. 12 schematically illustrates how a key-value pair is stored in a NAND based CAM and how the value is accessed using the key.

The idea of using a storage drive with a common interface, such as SAS, PCT-E, SATA, and so on, but which is written using key-value pairs instead of a conventional logical addressing is consider further with respect to FIG. 12. In the write method, the host will write Key-Value pair (K, V) to the drive. The drive will store the Value V in a data store at some address in the Data table of FIG. 12, as illustrate at (1). The drive will store the key value K on a bit line "i" in a block of an array of the drive, as shown at (2) of FIG. 12. The drive will make an entry in the block table at address i, with a pointer to the value V, as shown at (3). The column address which has the matching key can be output from NAND memory from status bits.

In NAND flash memory, data is written in word line based pages. Because of this, as previously discussed, the keys may be initially written along word lines, then rearranged to be written along bit lines, or first stored in RAM and then sorted into bit lined oriented keys. (It could also be possible for the host to have already taken care of this bit line based orientation for the keys, although it will generally be preferable for this operation to be transparent as seen from outside of the drive, with a host just providing basic key-value pairs and not having to engage in such data manipulations.) The controller will take care of assigning the keys and values to physical addresses and of determining the needed addressing structures to translate the key into the corresponding data location. The key to value mapping tables can be maintained in much the same way as the usual logical to physical mapping tables as far storing them and updating them, such as mappings using look up tables or based a correspondence formula. For example, the column address can be mapped to metadata in the primary storage flash management layers.

In a variation, if the drive itself has a key generating ability, such as a hashing algorithm using by the controller, just the data set itself could be sent to the drive and the corresponding keys generated on the drive. This would also allow a different host without the key generating ability to send data to the drive, where the key-value then be generated and stored. Under this sort of arrangement, for a host to access a value using a key, the host would need to use the same key generating algorithm (such as from a Secure Hash Algorithm (SHA), for example) as being used by the drive.

Looking now at the read process, the host will send the drive a key (K) that is then used to search key blocks. As discussed in the previous section, the key blocks may be sorted, in which case a binary search can be used; or they can be unsorted, in which case a linear search is used. For each key block, the drive will apply the key K to the word lines. If a matching key exists along a bit line in the block, NAND flash will register a "1" at the bit position "j" associated with the matching key. The value "j" can then be used as an index to the associated block table, as represented at (4) in FIG. 12, to retrieve a pointer, (3), to the associated value V in the Data Table. If all key blocks are searched without finding a match, the drive can return an "element not found status" or error.

The CAM NAND can be incorporate into the same memory system as that in which the associated data is stored, such as an SSD, in which case the data corresponding to the search key can be provided directly to the host. In other embodiments, the CAM NAND could be a separate device used to provide the sort of CAM-based operations described here, while the associated data could be stored separately, in which case as address or other pointer to the corresponding data on the separated device would be provided.

Consequently, storage drive can benefit by use of the inherent "AND" functionality available in a NAND Flash memory to compare thousands of keys in a single sensing operation. A storage drive of this type has several major advantages over traditional CPU- or semiconductor-based CAM memories. First, because the key comparison is done "on die", there is no need to transfer the data out of the memory. This saves both time and IO Power. Furthermore the actual comparison operations use less power than conventional memories.

In addition to the low power and high bandwidth advantages discussed in more detail earlier, this scheme has the advantage that write times can be shorter if data is searched in a linear mode. Most databases spend time and energy sorting and maintaining tables to enable fast, binary type, search capability for when data is read. In one embodiment of this invention, the writes of data and keys can be done in a random fashion making writes times of O(1) complexity. Searches will use a linear search mechanism which is highly parallelized but is still O(N) complexity. This is less efficient than the O(LogN) of most binary searches and is a tradeoff between insertion time vs. lookup time. Also, it should be noted that even when data is stored in a sorted manner, the high degree of parallelism in searching mean that the sorting only needs to be done to the level at which the search is done, namely to the granularity of block or number of blocks searchable in parallel.

The sort of NAND flash base CAS drives can be applied to a number of applications, including those described in the previous section. One set of examples of these exemplary applications is for de-duplication using pattern matching (CAM) NAND to store the hash keys. Incoming data can be sent through the hash function to generate the content related fingerprints. The fingerprints can then be searched with the existing hash keys to see whether the data already exists in the data storage. If it does already exist, no write action is taken; but if the data does not yet exit, then the new data will be written into the storage. The de-duplication can be done when the data is backing up, during garbage collection operations of the primary storage, or in-line as the data comes in from host. Another application is for virtual memory management, which can be done similarly to de-duplication. (More detail on de-duplication can be found in U.S. patent application Ser. Nos. 13/794,398 and 13/794,428, both filed on Mar. 11, 2013, that develop these concepts further.) The drive can also be applied to the Human Genome, where the drives stores signatures in the CAM NAND so that any segment of the DNA sequence can be searched. The drive also lends itself to parallel computing where, a mathematical NAND function can be done inside of the NAND memory.

As noted above, the CAM NAND operation has the keys oriented along bit line, whereas NAND memory written along word lines. Consequently, as the keys come in from a host, they need to be accumulated in a buffer memory of some sort, transposed to a bit line orientation, formed into pages (including adding any inverse keys as needed), and transferred to the NAND device for writing. This is illustrated schematically in FIG. 13.

Figure 13:
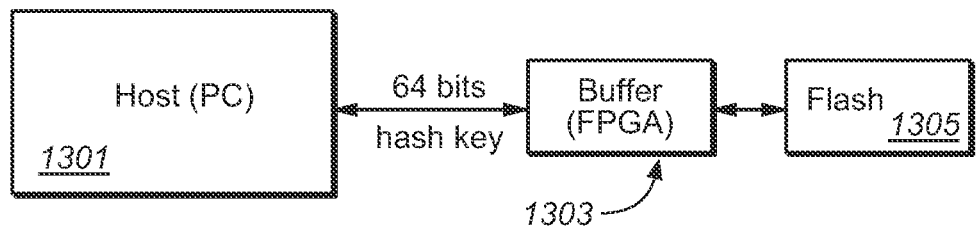
FIG. 13 illustrates a memory arrangement for transposing the data keys.
Figure 14:
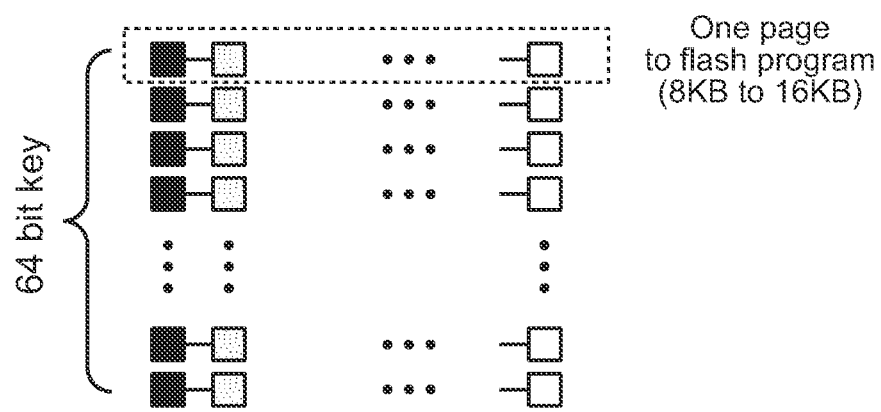
FIG. 14 represents a first hardware embodiment for transposing data using a FIFO-type structure.
Figure 15:
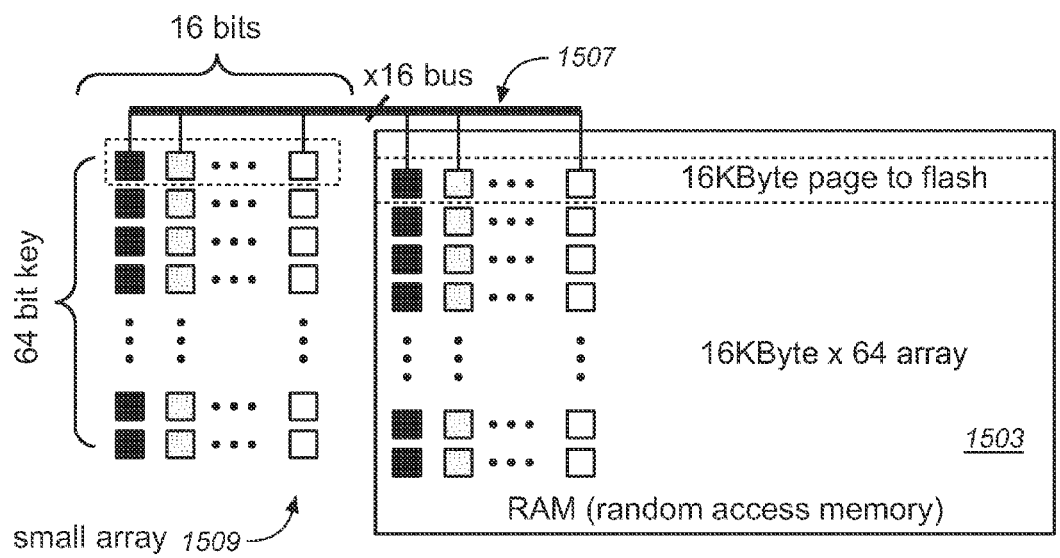
FIG. 15 represents another hardware embodiment for transposing data.

As shown in FIG. 13, a host 1301 (a PC, for example) can take the data files and generate the corresponding keys, such as using a Secure Hash Algorithm (SHA) to generate a 64 bit hash key, which can then be transferred over to a buffer memory 1303 on the memory system, where the keys can be accumulated. The transposing buffer memory 1303 is used to align the keys for writing in the NAND CAM memory 1305. Once a sufficient number of keys, say 4 MB keys for a NAND memory 1305 with 4 MB blocks, the data can be transferred over for programming as pages along the word lines. FIGS. 14 and 15 give some examples of hardware implementations for the transposing buffer memory, but this can be implemented in various other ways, such as by use of a field programmable gate array (FPGA). For example, a blocks worth of keys could be accumulated in an FPGA and then read out a word line at a time and transferred over to the CAM NAND for writing.

FIG. 14 is a schematic illustration of a hardware implementation of the transposing memory in FIFO style. The data can come in as, say, 64 bits keys or indices and is saved in column-oriented 64 bits registers. The registers are chained into a FIFO arrangement so that when a new key comes in, the previous keys shift over by one column to the right. Once there are enough keys for one page (i.e., 8 KB to 16 KB for a typical design) to be programmed into the CAM NAND memory (or early, if smaller number of keys are to be used), the pages are shifted over to the NAND for programming into the array there. Under this arrangement, if desired, the keys may be searched while still in the FIFO before being programmed, as the keys can be shifted out one at a time for comparison.

FIG. 15 is a schematic illustration of another hardware implementation for transposing the data keys using more of a RAM style arrangement. The data can come in as, for example, 64 bit keys or indices and be saved in 64 bits registers, being accumulated in a relatively small, 16×64 array 1509 in latches. The 16×64 bits of the small array 1509 can then be shifted over a bus 1507 a word (16 bits) at a time into the RAM 1503. After shifting the 64 words into RAM, the small array 1509 can accumulate next 16×64 bits. This process can continue until the RAM 1503 is full or it is otherwise desired to write in the keys, at which point is programmed in the CAM NAND memory. Under the arrangement of FIG. 15, if it is desired to search the keys before they are written into the CAM NAND, another RAM buffer storing the keys without transpose can be kept for this search purpose.

Applications to Data Analytics
On-Device Data Analytics Using NAND Flash Based Intelligent Memory The sort of highly parallel operations using a memory device of a NAND structure as a content addressable memory described in the preceding sections can also be applied to performing data analytics. This allows for massively parallel computing to be applied to various analytic applications, where the computing be performed inside of the storage and remotely from the server. This arrangement can also allow processing to be done in real time, using inline processing, and also allow for the analytics to be executed without input/output transmission limitations. Consequently, these techniques and structures can be applied to many applications, from crunching large amounts of data in data warehousing applications, quantitative analysis of financial data, and other data analysis intensive uses.

Figure 16:
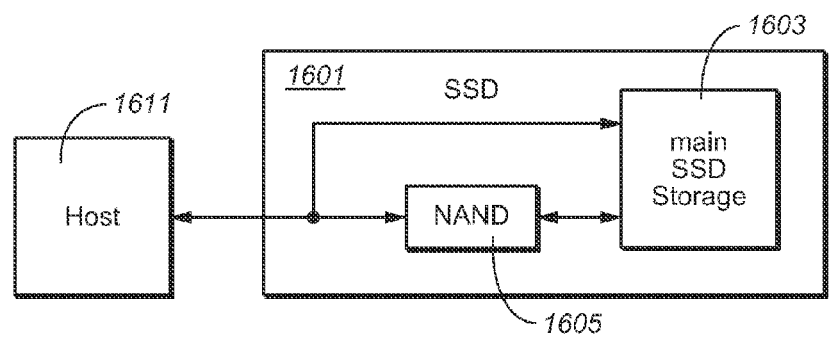
FIG. 16 shows one embodiment of a memory system incorporating a CAM type NAND into a solid state drive (SSD) for performing data analytic within the memory system.

A number of topologies can be used, with one example shown in FIG. 16. In this example, a memory system 1601 is a computing solid state drive (SSD) that includes a main storage SSD section 1603, the NAND device used can be normal NAND devices as well as CAM type NAND. In the exemplary embodiment, the NAND portion 1605 as again taken as an EEPROM based flash memory when a specific concrete example is needed. A host 1611, such as a PC or even a network connection, provides data and any instructions for analytics to perform on the data to the memory system 1601. The data can be supplied to the NAND section 1605 to be stored for analyzing and then to the main storage section 1603, allowing for in-line analysis if desired, or stored directly in the main storage section 1603 and retrieved to NAND module 1605 when analysis is requested. In some cases, such as when the data are key/associated data pairs, the keys could be stored on the NAND 1605 and the associated data going to the main storage section 1603, where the system can maintain a key-data correspondence as described in preceding sections. In case where, in response to a request from the host, data is transferred from the main storage section 1603 to the NAND section 1605 to have analytics performed, the CPU or GPU or SSD controller could be used to perform some initial manipulations (choosing data subsets, generating hash values, and so on) as needed before writing the data into the NAND structure of 1605.

The arrangement of FIG. 16 will be used as the exemplary embodiment in the following, but a number of variations or other topologies can be used. For example, the main data storage section 1603 need not be a SSD, but could be hard drives or other data storage. Also, the NAND portion 1605 need not be incorporated into the same system as the main storage 1603, but a separate system for this portion used in conjunction with a bulk data storage system. In other cases, where the amounts of data are manageable by the CAM-based NAND system itself, the NAND system can be used directly with the host for performing data analytics. For instance, a portable device incorporating the CAM NAND and some additional flash storage may be sufficient.

FIGS. 17-20 illustrate how the NAND array can be used to perform analytics in parallel for all of the columns of the array when the data includes both categorical (i.e., data that can fit into multiple categories, such as (red, blue, green) or (yes, no)) data as well as numerical range detection. Due to the CAM nature of the memory described here, multiple categories can be handled. In this example, categorical and numerical data can be stored along the same NAND strings, but the categorical data is saved in a binary format, while the numerical data can be save as binary (D1), 2-bit per cell (D2), 3-bit per cell (D3) or other multi-state format. It should also be noted that the categorical/numerical distinction is not necessarily hard and fast, as the techniques described here allow for the processing of numerical data to make it into categorical data for purposes of analysis as, in some case this can be faster than performing numerical comparisons. The more bits per cell, the fewer the number of word lines that will be used to store the data, but with the increased complexity involved in such multi-state operations. The analytics will generate a match for the specific query and the match results can be counted inside the NAND or outside of NAND. As discussed further below with respect to FIGS. 30 and 31, the counting can be done inside NAND digitally, which is precise, or in an analog, which is faster but less accurate. When counting outside NAND, the match results will be transferred to controller and the number of "1" or "0" will be counted there.

Figure 17:
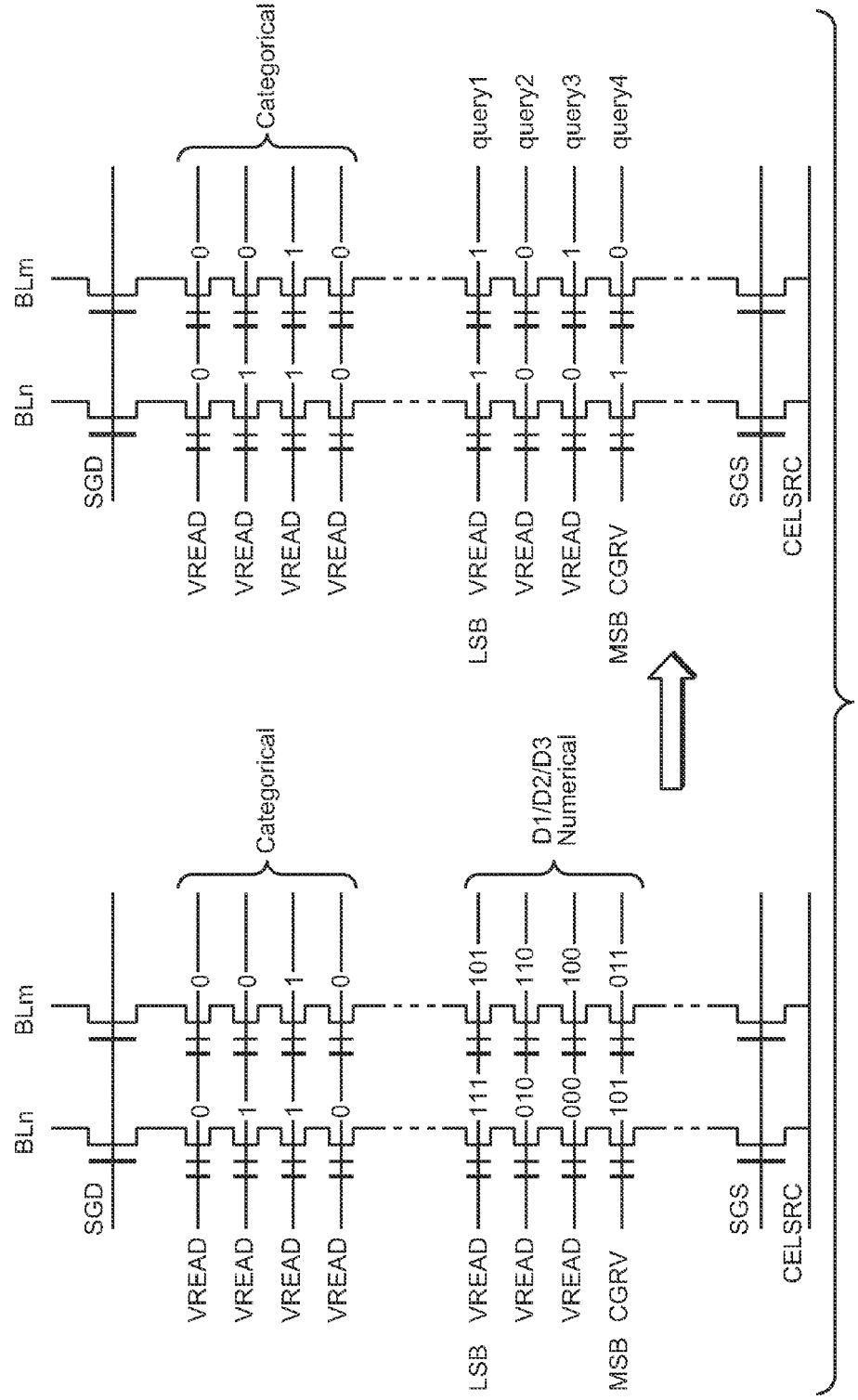
FIG. 17 illustrates how data analytics with numerical range detection can be performed by exploiting an array's NAND structure.

FIG. 17, at left, shows how two of the data sets of a block are written onto NAND strings along bit lines BLn and BLm. At upper portion of each string is entered categorical data in binary form, with some numerical data further down, where a 3-bit per cell format is shown, the bits arranged top to bottom as least to most significant bits. Here the shown categorical data word lines can be searched first, with the analytics then performed on numerical data for the matched "category". The categorical data can be "don't care" or not written with the numerical data at the same memory block. The numerical data can then be sequentially analyzed, here starting with the most significant bit, by reading one word line at a time, placing the appropriate read level (CGRV) on the MSB word line. At right is a schematic representation of how the numerical data can be compared as a sequence of queries. Each of the bit lines has an associated set of latches that can be used to keep track of the results of the sequence of analytic operation, where an example of how the results are assigned to the latches is shown in FIG. 18. (The data latches here are labeled XDL, UDL, and, further down, LDL for transfer, upper, and lower data latch respectively, to correspond to the arrangement such as that described in U.S. Pat. Nos. 7,206,230 and 8,102,705, where more detail on such latch structures can be found, and also see FIGS. 28 and 29 below.)

The table of FIG. 19 shows an example of a compare to see whether a number is greater than 010011001 for four data values. The search is here done from the most significant bit down towards the least. When the most significant bit (MSB9) is searched, the top value is found to be greater than the search number, the latches are set accordingly, subsequent reads are ignored and no updates are made. For the other three values, the results are indeterminate. When the next bit, MSB8, is checked, the second data is still indeterminate, but the lower two values are found to be less than the search values so that the latches are set accordingly and no more updates are needed afterwards. Continuing with the second data value, the MSB7 result would again be indeterminate and is not shown, but the MSB value establishes that it is greater than the search values and the latches are set accordingly. At this point, the final search values for this data set are established, as shown in the right hand most column. If there were still indeterminate data, the process would continue on towards the least significant bit until the final search results were all established. The final results will be shown on one of the data latches, such as XDL=1 in this case. The match to fit the query can be counted later or saved to another word line for further analysis in combination with other query criteria.

FIG. 20 is an example of another search to see which data values are between 123 and 231. For the first read, the first digit of the data values are checked against the upper bound, which is found to have exceeded for the first number, putting it out of the range so that any subsequent reads can be ignored. The second number is found to equal the MSB upper bound, with the bottom data to be under the MSB upper bound. At the second read, the second digit of the second number is found to exceed the upper bound, so the latches are set and no further updates are needed. For the fourth data, the second read finds this below the lower MSB values and, consequently, outside the range so that the latches are again set and no further updates needed. The second read for the third row data finds it to equal the MSB of the lower bound, so that the next digit is checked against the second digit of the search's upper value in the third read and the second digit of the search's lower value in the fourth read. The final search result is then shown in the far right column.

Figures 21, 22:
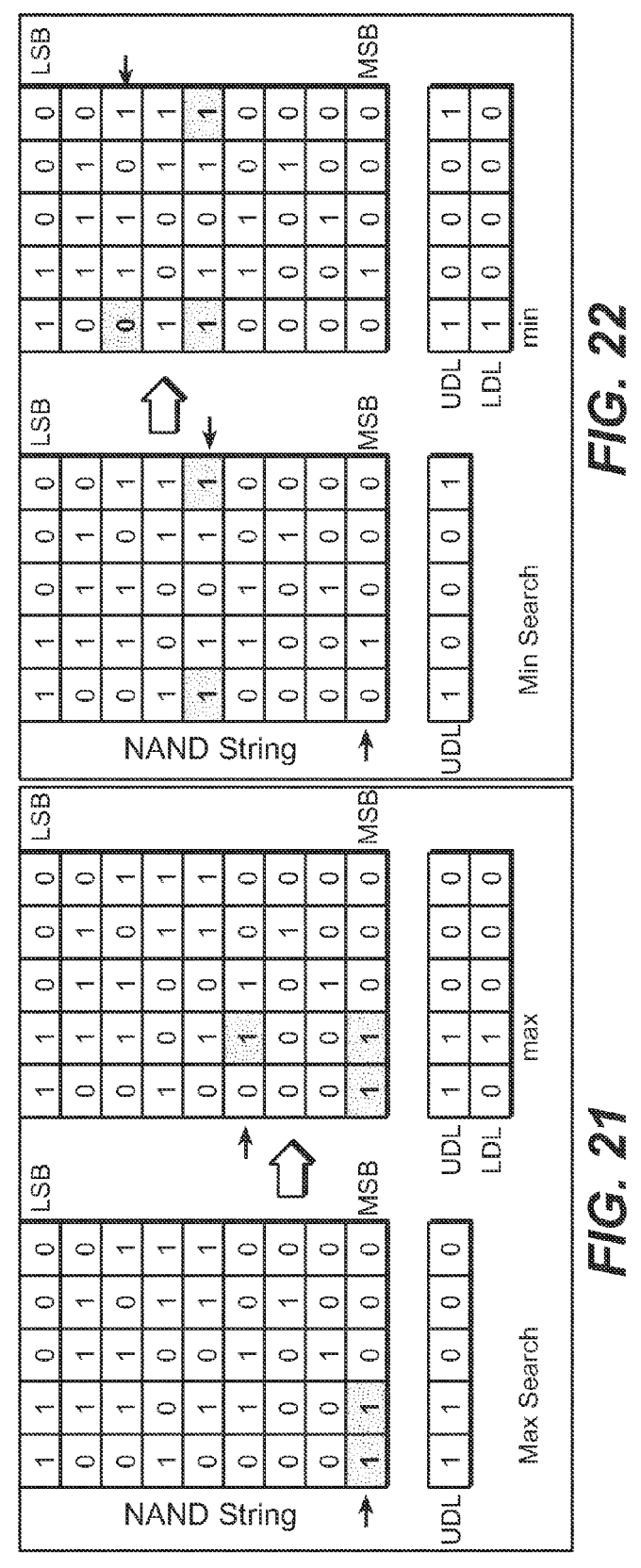

FIGS. 21 and 22 illustrate how to perform to maximum and minimum value searches. In FIG. 21 for the max search, the process illustrated for 5 NAND strings each with 9 bits arranged with LSB to MSB top to bottom. At left, the MSB row is searched and loaded into the UDL latch. In this example, the left two most NAND strings have a "1" for the most significant bit. The other columns can be ignored for the rest of the search. The process works its way up the rows, where the next two most MSBs are indeterminate. In the fourth row up, the two left columns are different, where the results as loaded into LDL show that the second column has the max value. (Here, two latches are shown for illustrative purposes, but this process can be done in a single latch per bit line by overwriting as the row is read one at a time.) FIG. 22 similarly illustrates a min search, again working its way up from the MSB. At left is shown the situation after working up to the fifth most significant bit, where the outermost column have both had zeros up until that point, as reflected in UDL. At right of FIG. 22 shows the result of two reads later as loaded into LDL, showing the left most column to be the minimum.

Max and min search can be performed on file size. For a max, the memory can find the file size with most number of digits along the NAND chain, then find the next largest files by eliminating the small numbers. For a min, the memory can find the file size with least number of digits along the NAND chain, and then search for the next smallest files by eliminating the larger numbers. Parts of a file system can be stored in this manner.

The array structure allows for the data analytics to be done one row at a time, as they can be done by reading one word line at a time. For example, the array structure can also be used to perform arithmetical operation, such as addition, subtraction and multiplication, on the numeral data along the NAND strings. The process is schematically illustrated in FIG. 23 for a summing operation. Here the data sets of block N 2301 can added to the corresponding data sets of block M 2301 on a row by row basis for each bit line. The result can then be written into a SUM block 2305. Here, block N has NAND strings N1 to N128K, block M has NAND strings M1 to M128K, and the SUM block similarly has NAND strings SUM1 to SUM128K. Selected numerical data values can then be added by reading the values of each word line from NAND string i of blocks M 2301 and N 2303 into the associated latches 2307 a word line at a time, added there, are written back to the SUM block from the latches, SUMi=Ni+Mi. If the NAND has more data latches, more bits can be accumulated before writing to the SUM block. In the case of 3 data latches, there are 4 numbers can be added before writing to the SUM block. In the case of 5 data latches, 16 numbers can be added before writing to SUM block.

In the example of FIG. 23, and also in those discussed below, the NAND array is organized as to have a block structure, such as found in flash memory. More generally, the word lines can be any of the word lines of the array; and when the memory has a block structure, these need not be from different blocks, as, for example, when adding two different word lines of numerical data from the same data set. Also, more than two data can be processed and saved into the data latches before writing the result to a new word line. For example, with 3 data latches the memory can add 4 pages before writing to a word line, saving the carry in the data latches for the next bit addition. For 5 data latches, it can add 16 pages and then write to different word line once, and so on.

FIG. 24 illustrates an example of how the latches can be used in this process for addition. The latches associated with each bit line are here labeled as UDL, LDL, and XDL. FIG. 24 illustrates a single one of each of these latches with values read from different word lines holding different values as these are read sequentially for a 13 bit number from LSB to MSB. (That is, the arrow represents the sequence of reads in time or, equivalently, down word lines for a single UDL, LDL, XDL set of latches associated with a single word line. UDL contains the data set collected at time A from a first block (such as block N of FIG. 23) and LDL contains the data set collected at time B from a second block (such block M). The XDL latch can hold any carry bits. The two data sets can be added and stored back in LDL, with the summation then programmed back into another block. Other operations (multiplication, subtraction, division, etc.) can be similarly performed: for example, subtraction can be done as one data added to the complement of the other data. In addition, floating point operations can similarly be performed by properly aligning the digital information so that the points align for the operands.

FIGS. 25A-C give some more detail on the mechanics of some arithmetic operations as these are execute in the latches. FIG. 25A looks at addition, specifically 10+3, as noted at top. Here "10", or 1010 in binary, is read from block A and "3" (0011 binary) is read from a block B. These number are shown listed for blocks A and B in the left column, MSB to LSB written bottom to top. At times T0, T1, T2, and T3 these are read into a the latches UDL and LDL, with the carry being held in the XDL latch, as shown underneath. The results are written back into Block C from the values shown latched there.

FIG. 25B illustrates how to perform subtraction of two numbers N1 and N2 to form the difference N1−N2. This is done by adding N1 to the 2's complement of N2 plus 1. A specific example, here again using 10 and 3 to determine 10-3 in the latch structure is shown: in the top row is the binary form of 10, in the second row the 2's complement of 3 plus 1 (3c+1), and the result is shown at bottom. Any overflow bits need to be discarded, with the result being the binary form of 7. FIG. 25C shows how multiplication can be done using bit shift and addition, where 10 and 3 are again used as the inputs.

FIGS. 26A and 26B look at examples of where, in addition to the XDL latches there are additional latches available on each bit line beyond UDL and LDL, such as is found in a multi-state memory device. FIG. 26A looks at the case of 3 data latches. As shown, data from four blocks (or, more generally, four pages) are written in. This allows for four numbers to be added or subtracted in a single write. FIG. 26B shows a 5 latch case, allowing for up to 16 numbers to be added or subtracted in one write.

Some examples of an application to financial data analysis are illustrated with respect to FIGS. 27 and 28. FIG. 27 illustrates an example of loading the stock data for a single stock historical data analysis, where for the 128k (in this example) bit lines can each be assigned to given stock or other financial instrument, with day for each day written to a different block. The data for each stock can be lined up along the NAND strings. With each stock taking a bit line, for an array of 128K bit lines a total 128,000 stocks can be evaluated simultaneously. The price per day can then take different blocks or different locations of the NAND chain. Using the blocks for different days, operation such as averages, linear regression, and so on can be performed using the data from the corresponding blocks, where the analyzed data can be saved in a new block.

To perform other types of analyses, the data can be arranged differently on the array. An example is shown in FIG. 28 where the data sets are arranged to perform a correlation study. In a first block the data for up to 128K stocks on a given day are entered. In the second block, the data from different stock B pre-processed from same chip or different chip will align up with the pre-processed data for stock A on the same bit line. Then the correlation between stock A and B can be calculated accordingly. Depending on the complexity of the desired operations and the on-chip ability given the NAND device, these operations can be performed on chip or with the help of the controller. For example, if needed for particular applications, the NAND can include fairly complex, but specific, operations.

Figure 31:
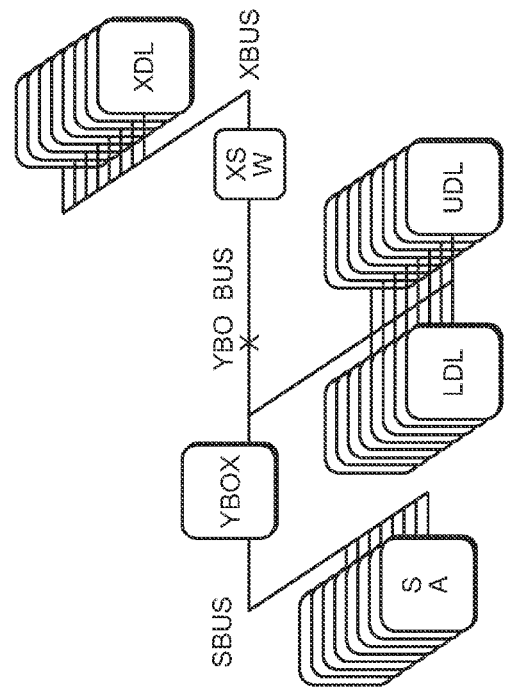
FIGS. 29-31 show some examples of how a data set can placed on more than on NAND string and corresponding latch structures.
Figure 30:
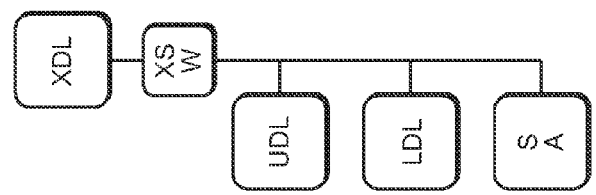
Figure 29:
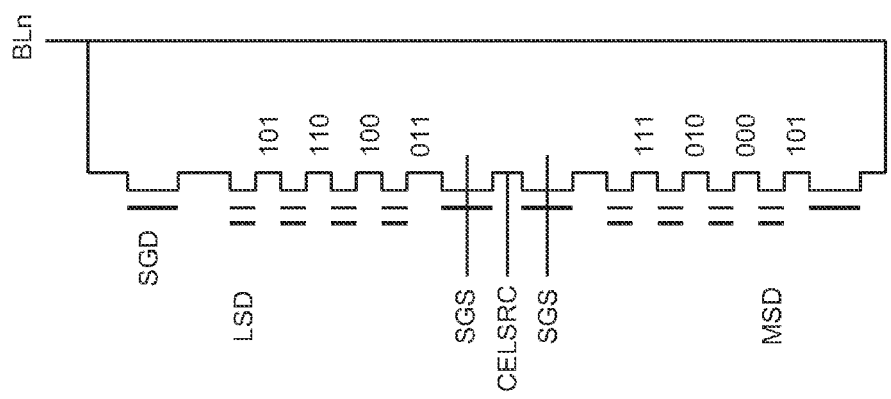

FIGS. 29-31 consider data arrangement for analytics in more detail. So far, the discussion of this and the preceding sections have largely considered the data sets or keys being analyzed on the NAND array as being on a single NAND string. However, more generally, as each bit line can have many NAND strings formed along it that are connectable to the same data latches, this allows for data (a schema) to be arranged in few separate blocks along the same NAND bit line. This is illustrated schematically in FIG. 29, where some numeric data of a data set, arranged from most to least significant bit, is stored on the same bit line, but in NAND strings from separate blocks. (Here these are shown as adjacent, but need not be so in the more general case.) The bit line then is connectable to the transfer data latch XDL and, through XS W (transistor switch), the corresponding sense amp (SA) and data latches UDL, LDL, where these can correspond to upper and lower page data latches in a more typical multi-state operation. (More detail on the latch structure described in FIG. 30 and, in the next paragraph, FIG. 31 can be found in U.S. Pat. Nos. 7,206,230 and 8,102,705.)

Data can also be arranged inside a group of (typically adjacent) bits lines that share the same data bus to communicate with a set of data latches. For example, a set of 8 or 16 adjacent hit lines with such shared structure could store each data set on multiple ones of these bit line groups. FIG. 31 schematically illustrates a latch structure where 8 NAND bit lines can process the data with shared SBUS and DBUS through logic operations from YBOX circuitry, so that a schema can be stored in up to 8 associated bit lines sharing same data latch set.

Figure 32:
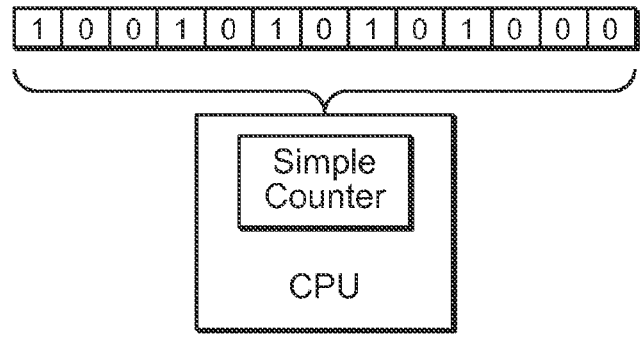
FIGS. 32 and 33 respectively illustrate digital and analog counting techniques for analytics results.
Figure 33:
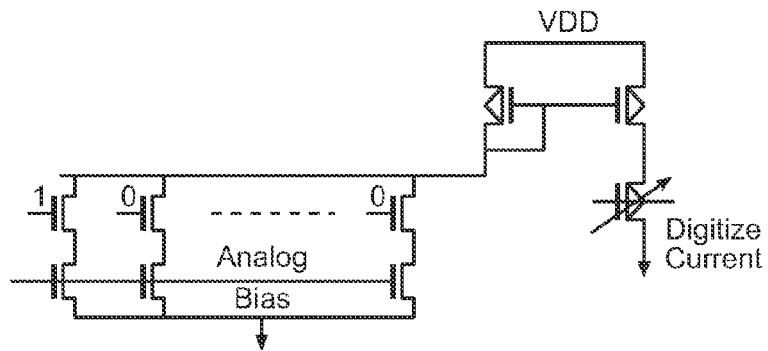

The results of the analytic operations can be computed according to various data counting methods. As illustrated schematically in FIG. 32, the counting can be done digitally inside the CPU, toggling the data out to RAM for counting. Digital counting can also be performed inside the NAND device, such as by binary search or shooting chain. Analog counting can also be done inside the NAND, which, while less accurate can be done more quickly. FIG. 33 shows some elements of such circuitry for counting quickly with analog wired. OR circuitry: here, the data is applied to the gates of a set of transistor connected in parallel, each connected in series with a transistor controlled by an analog bias. The transistors are fed by one leg of a current mirror, the other leg of which is connected to ground through a transistor acting as acting to set a digitized current level.

Figure 34:
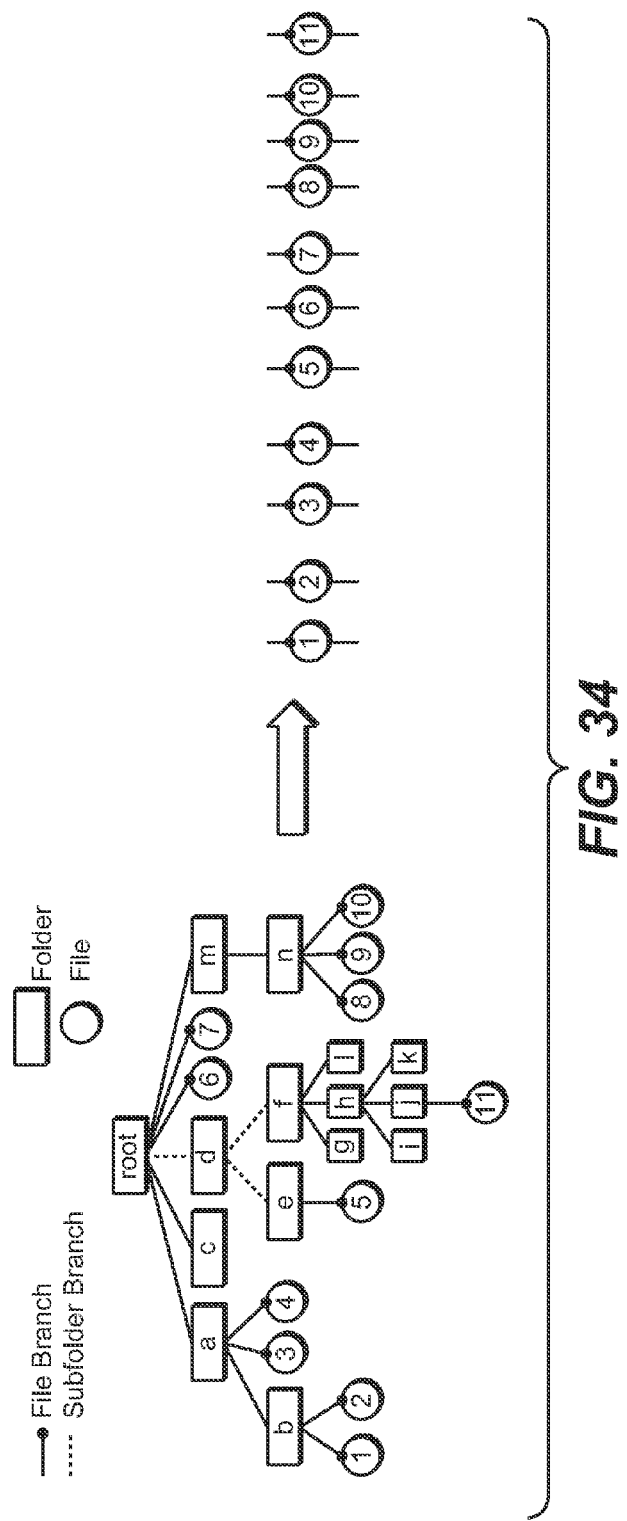
FIG. 34 gives an example of file mapping for performing analytics on large file systems.

FIG. 34 illustrates how analytics can be applied to large file systems. As file systems grow, there is an increasing demand to perform complex queries, such as "How many files have been updated since 10 days?" and "Which are the top five largest files that belong to John?" The first is an example of aggregate queries which provide a high-level summary of all or part of the file system, while the second is top-k queries which locate the k files and/or directories that have the highest score according to a scoring function. The incorporation of the NAND section as described with respect to FIG. 16 provides a simple solution for performing such queries.

At left, FIG. 34 shows a file system. The basic file data (owner, time stamp, file size, etc.) is saved into NAND in vertical NAND chains as shown at the right of FIG. 34. Performing the analytics by the NAND SSD in this way saves the trouble needed to build the data tree structure as shown in the file structure on the left. Then aggregate queries can, for example, be searched on the time stamp that can be located in a few word lines against a certain date. Top-k queries can be done, for example, by identifying "John" and the file size. (As noted above, min and max searches can also be done for file sizes, allowing for portions of file systems to be stored on this basis.)

The material in this section is developed more in U.S. patent application Ser. No. 13/756,076.

Architectures for Data Analytics Using Computational NAND

Figure 35:
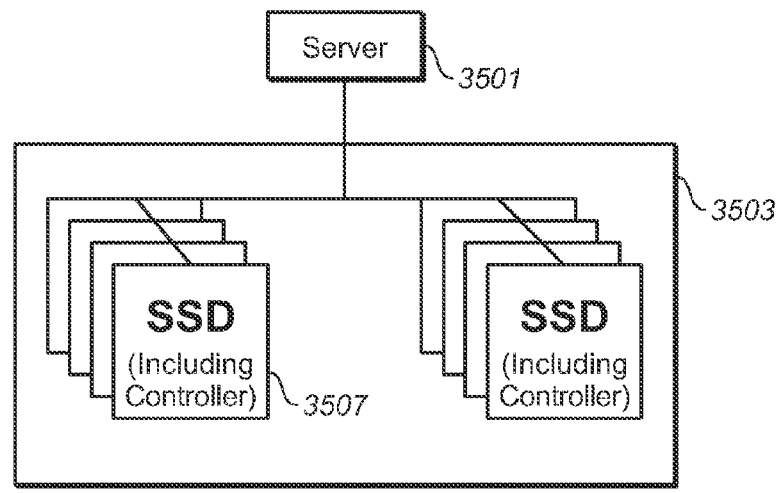
FIG. 35 illustrates a conventional architecture for server CPU based data analytics.

This section considers some architectures and data structures for using the sort of analytic operations discussed in the preceding section. For comparison, FIG. 35 a conventional arrangement of a server 3501 used along with a data system 3503 of one or more SSD drives such as 3507. In the conventional architecture, the CPU of the server 3501 does all of the computational operations for any sort of data analytics, where the storage system 3503 is just used for storing data, so that has to flow from storage device to the server CPU to perform analytics on any data stored there. Although an individual element 3507, such as an SSD blade, of the storage system 3503 will have a controller, this is traditionally used for managing of the data storage on the device, rather than any sort of analytics. In contrast to this traditional arrangement, the current section describes techniques whereby some or all of the data analytics are instead done on the memory system that is now used as a data analytics system.

Figure 36:
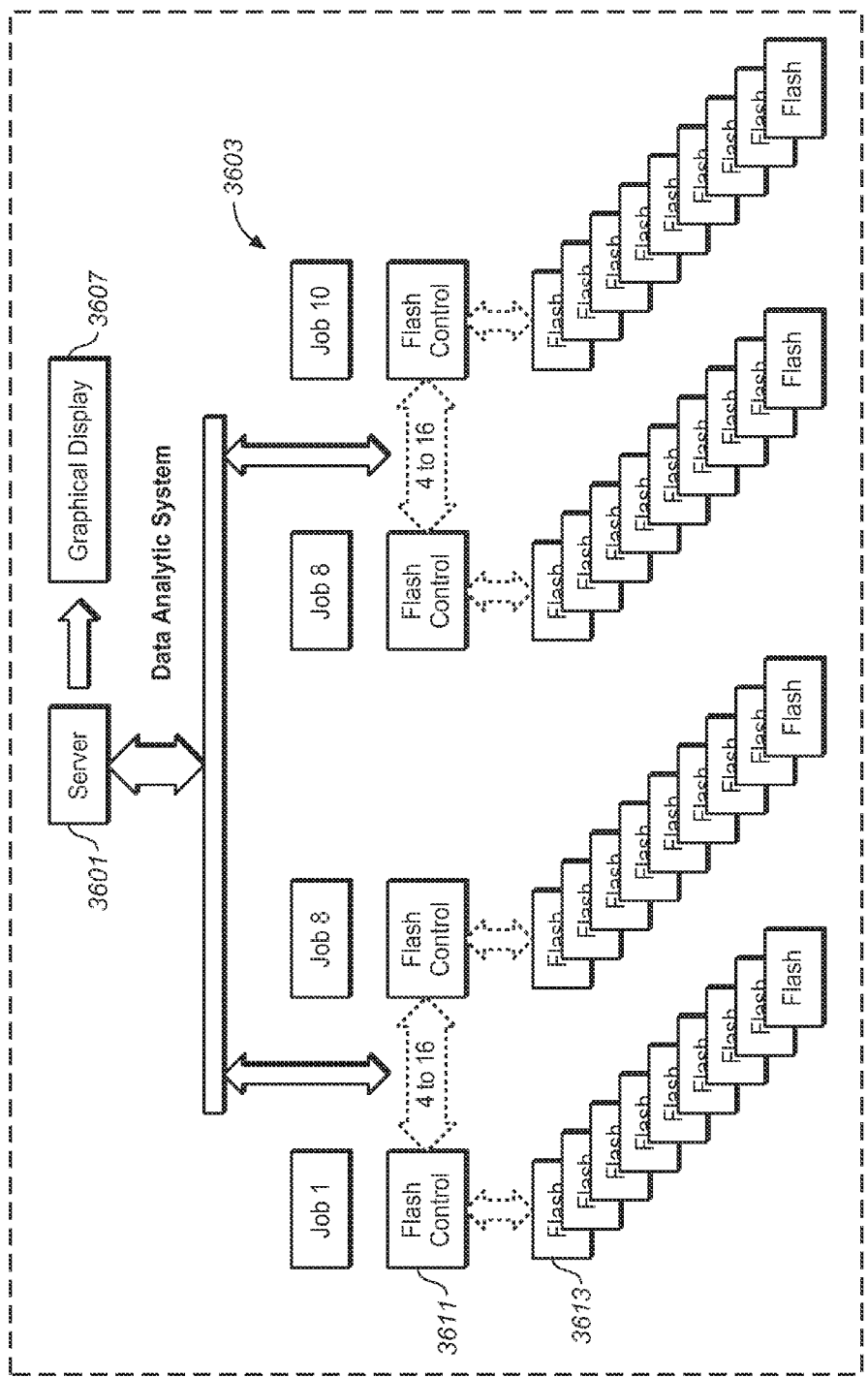
FIG. 36 illustrates an architecture using computational NAND in data analytics.

FIG. 36 schematically illustrates an architecture using the sort of computational NAND described in the preceding section. This has several layers: the server, the solid state drives; and, within the drives, the memory controllers and their associated memory devices. As shown in FIG. 36, the server 3601 issues software commands that can be in an existing data base languages. On the Data Analytic System 3603, these commands are translated into firmware to be executed there. Various tasks can then distributed between the flash memory controllers, such as 3611, and their associated flash arrays, such as 3613. This allows for the various sub-operations of analytics to be spread out between the server, the microprocessor circuitry on the SSDs, the flash controllers, and the computational NAND areas based upon the relative abilities and to exploit the increasing level of parallelism as you go lower down the system to more efficiently performing the analytics and provide the final or intermediate results back to the server 3601. The server itself can also be used in performing some to the task, such as any final or complicated computations, where the results could then be provided on a graphical display 3607, for example. Examples of functions that can be performed on the flash controller can include sort, merge, addition, subtraction, multiplication, division, squaring, exponentiation, etc. while for the NAND memory the functions could include operations such as searching, matching, minimum, maximum, greater than, less than, addition, subtraction and so on as discussed in more detail above.

This arrangement can save on power, as data does not need to go out of the SSDs. It can also save on servers, as it can handle more data without a need to expand servers with large DRAM memory. Since this is a distributed system, with multiple controllers and associated flash array, the controllers and the associated sets of flash array do not need to be executing parts of the same job. Instead, multiple jobs can be executed in parallel, as indicated by the different Job numbers above the lash control circuitry of FIG. 36. This ability to run multiple jobs in parallel can be particularly useful for computational NAND as in some cases a user's data may not be large enough to compete with the performance of a server-based implementation; however, the system described here has the advantage that it can process multiple jobs in parallel to exploit the benefits from utilizing the degree of parallelism in the NAND based flash SSD of the data analytics system.

Whether the data analytic system is doing one or multiple jobs in parallel, the software running on the server will issue the commands using a database language. This software, which can interface with a common, existing database language, is translated into firmware language and then into multiple small tasks. Depending on the details of analytic jobs, the software level can also optimize the analytics to choose the best way to arrange data or distribute the task among the microprocessors or flash controllers or NAND memory units. The small tasks will be executed on the SSD flash controllers or on NAND flash according to the task specifications. The mid-product from the NAND flash or the SSD controllers can be merged within each SSD blade and then, if needed, further merged on the top server level. The task to distribute the jobs and merge the jobs can be executed with proprietary software or it can also be interfaced with open source computing, such as Hadoop Map Reduce platform.

Figure 37:
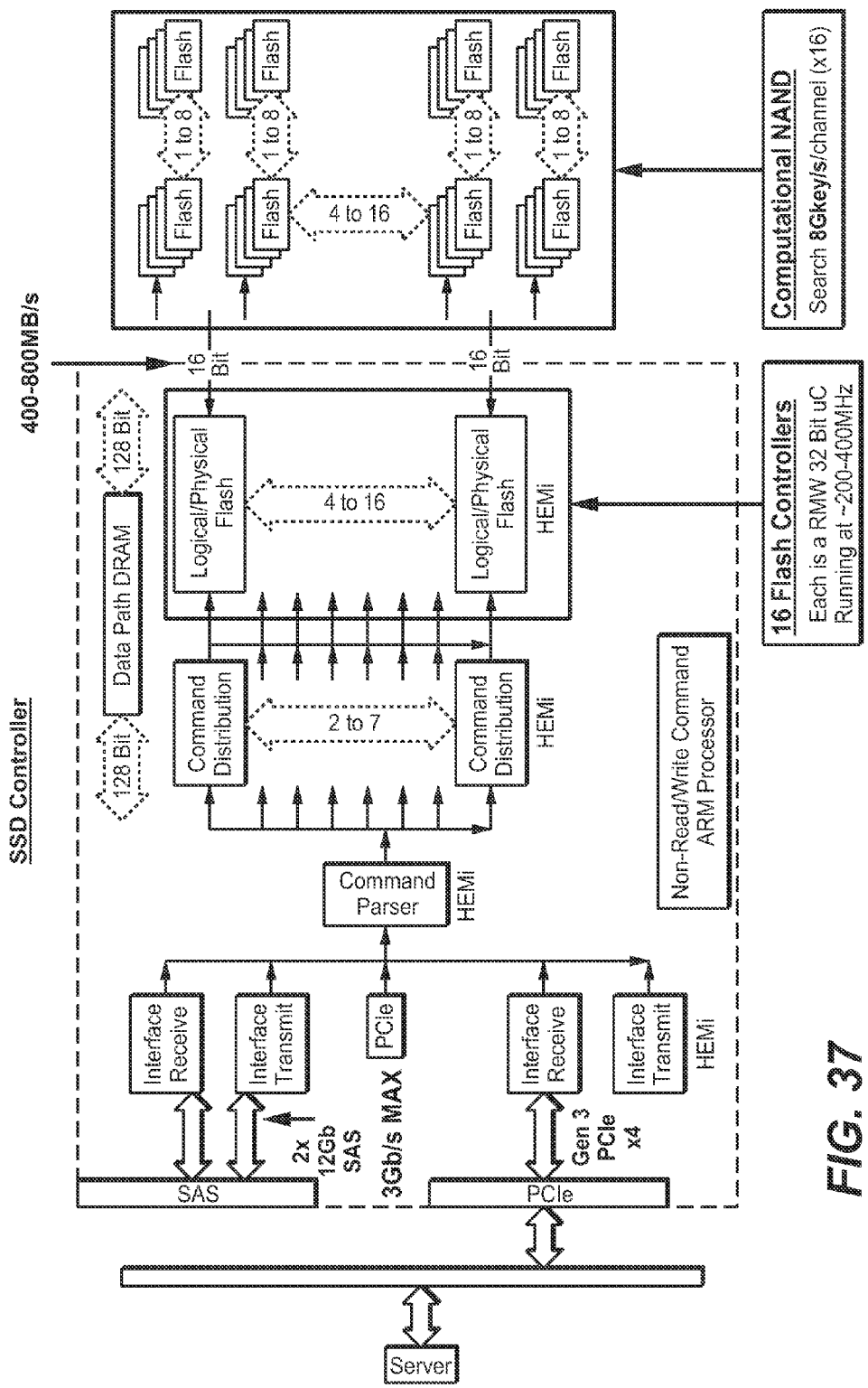
FIG. 37 shows a more detailed hardware architecture for a part of the data analytics system.

FIG. 37 shows an example of the hardware architecture in more detail for one SDD unit. The SSD controller includes interface circuitry as well as components to parse and distribute commands and data across the 16 (in this example) flash controllers. The flash controllers perform the usual functions, such as logical to physical address conversion and so on, but also the analytic functions. During the execution of data analytics, the SSD controller can focus analytic operations. Memory maintenance operations, such as garbage collection, can be delayed and not be triggered until the analytics operations finished, releasing the SSD controllers to execute analytics jobs. As far as hardware changes, the SSD controllers, and the flash controllers within these, often a fair amount of capability that can directed towards analytic operations, particularly if maintenance and other non-analytic functions, are suspended. Consequently, the larger changes to the system is with respect to the firmware for the SSD controllers have to be controlled with firmware, although the hardware can also be optimized to do various analytics jobs.

FIGS. 38A-D illustrate an example of a particular benchmark operation, a pricing summary report query (TPC-H Q1 benchmark), where FIG. 38A is some corresponding pseudo-code for the analytic operation. These operations can then be distributed between NAND operations and controller operation based upon which is most efficient: for example, addition can be done in NAND, where it is faster, while multiplication will be done more quickly in the controller. FIG. 38B illustrates how the data sets are arranged in the NAND memory for analytic operation to be done there, where the NAND bit lines run up and down. As discussed in previous sections, this may require the data to be transposed form a word line orientation prior being written into the arrays. FIG. 38C illustrates some of the parameters for determining "120 days Sum of Quantity", where the operations on NAND are indicated by the bracket from the left, those in the controller by the bracket from the right. FIG. 38D shows the same information for the query "120 days Sum of discount price=price*(1−discount)".

Figure 39A:
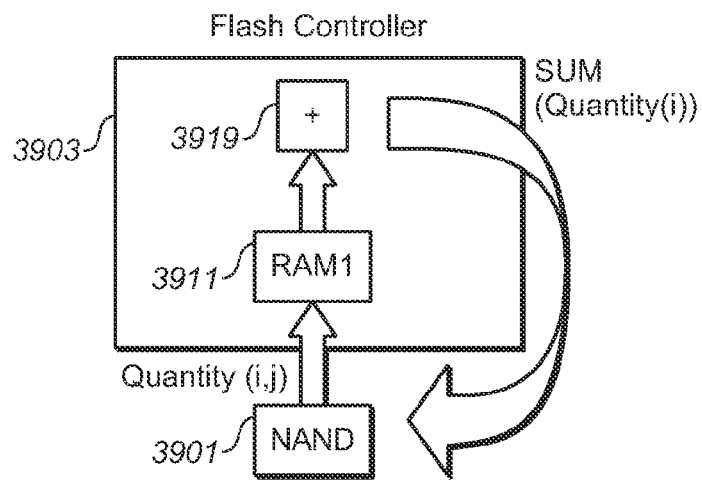
FIGS. 39A and 39B is a schematic representation of the division of tasks between the controller and NAND memory for the query of FIGS. 38A-D.
Figure 39B:
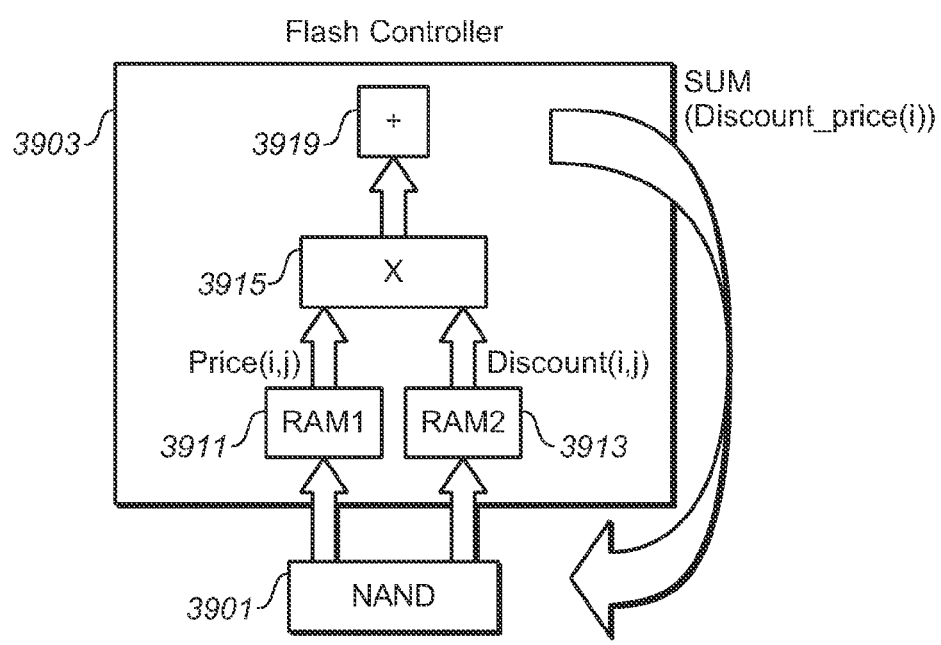

FIGS. 39A and 39B schematically illustrate examples of this division of tasks between the NAND memory and memory controller for the respective queries of FIGS. 38C and 38D. For the query "120 days Sum of Quantity", the CAM type NAND 3901 can provide the controller 3903 with the Quantity(i,j) results, which it then buffers in the RAM 3911. These can then be summed up (represented at 3919) by the circuitry on the controller 3903. The single number of the result, SUM(Quantity(i)), can then be sent back to the memory chips. FIG. 39B illustrates operations for the query "120 days Sum of discount price=price*(1−discount)". The NAND 3901 now provides two sets of quantities, Price(i,j) and discount(i,j), to the controller 3903 that are respectively buffered in RAM1 3911 and RAM2 3913. (Although shown as separate for illustrative purposes, in practice these can be stored in a single RAM memory used by the controller.) These quantities are then multiplied and summed by the controller's logic, schematically represented by 3915 and 3919, to generate the result SUM(discount_price(i)), where this result can then be written back into the non-volatile memory.

FIGS. 40A-D illustrate another example of a particular benchmark operation, a minimum cost supplier query (TPC-H Q2 benchmark), where FIG. 40A is some corresponding pseudo-code for the analytic operation. These operations can again be distributed between NAND operations and controller operation based upon which is most efficient: for example, search operations and minimum operations are done in NAND, with results being in the controller. FIG. 40B illustrates how the data sets are arranged in the NAND memory for analytic operation to be done there, where the NAND bit lines run up and down and the left-most column shows an example of how may digits can be assigned to the various line items. FIG. 40C lists steps of the operation and the amount of time typically involved for these, where steps 6 and 8 are controller operations and rest NAND operations. FIG. 40D illustrates some of the parameters for determining "minimum cost supplier" in this way.

FIGS. 41A and 41B are respectively more detailed versions of portions of FIGS. 40B and 40C. In particular, FIG. 41A illustrates the first two steps in FIG. 41B of the steps 1-5 from FIG. 40C that are executed on the NAND array. At the upper part of FIG. 41A, for each line item the supplier and region are lined up along the NAND strings, where region is searched. The results of the search are then shown, followed by an AND operation for the search result with supplier. Below that is a similar search for "part No1". Similar searches are then done for type and size, followed by a Min(Price). In doing this, only two functions (Search and Min) are used on the NAND array, where these are described in more detail in the last section. To compare the results from the different die, the controller then performs the "Merge Min from all die", shown as step 6 in FIG. 40C. As noted, when data is transferred to the NAND devices, some data will be stored vertically along the NAND chains for Search operations. Consequently, the data, whether being retrieved from elsewhere in the memory system or being received from a server, will likely need a rotation to be done inside the SSD controller. Both here and in the other examples, this transposing of selected data into a bit line arrangement can be done when the data is initially shifted in from other storage to the analytic storage. The transpose can also be done when certain specific search commands are issued and the needed data has to be re-arranged to accelerate the search.

Figure 42:
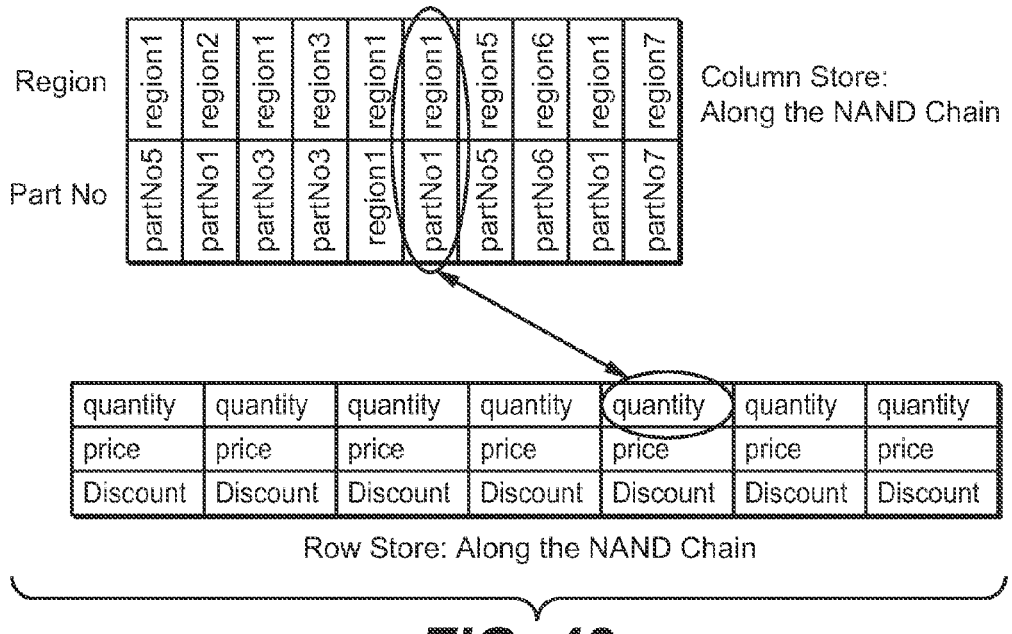
FIG. 42 illustrates the data structure using column and row storage.

As with the other applications discussed above, in addition to stored data on columns along the NAND there will often be some associated data stored in rows along NAND pages, where both of these pieces are derived or extracted from the data on which the analytics are being performed. This sort of row and column storage data structure for data analytics is illustrated by FIG. 42 for the example of the data used in queries of FIGS. 38-41. The upper, left portion shows portions of the data sets as stored along columns for the search operations shown in FIG. 41A. For each of the columns, associated data is then stored along word lines in NAND pages. One such correspondence is shown for the line item with (region1, part No1) is associated with the shown (quantity). Column addresses can be linked with a row address by an offset in a fixed mapping, a formula, or by something like a logical-to-physical mapping, but now the metadata would associate column addresses with associated row oriented data. This is similar to the sort of key-data associations described above for more general CAM NAND arrangements. A search can then be done in the Column (along bit line) Store (such as for (region1, part No1)) and the corresponding data (such as the associated (quantity)) can then be fetched from Row (along word line) Store.

Figure 43:
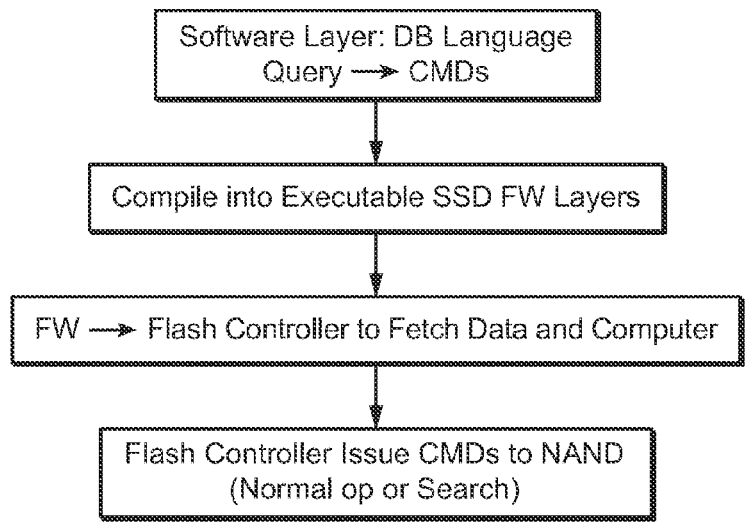
FIG. 43 presents the relationship between the building blocks in the analytic system.

FIG. 43 considers the building blocks to convert a flash SSD to a computational SSD drive. At the top layer is the Software Layer running on the serve, where this takes a database language query and turns this into a set of commands to send to the data analytic system. On the data analytic system, the SSD controller compiles the commands into executable SSD firmware layers. The firmware can then direct the flash controllers to fetch needed data and perform computations on them, where this can done using hardware merge and sort operations as these typically deal with small amounts of data. The flash controllers then issue the needed commands, such as for normal operations or searches, on to the NAND memories. The NAND memories can have the sort of enhanced search capabilities described in the last section above. A single analytic job can be divided up into many small jobs and distributed to each flash controller and associated sets NAND flash memory for execution. The flash controllers can then issue parallel command sequences to execute the analytics jobs in parallel in multiple memory chips and controllers. The execution of some analytics in the SSD controllers can be done in parallel with the NAND analytics operations, where the two operations do not interfere with each other; for example, counting in the controller while doing a sensing read inside an associated NAND device for a search operation. The multiple flash controllers on SSD drive are controlled by the interface controllers and can coordinate the merge and transfer of partial results out of the SSD drive to the server, which can merge the final results and display them to the customer.

Figure 44:
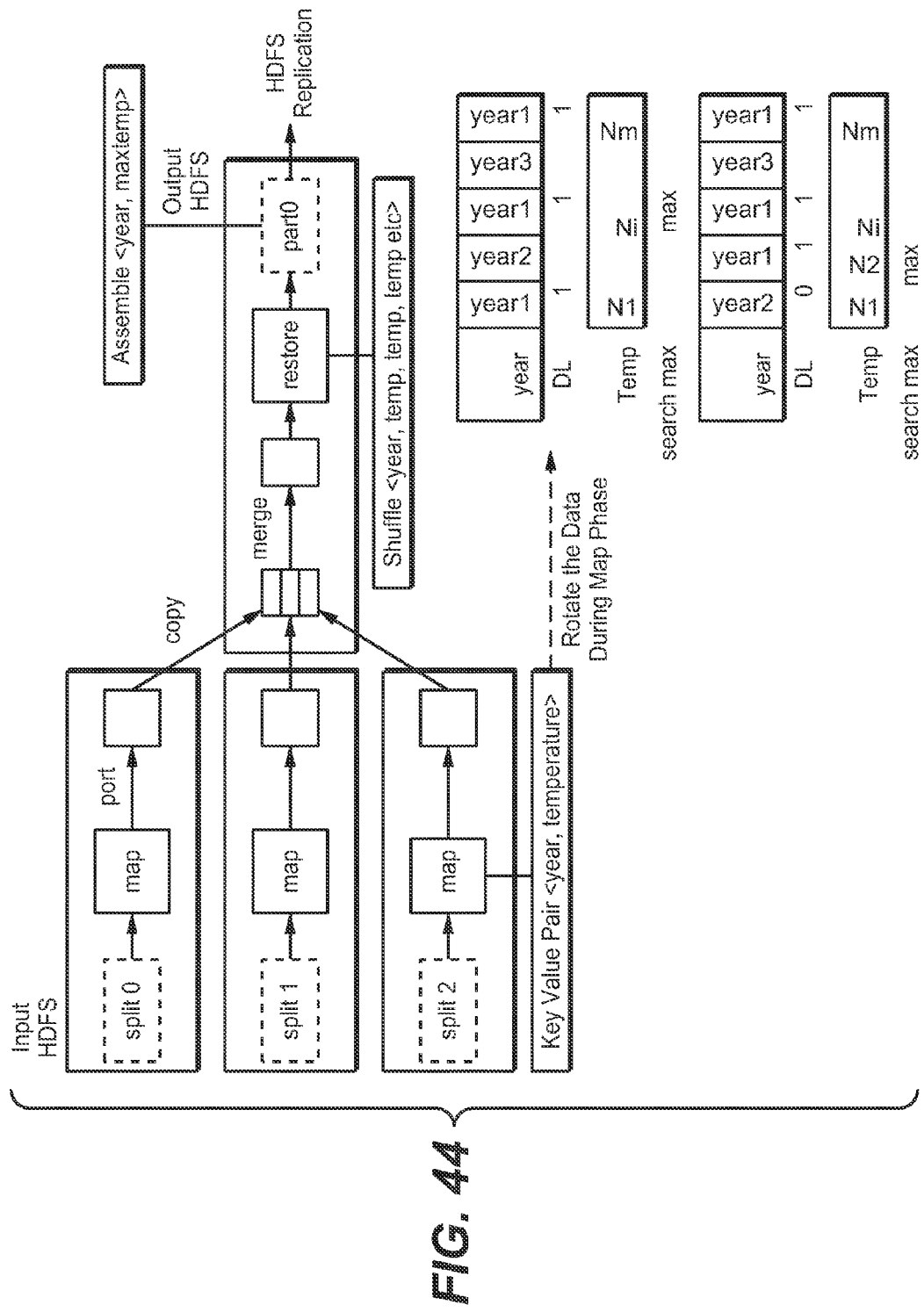
FIG. 44 is a schematic representation of a server based map reduce data analysis and how this can be moved to an CAM NAND based analytic system.

As discussed at the beginning of this section, data analytics of this type have typically be done on the server (or several severs), with the SSD drives used for mass data storage. FIG. 44 can be used to contrast the techniques of this section with this sort of server based approach, here in the context of a Hadoop Distributed. File System (HDFS) used for the first system. This is shown to the left. In a Hadoop arrangement, the MapReduce engine is used for the computing, forming <key, value> pair, which then undergo the network intensive operation of a "shuffle", with the results then be assembled (a count). (The process by which the Hadoop system performs the sort, and transfers the map outputs to the reduces as inputs, is known as the "shuffle".) The data is split into HDFS blocks of 64 MBs or 128 MBs chunks dependent on the server's DRAM size. Map tasks writes the intermediate output to the local disk.

To the right of FIG. 44 illustrates how the analytics can be moved from the server to the SSD drive, where the CAM NAND can be used for as part of a data analytics system. Now the key value pairs (in this example <year, temperature>) are sent to the data analytics system, with the data being rotated as needed in map phase. The key can be mapped according to the column address. Only the value need be stored, where it can be rotated and stored during a Map phase. The Reduce (or computing) phase is done along the NAND strings. On the Data Analytic System described in this section, the split can be 2 MB/block times 4*16*8 blocks, or 1 GB, for one SSD blade, compared to the 64 MB split of the HDFS block. As discussed in more detail several sections above, data can be duplicated twice for improved accuracy. If the data is spread across multiple die, such as the temperatures spread across two die in this example, a join operation will program the (here) two maxima to the same die and the same bit lines for comparison. The final maxima results can also be sorted out by a microprocessor or top level servers. To prevent errors, a few top max value from each NAND memory can be found first. These few Max values will be fetched out from a ROW (or word line) stored page with ECC correction. These few Max values will be sorted out again on the top flash controller or microprocessor. By being able to use larger splits, the data analytic system will result in fewer merges and less data toggling relative to a server-based implementation.

Figure 45A:
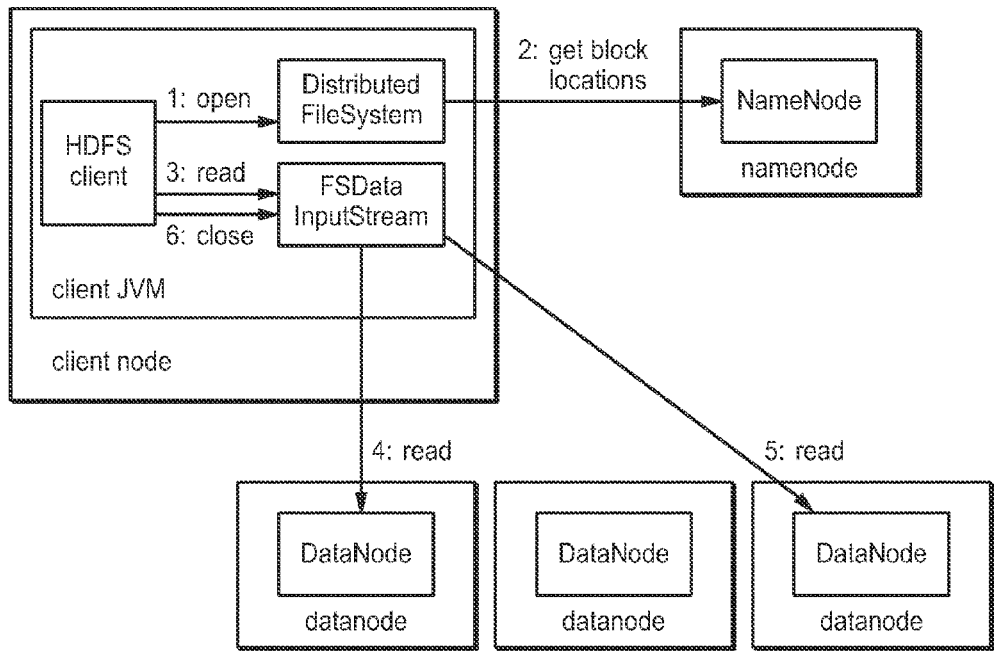
FIG. 45A illustrates a hardware architecture for a Hadoop arrangement and how CAM NAND can be incorporated.
Figure 45B:
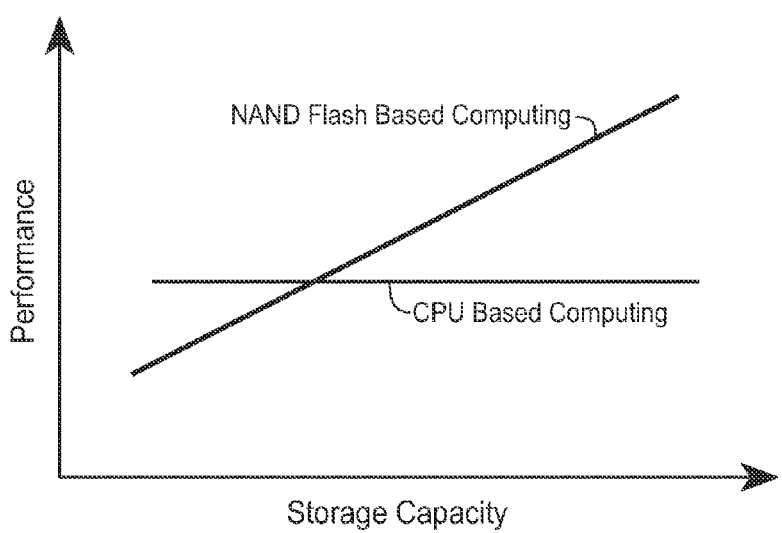
FIG. 45B compares performance versus storage capacity for NAND based computing with CPU based computing.

FIG. 45A illustrate the architecture for a server CPU-based implementation and FIG. 45B compares its performance with that of data analytic system using NAND flash based computing. As shown, as the storage capacity increases, the performance of the NAND based system increases, while that of the CPU based implementation stays flat. As far as integrating the NAND flash based data analytic system, the SSD can be located inside of the data node, where the SSD preferably has the capability to needed data rotation quickly. Server then provides a series of queries to trigger firmware execution to do the needed data re-arrangement and low level NAND commands. The computing SSD can be with compatible top level language, with possible modifications of NOT cutting the jobs to small chunks of 64 MB and skipping the replications by using RAID inside SSD to protect data, so as to be open to systems using HDFS. As HDFS is limited to each Split=64 MB-128 MB of data processing, while NAND based computing can process 8 Giga data sets at a time (1 block/plane/die), this leads to the sort of relative performance shown in FIG. 45B.

Figure 46:
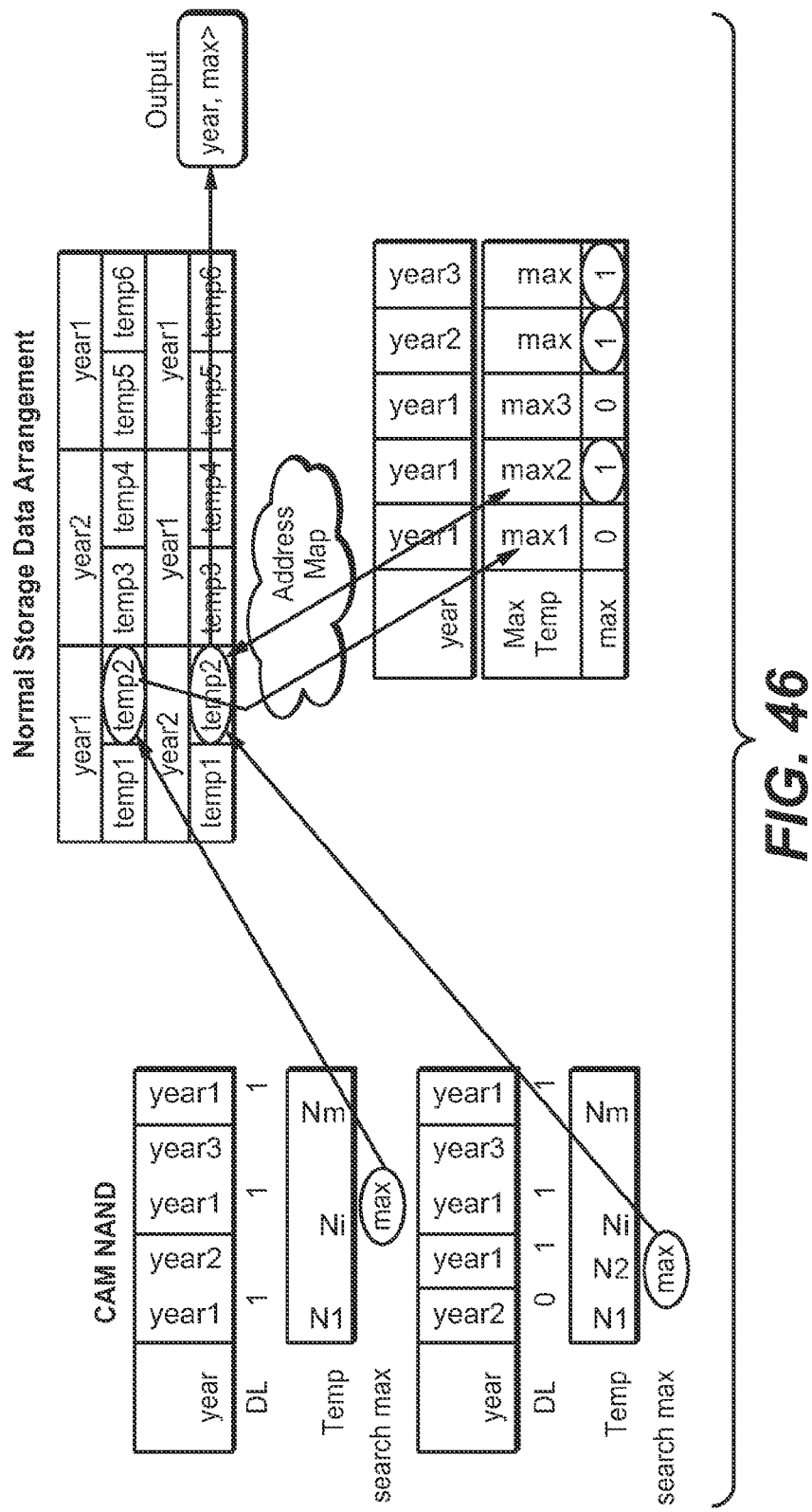
FIG. 46 illustrates the use of CAM NAND memory based analytics for the sort and merge of un-structures data.

The sort and merge process of the data analytic system for un-structured data is looked at in more detail with respect to FIG. 46. On the left of FIG. 46, the year and temperature are saved along the NAND chains for two memory blocks of CAM NAND. This corresponds to the right side of FIG. 44. The CAM NAND array is then used to search for the maximum(s) for each year within each block of data. The columns are then associated with the corresponding original data, at top, center stored with a word line orientation, based on the column location. The maximums from the blocks are collected into another block, where the original data can be fetched from normal storage with ECC protection. This new block (shown center, bottom) with merged maximums from the different blocks of the earlier max operation is linked to original data through the address map. The new block is then searched for the overall maximum for each year and referred back to the address table to provide the final results for outputting the <year, max> result. Another option is to get the intermediate results of Maximums out to the controller or microprocessor to sort out the maxima with high to low orders. The values in this group far from the top group of maxima can be thrown out.

Figure 47:
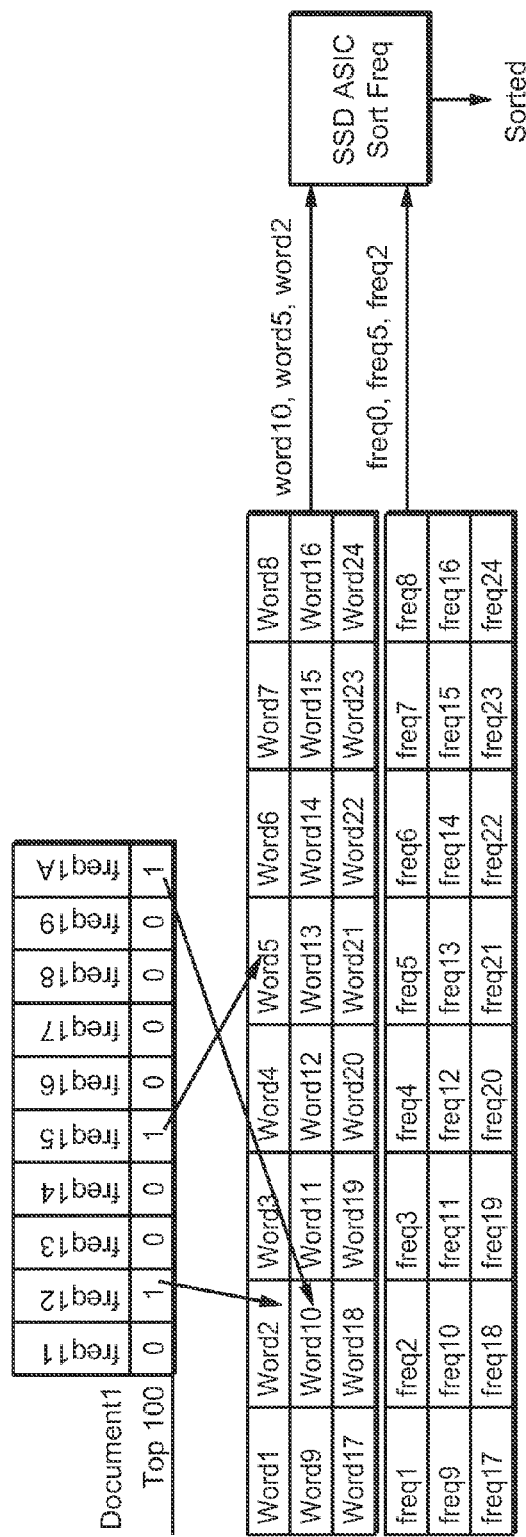
FIG. 47 schematically illustrates an example of when the sort is partially done in the SSD ASIC.

The sort can also partially be done on the SSD controller ASIC. This can be illustrated with respect to FIG. 47. In this example, the search for word frequency, where the sort is done partially on the CAM NAND, using a greater than operation to find the top 100 frequencies. The words and their frequencies are stored in word line oriented pages and the frequencies are mapped vertically in CAM NAND. In the CAM NAND, the frequencies searched for the top 100-300 record of highest frequency for each block. To find the top 100-300, this can be done by shifting the criterion for the >operation until approximately 100-300 frequencies pass, where in practice "100" would be about 100 or somewhat above like 300. (For example, if a criterion yields, say 106 highest frequency, it will typically not be worth refining the search to get this closer to 100.) For extra error protection, it is preferred to margin the read to yield more results, such as 300. For each record, there is a word associated by the column mapping. The CAM NAND can then shift the top 100 records to the SSD ASIC, which can then sort and output the sorted results.

Figures 48, 49:
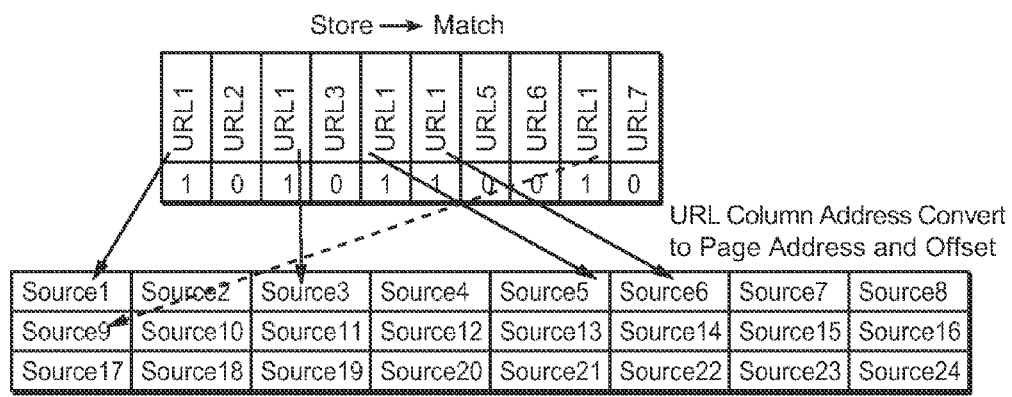
FIGS. 48-54 provides examples of analytic operations performed the CAM NAND based data analytics system.

Several examples will now be looked at in more detail. The first example is a Distributed Grep operation, where Grep is a command-line utility for searching plain-text data sets for lines matching a regular expression. Here, a supplied pattern is searched for. The map function emits a line if it matches a supplied pattern. The reduce function is an identity function that copies the supplied intermediate data to the output. This is illustrated in FIG. 48. If the URL matches the search criteria, the corresponding source is fetched. In a CAM NAND implementation, during the map phase, the patterns are stored the in flash memory along bit lines. These are then searched for a matched pattern. When there is a match (the Reduce phase), the controller can go to the corresponding location of the row oriented data to read out the source content, where the searched key is linked to source content through column address.

Another example is for a count of URL access frequency: The map function processes logs of web page requests and outputs <URL, 1>. The reduce function adds together all values for the same URL and emits a <URL, total count> pair. FIG. 49 illustrates this process for a CAM NAND implementation. During the map phase, the memory stores the patterns (URLs) along the NAND strings. The search is then made for the matched pattern (URL1 in this example). The matched "1"s can then be counted up on the NAND or on the controller for query result. The more precise counting can be done in the way that the matched results will be read out from the corresponding ROW (word line) storage locations and the controller can check the match of these roughly chosen data to be counted, while throwing away the false results. The performance speed-up comes from the reduced amount of data to be counted by the top level controller or servers.

Figure 50:
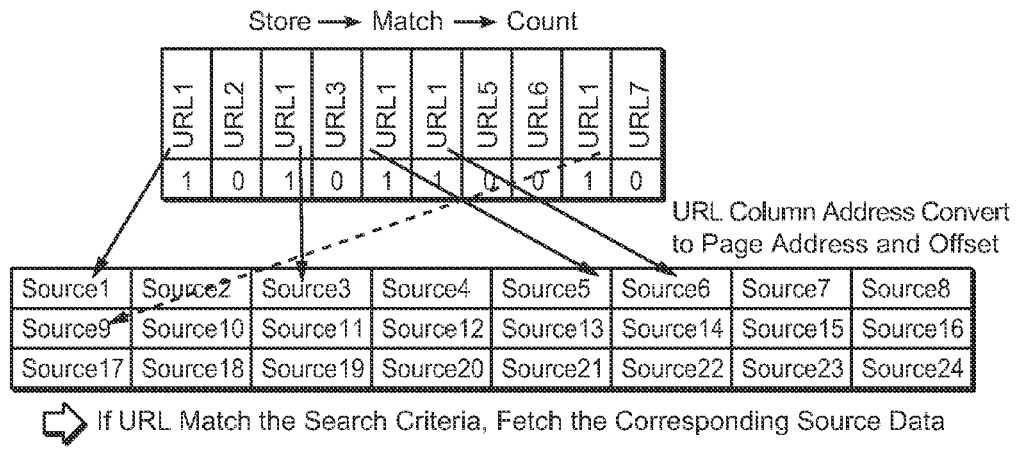

Next is a Reverse Web-Link graph: the map function outputs <target, source> pairs for each link to a target URL found in a page named source. The reduce function concatenates the list of all source URLs associated with a given target URL and emits the pair <target, list(source)>. FIG. 50 illustrates this process for a CAM NAND implementation. As with the last example, during the map phase the memory stores the patterns (URLs) along bit lines in the flash memory. This is then searched for the matching pattern (here URL1). When there is a match in the reduce phase, the memory then foes to the corresponding location of the row oriented memory and reads out the source content. The system then saves all of the source data related to a match to the same location (in this example, source 1, 3, 5, 6, 9), where the searched key is linked through to the source content though the column address as described above.

Figure 51:
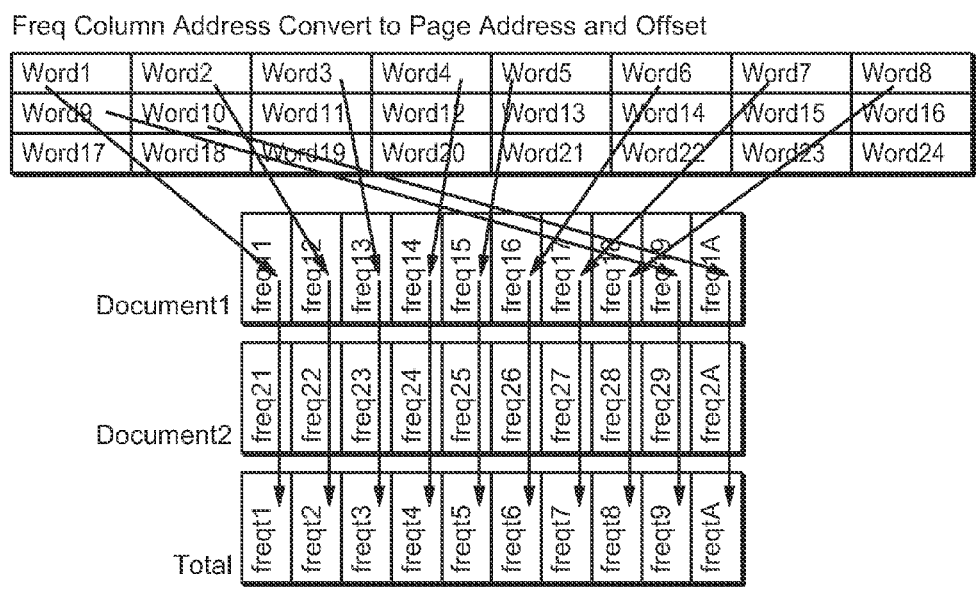

FIG. 51 illustrates the example of a term-vector per host query. In this example, a term vector summarizes the most important words that occur in a document or set of documents as a list of <word, frequency> pairs. The map function emits a <hostname, term vector> pair for each input document, where the hostname is extracted from the URL of the document. The reduce function is then passed all per-document term vectors for a given host. It adds these term vectors together, where it can throw away infrequent terms, and then emits a final <hostname, term vector> pair. For the CAM NAND implementation, during the map phase, the memory stores word frequencies along the NAND strings in flash. The words are saved horizontally along the word lines with frequency by column address versus word line address. The frequencies of occurrence in different documents are saved in different blocks or different sets of word lines. The frequency of occurrence in the different documents are then added and stored in another block of word line address. The final result can streamed out and the data can be rotated back for later access.

Figure 52:
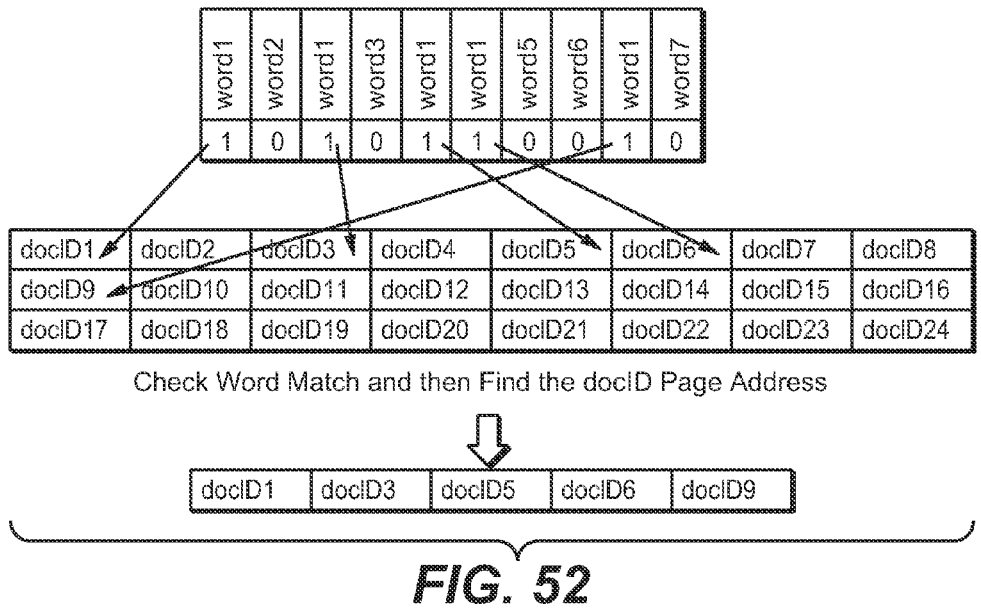

The next example is an inverted index. The map function parses each document and emits a sequence of <word, document ID> pairs. The reduce function accepts all pairs for a given word, sorts the corresponding document IDs, and emits a <word, list(document ID)> pair. The set of all output pairs forms a simple inverted index. It is easy to augment this computation to keep track of word positions. FIG. 52 illustrates this example for a CAM NAND implementation. During the map, words are stored along the NAND strings in flash. The document ID is saved along the word line direction, linked with the words by column address versus word line address. The words can be matched one at a time. The document ID associated with the matched word can be read out according to the matched column address. The associated document ID read out can be saved in another location.

Figure 53:
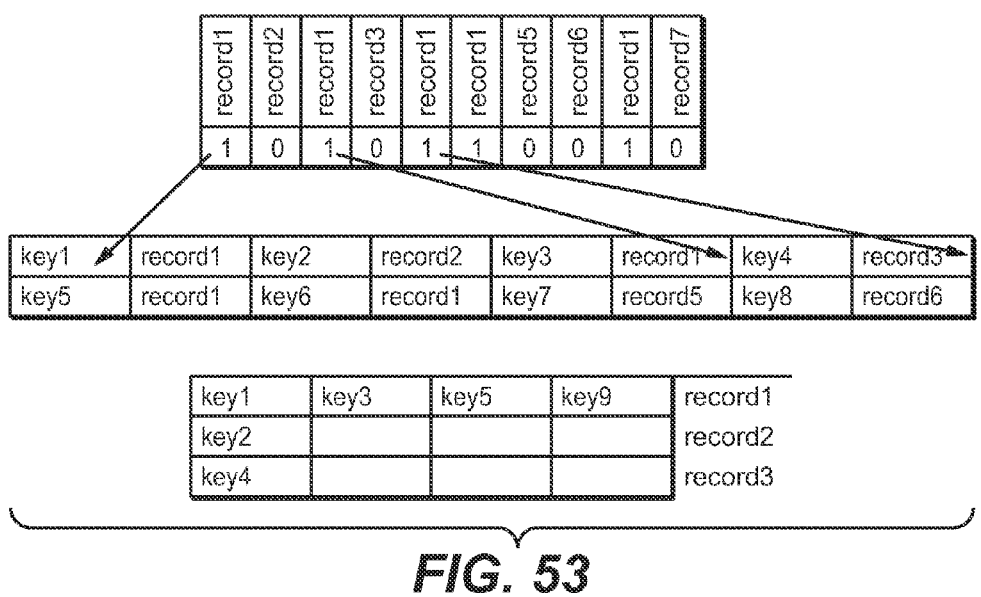

The next example is a distributed sort, as illustrated by FIG. 53. In a distributed sort, the map function extracts the key from each record and emits a <key, record> pair. The reduce function then emits all pairs unchanged. For a CAM NAND implementation, the memory arranges both key and record along the NAND strings in flash. Key-record pair can also be stored along the word line direction, linked to the column address. A search is then done for un-changed <key, record> pairs, which are the read out from the word line stored information. The record can be sorted, with all the keys related to record1 saved together, all the keys related to record2 saved together, and so on. The sort process can be break into the following sub-operations: a) Search the $1^{st}$ record; b) Get the keys for $1^{st}$ record; c) Repeat a)&b) for $2^{nd}$ record, and so on.

Figure 54:
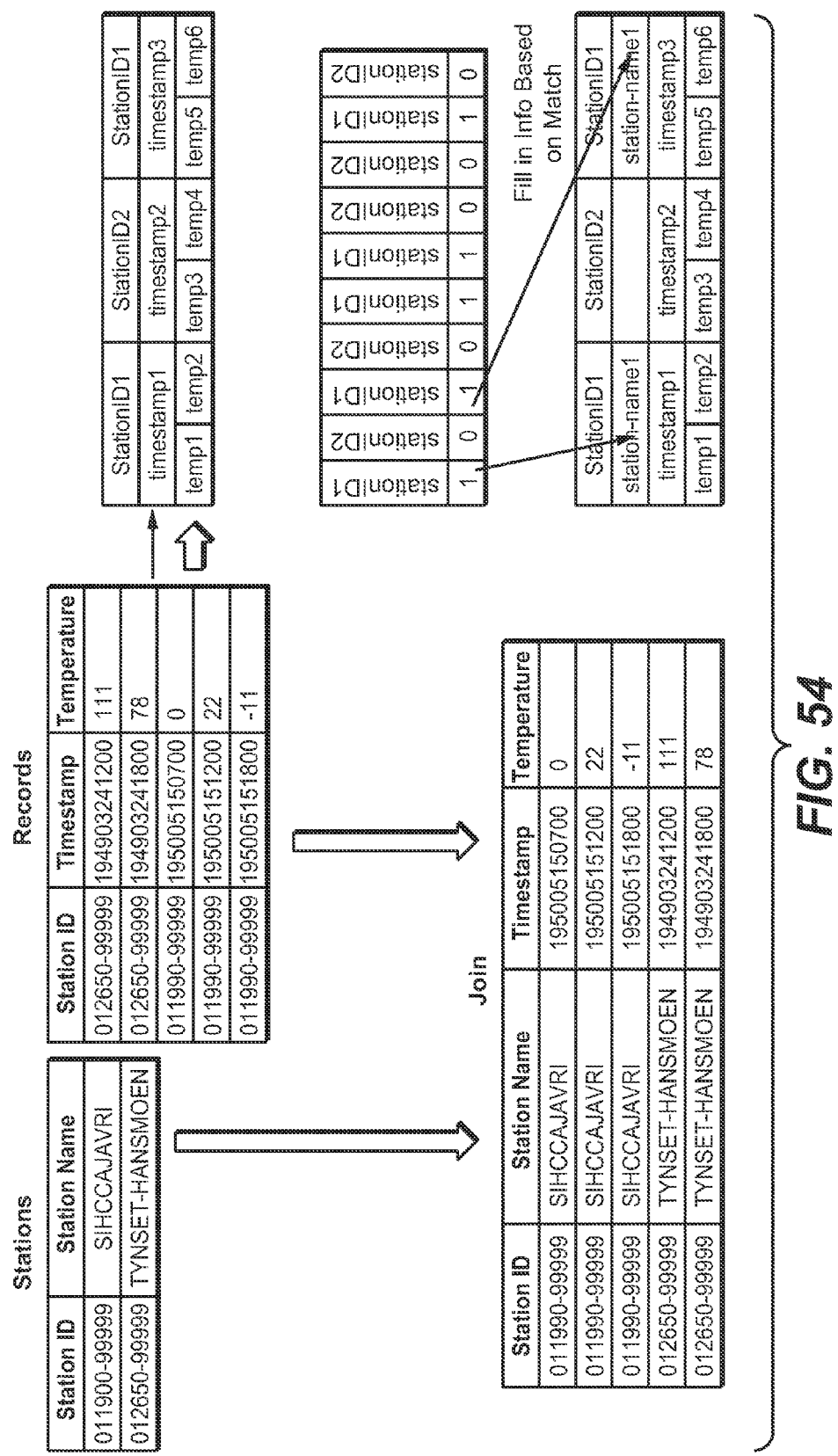

A final example considers the joining of two tables. In this example, the first table matches Station IDs to Station Names. The second table associates the Station IDs with a Timestamp and a Temperature. As shown at the left of FIG. 54, these are to be merged into a single table where the station IDs are matched with Station Names, Timestamp, and Temperature. The right of FIG. 54 illustrates how this can be implemented in CAM NAND. At top right, the data corresponding to the second table is entered in a page based manner. (Note that when entered in along the word lines, these different table entries need not line up on a 1 to 1 basis.) The station IDs, which is the common element between the original two tables, are arranged along the bit lines. The station ID data is stored in a column format. A search for each station ID is done first, all the matched station ID will be read out from the ROW store location for the corresponding station names. The station name will be loaded into the ROW store locations corresponding to the selected station ID in the second table. After each station ID is searched and their corresponding station name is inserted into the second table, the Join operation is finished.

The preceding is developed further in U.S. patent application Ser. No. 13/827,407, filed on Mar. 14, 2013.

OR Function and Full Chip Search Capability

As discussed above, NAND memory has an inherent AND structure for the memory cells along a NAND string as a consequence of their being connected serially along the string. The word lines span the columns of the array, allowing for parallelism exploited in the preceding sections. So far the discussion has only looked at operations on a single such block at a time. (This sort of block (a single NAND string on each column, for all of the columns of the array) is here taken to be the same as the usual erase block of the flash erase structure, but more generally these need not be the same; for example, an erase block could correspond to, say, two adjacent ones or the NAND strings along each column.) An array typically has a large of such backs, with their corresponding NAND strings connected along common columns or bit lines. This results in an inherent OR structure between the different NAND blocks on the same global bit line. This combination of a NAND/AND function within each NAND string in one block and an OR function between the different strings in different blocks along the same column can be exploited to perform a large variety of operations, extending what has already been presented. Such a multi-block sensing operation would not be sensible for normal, single cell per bit line read operations that operate on only a single block at a time and, even if there were, it would likely draw prohibitive amounts of current; however, in the sort of CAM-type operations considered here, usually only a small number of matching NAND strings conduct, making the power consumption manageable.

Figure 55:
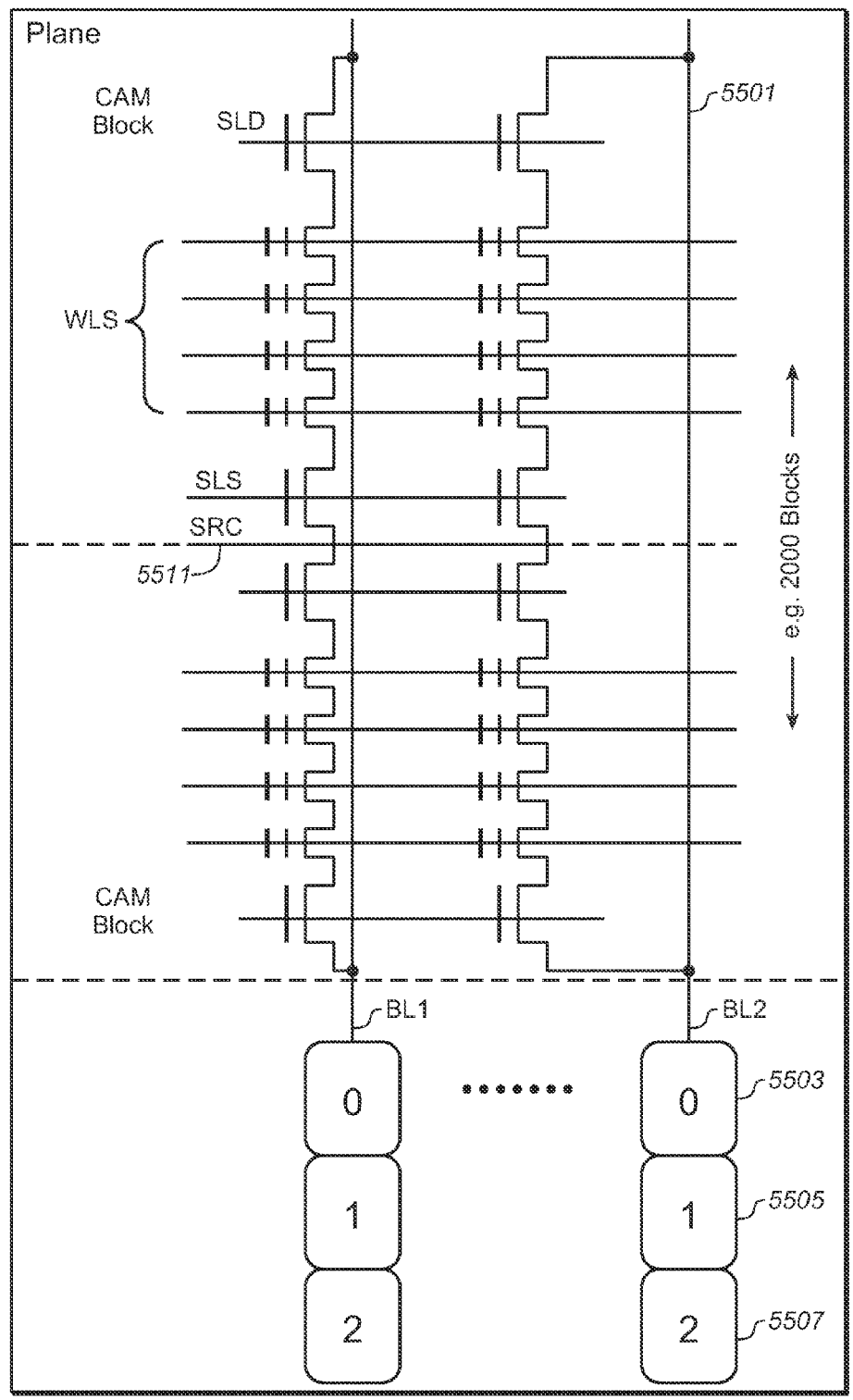
FIG. 55 illustrates the OR function and how this can be used to add functionality to the CAM NAND structure and enable whole chip search functions.

FIG. 55 can be used to illustrate the OR function and how this can be used to add functionality to the CAM NAND structure and enable whole chip search functions. FIG. 55 shows a portion of a NAND array, specifically two NAND string along each of two bit lines BL1 and BL2. For the exemplary structure, on bit line BL2 5501, a top NAND string is connected to the bit line at its top end and connected to source line SRC 5511. In between, four cells are shown connected between the select gates. The lower NAND string is similarly arranged, but upside down. When a corresponding data patterns is applied to the two NAND string, if either one (or both) conducts in response, the sense amps associated with the bit line will detect this, providing the OR functionality between the two NAND strings. The result can then be stored in one or more of the latches 5503, 5505, or 5507. The multiple (here 3) latches can be used to store and perform logical/arithmetical operations between the results of different queries.

FIG. 55 just showed a small portion of a single array. An exemplary system could store upwards of 128,000 index/key items per block, where each block could have 128 word line per block for a maximum index length of 16 Bytes. If data is stored twice or in complementary pairs on a string, this corresponds to a 64 bit index. In an SSD based embodiment, an array can have on the order of 2000 blocks per plane, with 2-4 planes per chip, 8-16 chips/Each flash controller, and 128 chips for one SSD.

A specific key can be searched across multiple dice in an SSD drive. In regular operations, only one block per plane will be searched at a time. An alternate mode can be implemented to search the same key throughout multiple or all blocks of a plane by enabling multiple or even all the blocks in one chip. All or part of the blocks in one chip can be searched with same pattern simultaneously. The matching NAND strings will turn on while the non-matching NAND string will be off. One bit line may be connected to 2000 blocks. One match along any bit line will make the corresponding global bit line conduct, since all the search results in all the blocks are OR-ed together. A single match in the plane as a whole will make a bit line conducting. The sensed result can be stored in the massive register structures adjacent to the memory array. As discussed above, each, NAND string within a block has a (N)AND function, and the NAND strings between blocks have OR functions without performing the logic operations from the data registers. In FIG. 55, there are three memory registers 0 5503, 1 5505, and 2 5507. Each register can contain one search or query. Multiple search or queries can be stored into one register or multiple registers. Multiple queries can be combined in the 3 registers with functions such as (N)OR, (N)AND, or (N)XOR operations between the queries.

FIG. 56 illustrates an example of doing a full chip search simultaneously applying the same search key to all blocks. This can determine whether any of the NAND strings within any of the blocks have the searched for pattern. In this example, only one search result is found in all the blocks simultaneously searched.

If one of the bit lines is found to conduct, the block to which a conducting NAND string belongs can be determined by a binary search, for example. This is illustrated with respect to FIG. 57. Initially, as shown in the left-most column, blocks 0 to N can be sensed all in one sensing. If there is a match, a binary search can be performed to select ½ the number of blocks to see if the match is in this half. This is shown by the shading of the top half of the block in the second column. This can then be narrowed into the ¼, ⅛ ¹⁄₁₆, and so on until the match block is found. Consequently, instead of searching through the, say, N=1024 blocks of an array one by one, the binary search will only need to sense 10 times ($\log_2 N$) times to identify which one block which has a match. In the case of a low (i.e. <1%) probability of matching, this can save time by using binary search by selecting multiple blocks. In the case of higher (i.e. >1%) of probability of matching, searching one block at a time may have better searching time. In the binary search case, each plane within a chip can be searched separately to avoid the complexity. All block searching or single block searching can be performed with multiple planes simultaneously to gain performance.

FIG. 58 illustrates an example of using the inherent OR functionality between different searches. A first attribute (X) is loaded in a first block and a second (Y) attribute is loaded into a second block. The two blocks are then biased according to the respective search patterns. The "0"s and "1"s represent which of the individual NAND string conduct in response to the applied pattern. The result as seen at the sense amp's registers is then the OR of these two queries is shown at the bottom row and can be latched for use in additional operations, if desired.

Figure 59:
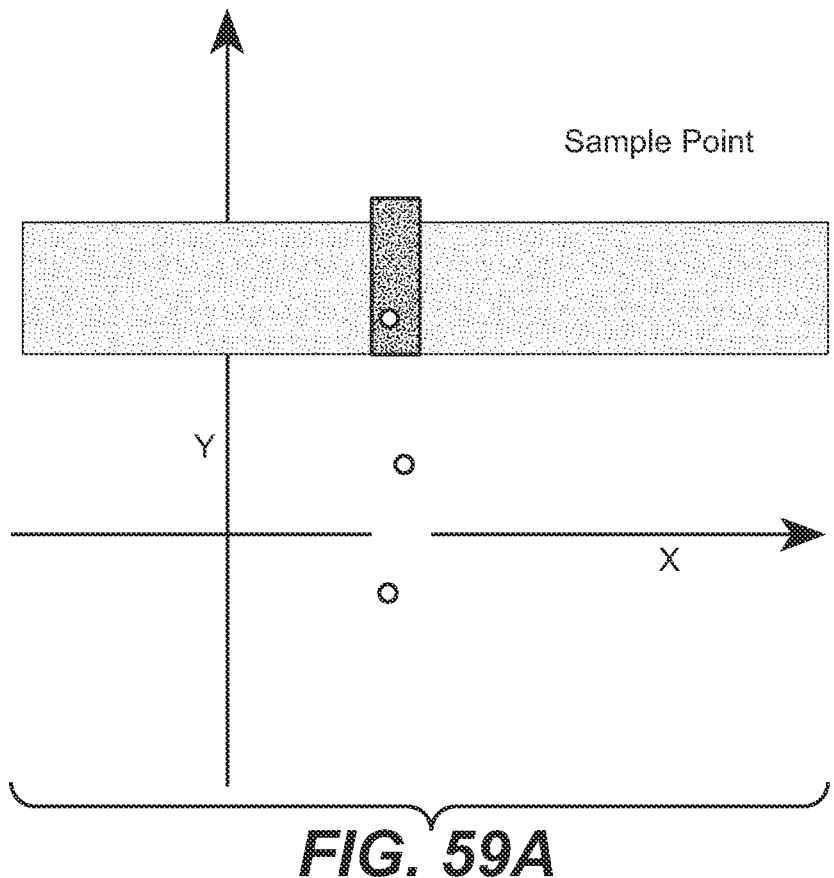
FIGS. 59A and 59B illustrate an example of doing a JOIN using AND function between data registers.

FIGS. 59A and 59B illustrate an example of doing a JOIN using AND function between data registers. FIG. 59A illustrates the data space, where the X and Y are the location coordinates of certain restaurant, for example. In the traditional search algorithm, large amount of data will go to CPU to be filtered for selected X range first. The resulted result will still be a large amount of data. The data that fall within the selected X range will be transferred to CPU again to search the data fall into Y range. The final resulted data could be small, but a large amount of data has to be processed. Instead, here the (X,Y) values serve as attributes in the same table: X and Y are the two columns of the same table. The CAM NAND will store the data in the corresponding bit lines, storing both X and Y attributes according to the table row and column address. A range search on Table X can yield large number of elements, and the range search on Table Y can also yield large number of elements. X, Y share same primary key and can be AND-ed together in CAM NAND in order to give the AND results to find, in this example, the restaurants. By using the CAM NAND architecture, the large amount of data need not to be transferred to CPU to sort out.

Figure 60:
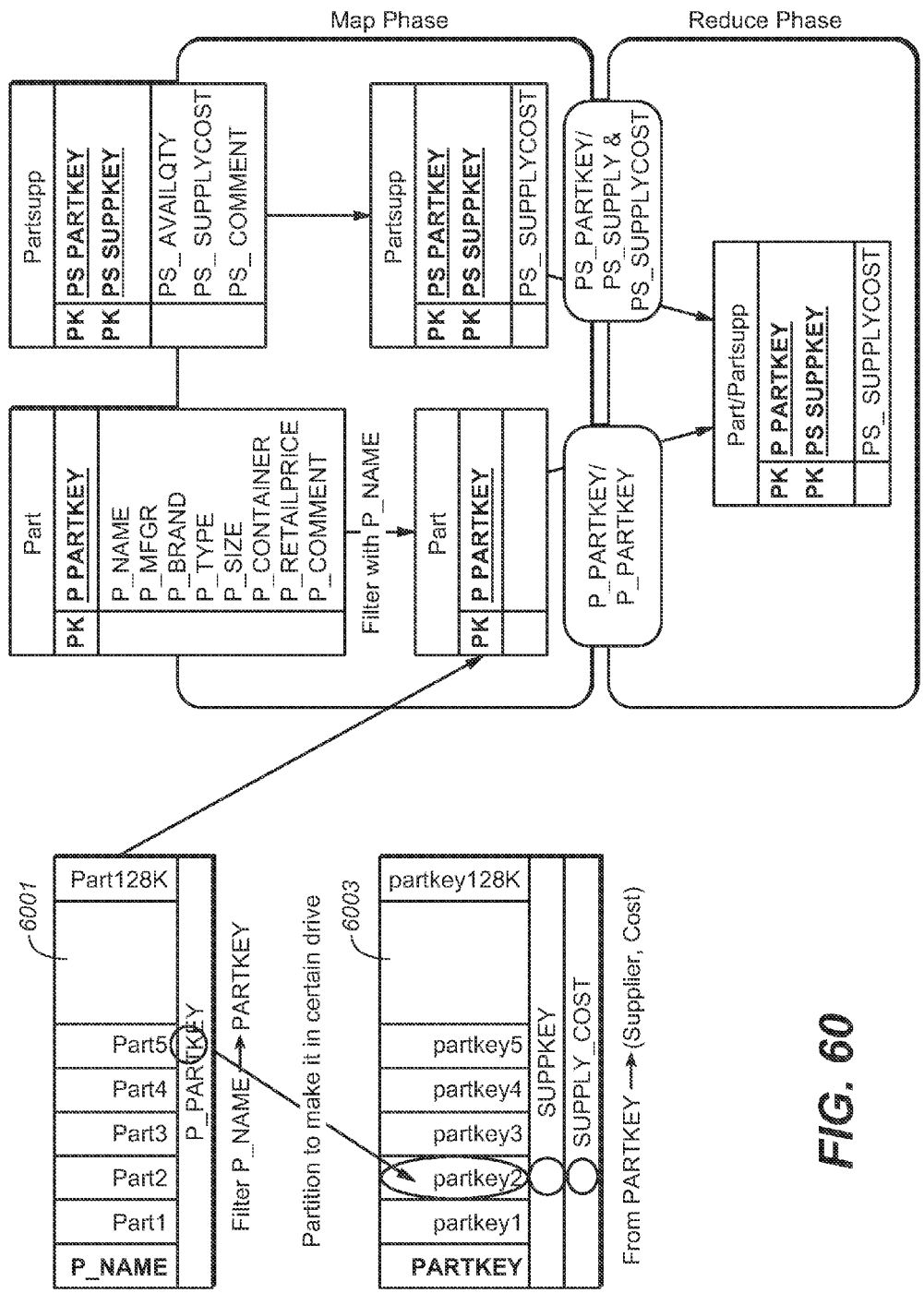
FIG. 60 shows an example of a JOIN operation.

In the preceding section, a JOIN operation was described with respect to FIG. 44. FIG. 60 looks at another JOIN example, here from a TPC-H Benchmark, where one table (6001, top on left) is used to find a part key (PARTKEY) from the part's name (P_NAME) and another table (6003, bottom on left is used to fine the supplier and cost associated with the part key. The map and reduce phases for the data structure are illustrated on the right for a prior art implementation. Perform the JOIN in the CAM NAND can begin by arranging the part names in the CAM NAND while the PARTKEY is arranged in the associated block in a fixed mapping to the column address of the P-NAME, as illustrated at top left. A search is performed on the part table 6001 to find the part name being sought. From the part name, the corresponding PARTKEY is allocated in corresponding data store block. The other table, 6003, from Supply Key will arrange the PARTKEY in the CAM NAND oriented along the bit lines. Then a search is performed on this table on all of the PARTKEY results (found in the first table, 6001) to allocate all the SUPPKEY and SUPPLY_COST in the corresponding data store blocks. In this way, the CAM NAND JOIN operation is performed by the first table (6001) search results becoming the search objects for the second table (6003) search.

Figures 61, 62, 63:
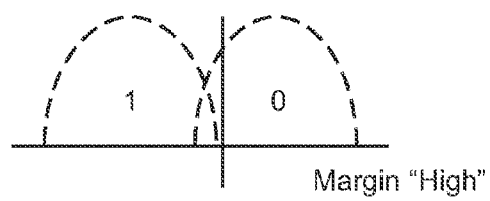
FIG. 61 illustrates two blocks of NAND memory, with a set of data written in the first block and the inverse of the data written in the second block.
FIG. 62 looks at the possible set of results from sensing operation on the data arrangement of FIG. 61.
FIG. 63 illustrates a shift in the read levels that can be used for the data/data bar arrangement.

The use of multi-block operations can be used along with differential data to improve error protection for CAM NAND type operations. FIG. 61 illustrates two blocks of NAND memory, with a set of data written in the first block (block N) and the inverse of the data written along the bit lines of a second block (block M). Here the sought for data pattern is illustrated on the bit line with D7, with other example shown on some to the other bit lines. The SA line illustrates the result of a sensing operation for the block in response to an applied data pattern. The search for the NAND strings with possible matches can be done by first sensing data in block N and storing the result into register 1. This is shown in block N where the search pattern of high and low word line levels shown at left corresponds to the search pattern. An operation is also done to sense the inverse data (data bar) block M, with the results put into register 2. The possible sets of these results is shown in FIG. 62, where possible register 1 (Data) and register 2 (Data Bar) values are respectively shown on the first and second lines. The memory can then perform a logic operations between these two registers and put the result SA(Data) AND SA(Data Bar) into another register for showing any absolute matches.

For the data/data bar arrangement, to reduce the chance of missing positive results, the read levels can be shifted slightly. This is illustrated in FIG. 63, where the distributions of the "1" and "0" states are shown. The read point is margined high. Although this may pick up some false positive results, any matches can be followed up by checking with copies stored with the metadata.

Figures 64, 65, 66:
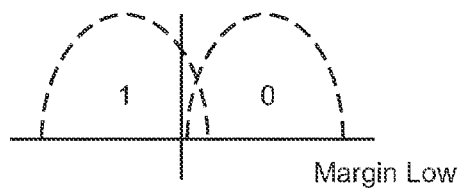
FIG. 64 shows the writing of duplicated data into two different blocks.
FIG. 65 illustrates a shift in the read levels that can be used for the duplicated data arrangement.
FIG. 66 illustrate the conditions under which a memory is verified during a write operation.

For improved error protection, duplicated data can be written into two different blocks, so that will still be good copy should the other one have an error. This is illustrated in FIG. 64 where the same data pattern is stored along each bit line in both of blocks M and N. In this same data arrangement, the pure pattern all "1" should be avoided, as such a bit line will conduct regardless of the search pattern that is applied. (For instance, any unused bit lines should have some sort of dummy data written in, rather than be left in an erased state, or a specified bit could be programmed to indicate an unused and otherwise eased NAND string.) In the range search, addition and other operations described in earlier sections, the data in two separate blocks with same data can be simultaneously sensed at the same time. If either of them is conducting, it is counted as conducting, which can increase the chance to get correct results or reduce the error rate. All the comparing and calculating is based on the fact one of the data is conducting to judge the data. The duplicated data in separate block is suitable for the range search case where the search is done based on single word line sensing results.

In the case of the duplicate data arrangement, the sense margin for searching can be shifted low, to favor the "0", or non-conducting, situation. This is illustrated in FIG. 65. The erased cell "1" blocked by the sensing margin will have the chance to be conducting in the duplicate block, where the use of two blocks can help the likelihood that at least one of the blocks with a "1" will have a "1" as a result. This principle can also be applied to multi-level memories with 2 or more bits per cell.

Word Line to Word Line Effects and Data Arrangements

Under normal memory operations, only a single word line is sensed at a time. In a NAND type memory, in order to sense the selected word line, whether for a read or program verify, the other word lines spanning the NAND string with the selected word line are biased sufficiently highly so that they will conduct independently of their data state. Due to capacitive coupling between word lines to adjacent floating gates, the level set on adjacent word lines will affect the level on the selected word line, consequently affecting the result of the sensing operation. During a write operation, only the single selected word line is biased for sensing with the other word lines of the NAND string biased to pass independently of the data. Under the various sorts of CAM NAND operation described above, multiple word lines are often set to data dependent levels, so that one or more word lines have their adjacent word lines biased differently than was used when the word lines were programmed. Consequently, the word line to word line coupling can lead to errors in the multiple word line sensing operation used in the various operations described above.

FIGS. 66 and 67 can help to illustrate this situation. FIG. 66 illustrate the conditions under which a memory is verified during a write operation and under which it will read accurately without margin loss. In FIG. 66, the selected word line is in the middle with being sensed with a "0" or low voltage word line. The adjacent, non-selected word lines are both biased to HI or VREAD with a data indicated by "X" and this is normal sensing condition.

FIG. 67 illustrate the situation when multiple word lines simultaneously have data dependent values applied. The leftmost column corresponds to a search key of "1" and "0" values, which then shown having corresponding biased voltage into Low and Hi voltage levels for multiple word line sensing. A normal read margin will occur if both adjacent word lines are high, but if either adjacent word line is biased with low, the result will be shifted; and if both adjacent word lines are low, the shift will be compounded. This is shown in FIG. 67 where almost all of the level have SHIFT UP due to an adjacent Low word line and for the Low a little over half-way down there is a SHIFT UP UP as both adjacent word lines are biased low. This problem can be dealt with in various, such as programming the memory with greater separation between states or using neighbor dependent bias conditions, but one way to is to scatter the index data and avoid programming the index in the adjacent neighbors in which data dependent levels are avoided on adjacent word lines. For example, the sensing in a block can be split in an even word line and an odd word line sensing, where the word lines of the non-selected half are biased to Vread, the passing voltage, uniformly. One set of indices can be programmed on even word lines and another (or another segment of) index can be programmed on the odd word lines.

FIG. 68 looks at this avoiding of the distribution shift up due to adjacent word line voltage bias and re-arrange the inverted data. In FIG. 68, the 1st and 2nd columns are for two sets of words line along the same set of NAND strings and correspond to the first and second sensing operations: word lines 0, 2, 4, . . . can be biased with a data dependent the corresponding portion of the search key, while the word lines 1, 3, 5, . . . are set to non-selected word line value; and then the roles are swapped for the second sensing. Under such an arrangement, it may be preferable to rearrange how the data is stored along the bit line. For instance, if the data is stored along with its inverse in data/data bar pairs along the NAND string with the pattern on even word lines and the other index data with inverted data on an adjacent word line, the first sense would use the search key on the even word lines and the second sensing would use the another key on the odd word lines. If instead it is desired that a subset of the pattern and the inverse of the subset are checked at the same time, the data could be arranged as shown in FIG. 68 were the data bits are paired up in both the first and second subsets. Some details of these manipulations are discussed with respect to the next several figures.

FIG. 69 looks at some of the steps of data manipulations for 64 bits index that is to be stored as data/data bar. The data comes in to the memory system and rotated from a horizontal format to vertical format in DRAM or other memory, as discussed above. Before sending the pages to the memory chip for writing into the array, the order can be arranged. For example, here the data is split into two halves, so that the even word lines hold the first 32 bits and the odd word lines hold the second half of the patterns, allowing programming of the memory in the physical order of the index. The memory device can generate the inverted data (data bar) and insert the inverted data internally during program. The memory device can hold a pair alternating pages of data, such as index 0 and index 32, to be programmed into array, then invert the data and program into flash again, so that the controller only need to map half of the block space for data.

Under this arrangement, the index data will be divided into a first half and a second half, or, more generally, into many segments. These segments can be searched in sequence. On the far right of FIG. 69, the data is un-shaded and the data bar is shaded in gray. Here the segments shown are interleaved. During the first segment sensing using multiple word lines (such as 24 to 128), the second segment will be all biased to the data independent passing voltage Vread to avoid the word line to word line effects altering the results. If the first segment showed matching results, then the second segment can be sensed. When the second segment is searched with multiple word line sensing, the first segment will be biased with Vread.

Figures 70, 71, 72:
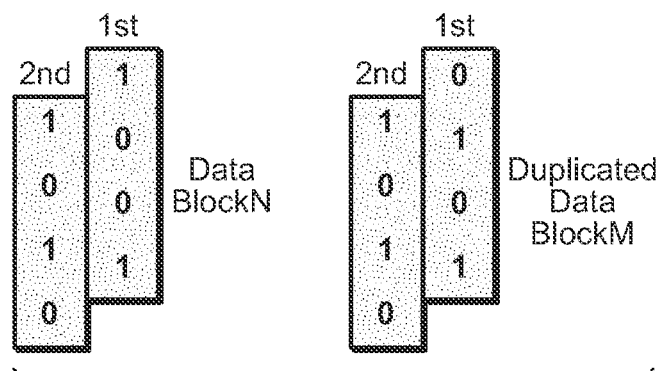
FIG. 70 illustrates the effects of word line to word line coupling with duplicated data arranged in different block.
FIG. 71 illustrates multi-block sensing example.
FIG. 72 is a table to illustrate the OR-ing of read results with duplicate data.
Figure 73:
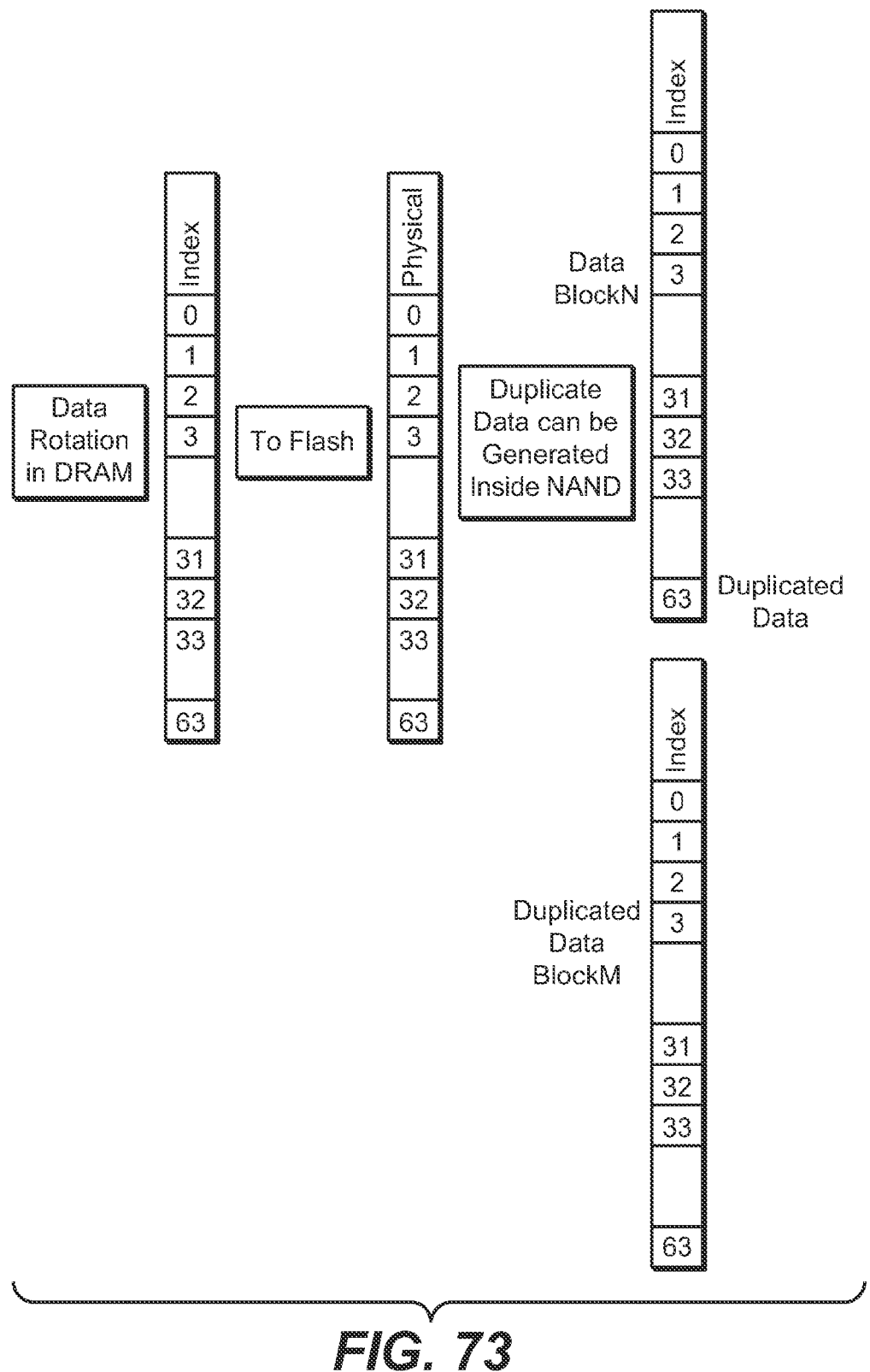
FIG. 73 illustrates some of the steps of data manipulations for 64 bits index that is to be stored as duplicated data.

The effects of word line to word line coupling with data arranged in different block can be illustrated with respect to FIG. 70, showing the word line bias when the memory has data in the different blocks. As before, an adjacent low word line results in a shift of the word line's level. To ameliorate this effect, the word lines can be split into non-adjacent subsets and the corresponding partial keys or indices applied sequentially. For example, in the multiple block data search case, the first segment data and second segment data are interleaved in block N. A multiple block sensing can OR all of the first segment index search results together. The first segment search result can be confirmed first before proceeding to the second segment multiple block sensing.

FIG. 71 looks at a multiple block example, In a first sensing operation, the even word lines of multiple blocks are selected, followed by a second sensing where the odd word lines are selected. In both cases the non-selected word lines are biased with the by-pass voltage Vread.

Returning to FIG. 19, this looks at an example of a range search operation with duplicated data error protection, for identifying a number which is >010011001. To reduce the error rates for these sorts of operations, the memory can use complementary data in the same block or the duplicated data in different block scheme. In the range search case, only one wordline is sensed per block at the same time. For example in the duplicated data case, the sensing margin need to be margined as FIG. 65 with a low margining so that "0" can be accurately detected.

The table of FIG. 72 illustrates the case where the "1" cell has error in one block, since the other block duplicated data is very likely is "1", the two block sensing result will be "OR" together to generate the correct results. This is shown in the first column where one of the sensing may either yield a "1" or, due to error, a "0", but the sense sensing correctly gives a "1" and, where OR-ed together, a correct (C) result. When both sensings give a "0", a not correct (NC) will result.

When the data is stored with duplication, this can be done in adjacent pairs of blocks. If some bits have error, the duplicated data with OR will generate a result with less chance of error. Since the operation of read is done one bit at a time during the range search, the system can arrange the data of the paired word lines in an adjacent blocks so that there will not be any word line to word line effects as described with respect to FIG. 70. For example, in a range search, the most significant bit (MSB) is sensed first. A 4 digit number has the MSB of 1000. The number 1000 can be arranged along the NAND string in block N and block M. This data arrangement will avoid the data shift due to a neighboring word line's voltage bias effect. The rest of word lines in the two blocks will be biased to the passing voltage Vread.

Figures 74, 75:
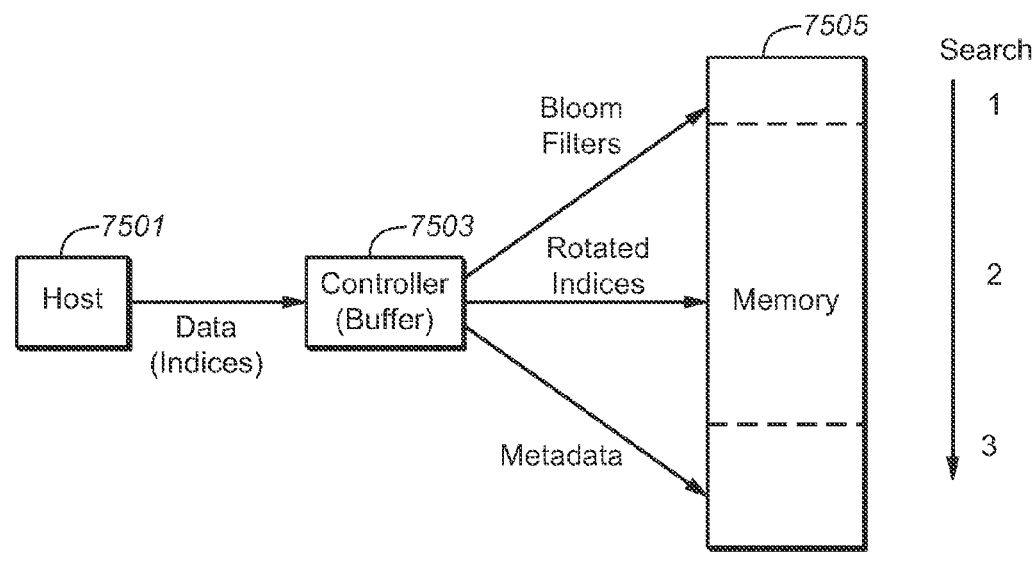
FIG. 74 summarizes some of the different cases of multiple word line/multiple block sensing.
FIG. 75 is a schematic representation of including a bloom filter to improve error protection.

The steps of data manipulations for, in this example, 64 bits of data in the duplicated data case can corresponding to the data/data bar version of FIG. 69, but with duplicate data instead of an inverted copy. The memory chip can hold two pages of data, such as index 0 and index 32, and program them into the array a first time and then program the same pair into array again. Alternately, in the case the interleaving can be skipped and the duplicate can be written on another block, with the duplication again carried on the memory. The result is then as is shown in FIG. 74, where the data is rotated, transferred to the memory device, and then duplicated there. As many of the application of the duplicated data example, such as range searching, will not be concurrently applying data dependent levels on adjacent, the neighboring word line effect will not cause problems as described above; consequently, the sort of interleaving or shuffling illustrated in the middle of FIG. 69 can be skipped here.

FIG. 75 summarizes some of the different cases. In the single sense case for range search of the top two rows, the same data can preferably be arranged in different block, each with one word line (1 WL) sensed. In the exact match cases for an index or key, data and data bar should be arranged in the same block, with voltage biased in the even multiple word line sensing or odd multiple word line sensing. The data can also be arranged in the separate blocks, but the sensing has to be done in two separate steps.

Use of Bloom Filters to Improve Error Protection

As discussed at several points above, the CAM NAND and other operations considered above are not readily protected by standard ECC techniques and other need to be used. This section looks at the use of bloom filters to provide an additional layer of error protection. Bloom filters are discussed above and developed further in U.S. patent application Ser. Nos. 13/827,609.

A bloom filter is formed from a group of data elements. A checking of a data element against the bloom filter can then be used to determine whether that element is a member, or likely to be a member, of the group. The structure of bloom filters allows for the possibility of false positives, but not false negatives, where the likelihood of false positives tends to decrease with the size of the filter and to increase with, the number of elements from with the filter is formed. Consequently, in addition to checking for an exact match of a search key among stored keys, an initial check with the search key can be done on a bloom filter to determine if the object key is likely to be present. If a positive result is found, the search can continue for a match by applying the search key along the word lines and seeing whether any NAND strings conduct in response. If a match is not found, this can either be because the bloom filter yielded a false positive, or because the key should be present, but cannot be found because of error. If the memory has duplicate copies of the keys, such as in the metadata where it can be protected by ECC, this can be checked to determine whether the key is actually present or whether the bloom filter check yielded a false positive. This use of a bloom filter as additional error protection mechanism is complimentary to, and can be combined with, the various other mechanisms described in the preceding sections, such as data duplication, redundancy bits, and so on.

To implement the bloom filter arrangement, a set of keys or indices will written into the memory as before, a corresponding bloom filter or filters will also be written into the memory, and the keys can also be written with the meta-data on the memory to provide a duplicate copy that can be ECC protected. These three parts (indices, duplicates, bloom filter generated form the indices) can variously be stored on different memory chips, on the same chip, or within the same array on a chip. In an exemplary embodiment, each memory chip can have its own bloom filter section where a set of bloom filters formed from the indices stored along NAND strings on the chip. The bloom filers can either have a vertical orientation, as described further in U.S. patent application Ser. No. 13/827,609, or a horizontal orientation. For example, each block of indices can have a corresponding bloom filter with ECC protection written along a word line of a block of bloom filters.

FIG. 75 is a schematic representation of the arrangement. A host 7501, such as a PC or server, provides the data, which can include the indices or keys. At block 7503, typically implemented on the controller, the indices can be stored in a buffer memory and rotated to have vertical orientation before being sent out as pages for programming into a memory array. This part of the process is basically equivalent to that discussed above with respect to FIG. 13. Bloom filters are also generated from the indices; for example, all the indices to be stored in a single block could be used to form a single bloom filter configured to be written onto a single word line, where the controller could also generate ECC for the bloom filter and form a corresponding write page. Copies of the keys, protected with ECC, can also be stored along with the metadata as sent over to the memory.

The memory space on the memory chip can be conceptually be split up to include the blocks in which the indices are stored along the NAND strings; a portion in which the bloom filters are stored, such as one or more blocks (depending on the number of such filters) set aside for this purpose; and an area for the metadata. A flow for searching the indices is then shown to the right of FIG. 76. When searching for an index, the search key can initially be checked against the bloom filter. A positive result indicates that the sought for index is in the memory, although there is the possibility of a false positive. The bloom filter positive for the search key will not give the location of sought for index, but the positive result will correspond (for non-false positive) to the set of indices from which it is generated. Consequently, if, for example, each bloom filter corresponds to block of indices, only a block whose filter yields a positive result will need to be checked. Consequently, the bloom filter results can also be used to reduce the amount of searching, if desired. When the bloom filter result indicates that the memory has the index in the chip, but the index search cannot find it, then the system can go through the meta data (which in this example includes the index and pointer) one by one to find the match index. If the bloom filter result was a false positive, then this search will also come up empty, while if the regular search was a false negative due to error, this provides a way to still extract the sought for index. As noted above, even if the regular search comes up with a result, it may be useful to double check the result against the metadata.

If the missing index is found in the metadata, it is likely the original version is corrupted. The good copy of the index can be duplicated in a new location and the bloom filter can be updated to eliminate the index's previous contribution to the bloom filter. With respect to updating the bloom filter, as a bloom filter is sparse in "0" values, the system can re-program the same word line for the update. As noted, a horizontal bloom filter is here preferred as it more easily allows for ECC protections, but the parity area is not readily updated in this way, in which case it may be preferable to re-compute the ECC parity from the controller and reprogram the result to another word line. In another embodiment, bloom filter is not implemented. Only index block and meta-data blocks are arranged. To reduce index block error, the new program scheme shown below can be used. The index block can also be replicated in a few different blocks to reduce error. All the replicated index blocks can be linked to same meta-block by address calculation.

Program Flow to Improve Error Protection

Instead of, or in addition to, improving error protection during the sensing operations, this section looks at an additional technique for increasing error protection on the programming side. As before, this can be combined with one or more of the other data protection techniques (bloom filter, storing a copy in meta-data, margining in sensing operations, storing multiple (2 or 3) copies of data, and so on) already presented.

To provide more data protection, a post-write read of the data is performed. Unlike the typical version of the this process, where the intention is to find incorrectly programmed pages of data, the process here is directed at find those NAND strings that have one or more incorrectly programmed bits along them. More accurately, it is to locate those keys or indices that are incorrectly written along bit lines: If the keys/indices runs over several NAND strings, these can be checked a block at a time; while if the indices are less than a NAND string in length (such as 32 bits long so that two keys fit on each of 64 bit NAND strings), the indices can be checked once written in (as the half-block stage in the 32/64 bit example). In the following discussion, the length of the indices will be taken to that of the NAND strings in a block.

Consequently, to provide more data protection on the program side, after the indices are written into a block, the memory reads back the word lines one by one. These are compared with the original data inside the NAND to see whether the memory has and mis-programmed bits. Mis-programmed bits will be accumulated (OR-ed along each column) among all or some of the word lines to determine which, if any, NAND strings will result in an error when sensed. These mis-programmed indices can be identified with their column address and IO address. The mis-programmed indices can then be appended to the next index block to be programmed in another block. Their associated meta data can also be appended to the next index block meta-data area. Only the blocks storing indices/keys are programmed in the way, due to the way in which they are sensed and in that they lack ECC protection in the vertical direction, and when an error is found the index can then be reprogrammed. The meta data block can be programmed in conventional way, where a read can also be performed after the program to check if the FCC protected page data can correctly be read out.

Figure 76A:
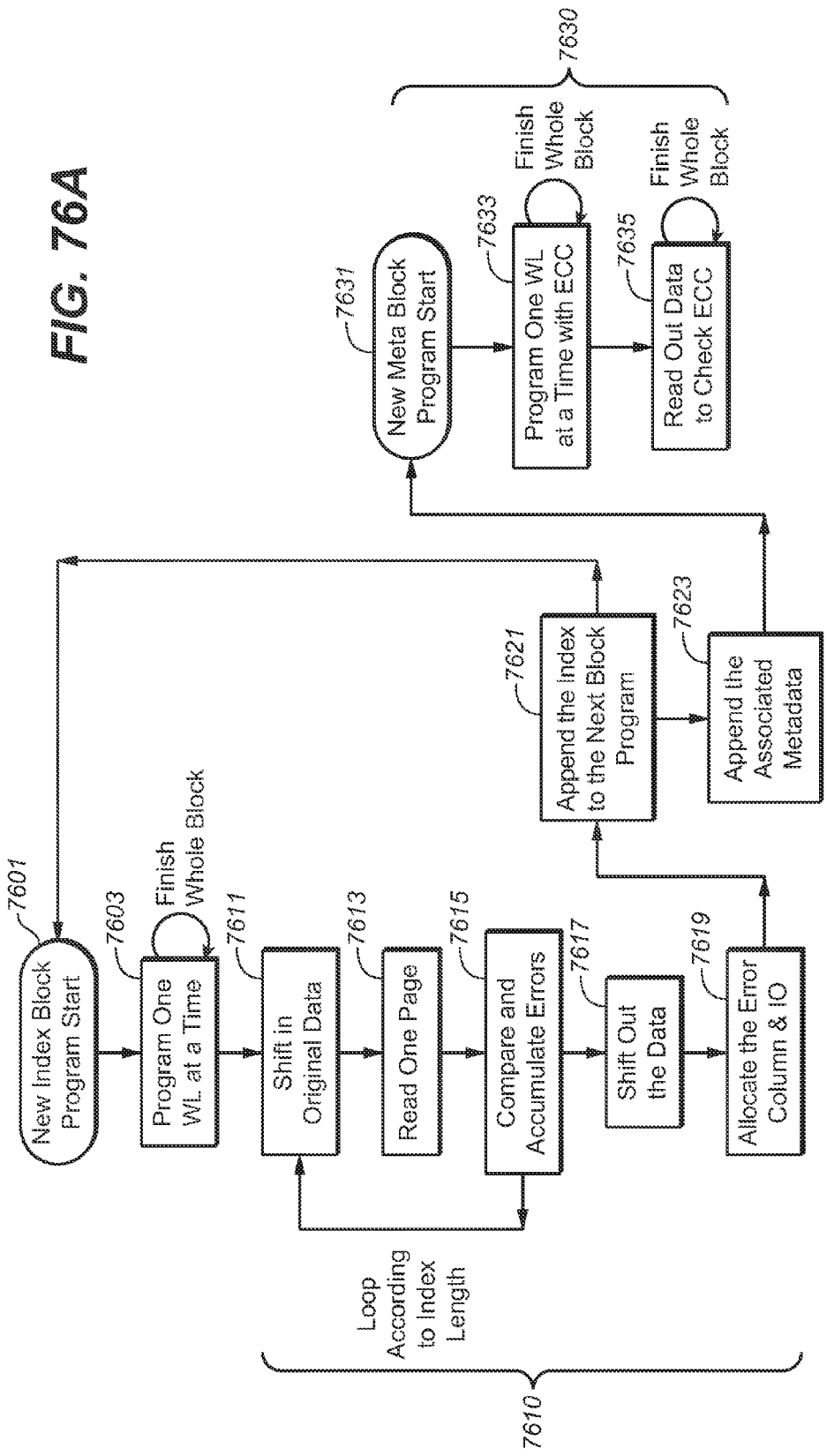
FIGS. 76A and B illustrate index and meta-data programming flows.

FIG. 76A is an exemplary flow for the programming of indices and also their corresponding meta-data to help reduce failure rates. The process begins at 7601 with the start of programming of a block. As described above in earlier sections, the indices have been rotated to a vertical orientation and are transferred in to the memory in pages that are then programmed along word lines at 7603. The process continues until the whole of the block is complete. (As noted above, for shorter indices, this can just be until a corresponding portion of the block on a smaller number of word lines is complete.) A post-write read operation is then performed at 7610 to find any indices that may have been incorrectly programmed. Although the indices have a vertical orientation, read and write pages are horizontally aligned, so that process proceeds a word line at a time. At 7611, the original data for a word line can be shifted to memory. The data as written to the word line is then read back at 7613 and compared at 7615 to the original data to see whether any errors are present.

The errors are recorded, but as it is only needed to determine whether there is any error for each index, the individual errors for the different word lines need not be maintained, but only accumulated individually for each bit line, such as can be done at 7615 by accumulating the errors in an OR process. For example, referring back to FIG. 55, the correct data can be shifted back in to register 1 5505 for each column, the readback data from the area can be stored into register 0 5503, and these results can be XOR-ed on a column by column based and the results stored in register 2 5507, with a "1" representing an error. As this is done for each word line, the result can be OR-ed with the result from earlier word lines of the block in register 2 5507 to accumulate an error for the index on that column in the block.

Figure 76B:
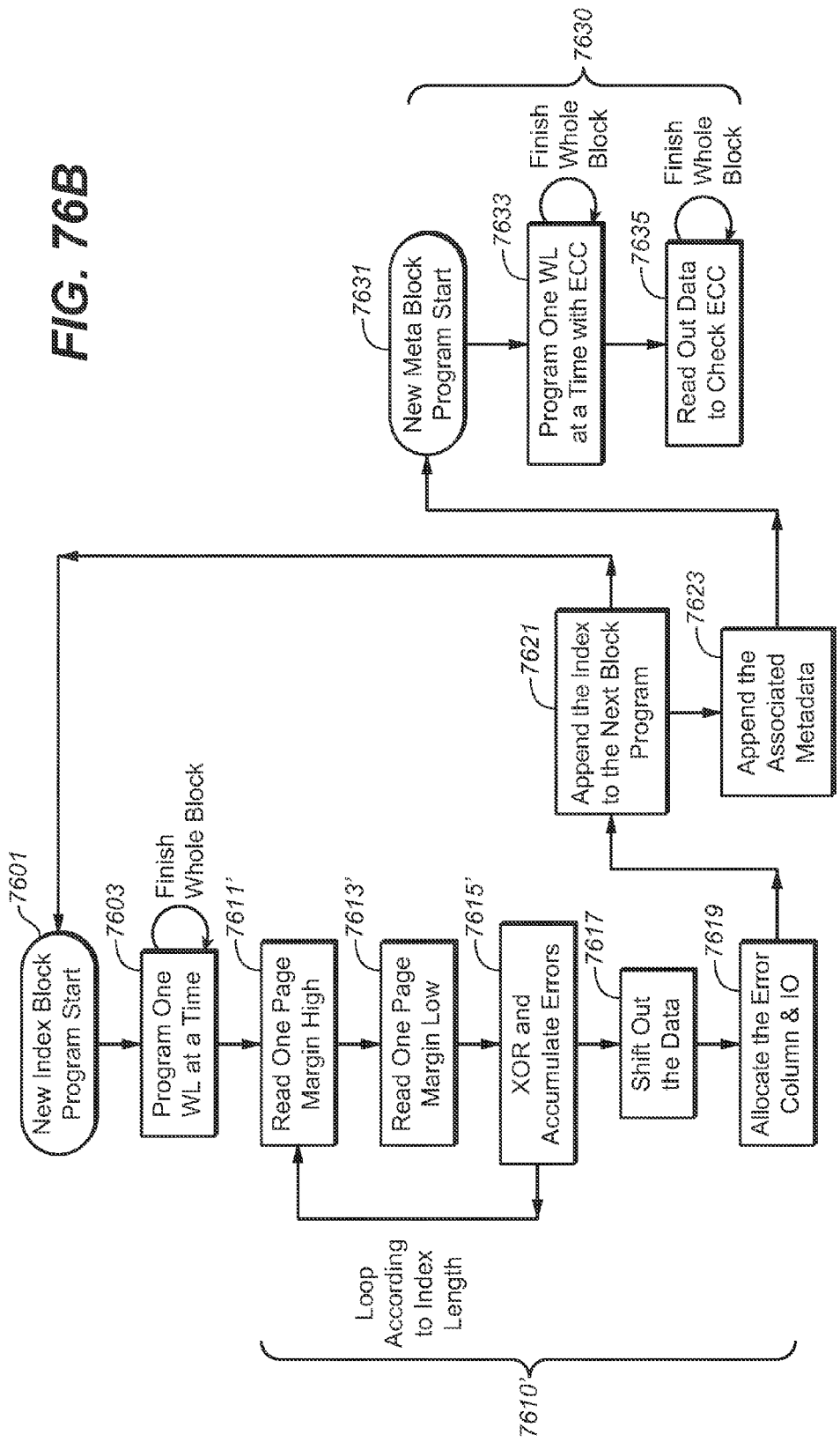

In a variation, the data write can instead, or additionally, be checked reading back the data written to each word line twice, where the read margins are shifted and the results of the two reads XOR-ed to determine any errors. This is illustrated in FIG. 76B, where, relative to FIG. 76A, 7611, 7613 and 7615 are replaced by 7611', 7613', and 7615'. At 7611' a page is read at a first margining level (here margined high). The page is then re-read with a different margining (here low) 7613'. At 7615', the resulted are then compared by XOR-ing bit-wise to determine which have changed, with the results then accumulated. (More detail on this sort of process can be found in US patent publication number 2008/0158989 A1.) This process can be done entirely on chip, without the need to shift the comparison data back to the memory and occupying the IO lines, which can then be freed up for other operations.

For either of FIG. 76A or 76B, the result of the post-write read for column verification can then shifted out at 7617. For any errors found, the column address and IO address can be specified at 7619 and dealt with at 7621 by appending any such indices to the next block to be programmed. Indices found defect can then also be marked as obsolete, where, for example, one row could be set aside for this purpose and programmed to block defective indices, similar to as described above. Any data associated with the index, such as a corresponding data set, needs to be mapped accordingly and the associated meta-data is correspondingly appended at 7623. Meta-data can then be programmed 7630, where a more typical write process can be used. Staring at 7631, pages of meta data (including ECC) can be written a page at time on to word lines at 7633. Various post-write verifications can be used either along the one or subsequent to completing a block, such as subsequently reading the block out a page at time and checking it according to its ECC, as shown at 7635.

In addition to the initial write of the indices, a similar arrangement can be used in read scrub operations, where the data is checked now and again to ascertain is quality. (Various aspects of scrub operations are presented in US patent publications 2013/0128666, 2008/0239808, and 2005/003884, along with various references cited in these.) For example, index blocks can be checked periodically with margin low and margin high reads to see whether indices have gone, or are going, bad. If any indices are corrupted, that can then be reprogrammed as described.

Figure 77A:
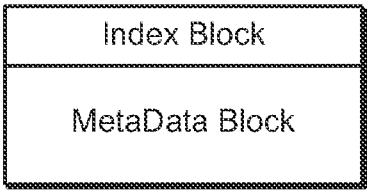
FIGS. 77A-D looks at several example of index-meta-data link cases.

FIGS. 77A-D consider several index to meta-data linking cases. FIG. 77A is the case of one index per block, where the index block and the meta-data blocks can have a 1 to 1 mapping. In the case of index program error, the meta-data is also be copied.

Figure 77B:
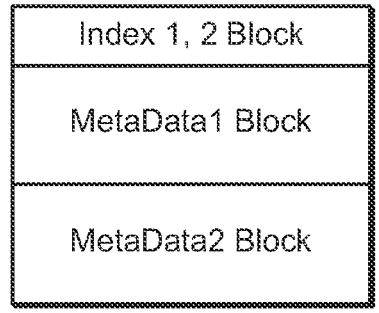

FIG. 77B looks at the case of shorted indices, where multiple indices (two, in this example) can be stored along each NAND string. Here, each index can be associated with a dedicated meta-block. The error of program can be accumulated according to index length.

Figure 77C:
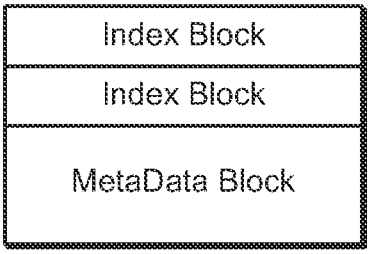

In FIG. 77C, one index runs across multiple (here, two) blocks, as would be the case when the index length exceeds the NAND string length. The error on index program will be accumulated across the block boundary.

Figure 77D:
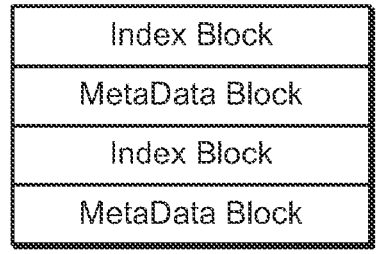

When the index runs across multiple blocks, this can also be managed by truncating the index into several segments each saved in one block. This is illustrated in FIG. 77D. In this case, multiple columns can correspond to one meta-data. The error of program can be accumulated across a few column IO addresses. The index and metadata will be re-programmed in other locations.

CONCLUSION

The foregoing detailed description has been presented for purposes of illustration and description. It is not intended to be exhaustive or limiting to the precise form disclosed. Many modifications and variations are possible in light of the above teaching. The described embodiments were chosen in order to best explain the principles of the disclosed technology and its practical application, to thereby enable others skilled in the art to best utilize the technology in various embodiments and with various modifications as are suited to the particular use contemplated.

It is claimed:

1. A method of operating a memory system, the memory system including an array of non-volatile memory cells arranged into a NAND type of architecture, including a plurality NAND strings and a plurality word lines spanning the NAND strings, each of the word lines connected to a corresponding one of the memory cells thereof, the method comprising:
receiving a search data pattern;
splitting the search data pattern into a plurality of sub-patterns including at least first and second sub-patterns respectively corresponding to first and second sets of non-adjacent ones of the word lines;
performing a first determination comprising:
biasing the corresponding first set of the word lines according to the first sub-pattern; and
concurrently determining those of the NAND strings that conduct in response to the corresponding first set of the word lines biased according to the first sub-pattern being applied thereto;
performing a second determination comprising:
biasing the corresponding second set of the word lines according to the second sub-pattern; and
concurrently determining those of the NAND strings that conduct in response to the corresponding second set of the word lines biased according to the second sub-pattern being applied thereto; and
subsequently combining results of the first and second determinations to determine those of the NAND strings that conduct in response to the word lines biased according to the first and second sub-patterns being applied thereto.

2. The method of claim 1, wherein the array is formed of a plurality of blocks and the first and second sets of word lines are from different blocks.

3. The method of claim 1, wherein the array is formed of a plurality of blocks and the first and second sets of word lines are from the same block.

4. The method of claim 3, wherein the word lines of one of the first and second sets of word lines are even word lines and the other of the first and second sets of word lines are odd word lines.

5. The method of claim 1, wherein said biasings include setting those of the word lines of NAND strings not biased according to the corresponding sub-pattern to a pass value.

6. The method of claim 1, where each of the NAND strings is connected along a corresponding bit line having an associated plurality of latches, and wherein the first and second determinations include storing the result of the corresponding determining in a respective first and second one of the corresponding associated latches, and wherein said combining results of the first and second determinations is based on the results stored in the latches.

7. The method of claim 1, wherein each of the NAND string stores a corresponding data pattern and a copy of the corresponding data pattern.

8. The method of claim 1, wherein each of the NAND string stores a corresponding data pattern and an inverted copy of the corresponding data pattern.

9. The method of claim 8, wherein at least one of the sub-pattern does not include the word lines corresponding to both a first bit of the search data pattern and the first bit in inverted form for the search pattern.

10. The method of claim 1, further comprising:
receiving from a host device to which the memory system is connected a plurality of data patterns;

forming the plurality of data patterns into pages of data whereby, when written into the memory, the data patterns will lie along the NAND strings; and writing the pages of data a page at a time, each page being written along on of the word lines, wherein the data pages are written to be non-sequentially order on the word lines.

11. The method of claim 10, wherein a first half of the data pages are written on odd ones of the word lines and a second half of data pages are written on even ones of the word lines.

12. The method of claim 10, wherein each of the pages of data are written in along two of the word lines.

13. The method of claim 10, wherein each of the pages of data are written in along a first of the word lines and, in inverted form, along a second of the word lines.

14. The method of claim 1, wherein the first and second sub-patterns correspond to first and second attributes of data sets stored along the NAND strings.

15. A method of operating a memory system, the memory system including a memory circuit having an array of non-volatile memory cells arranged into a plurality of blocks, each of the blocks including a first plurality NAND strings and a plurality word lines spanning the NAND strings, each of the word lines connected to a corresponding one of the memory cells thereof, where a first plurality of bit lines span the blocks with each of the blocks having one of the NAND strings thereof connected along a corresponding one of the bit lines, the method comprising:

storing a plurality of data patterns each along a bit line of the memory array, where each of the data patterns are stored in inverted and non-inverted forms along the same bit line, the bits of the non-inverted form of the data patterns being stored along a first set of word lines and the bits of the inverted form of the data patterns being stored along a second set of word lines;

receiving a search pattern; and performing a determination of whether any of the stored data patterns match the search pattern, including:

applying the search pattern to the first set of word lines and applying the search pattern in inverted form to the second set of word lines, wherein the search pattern and inverted form of the search pattern are applied in a plurality of sensing operations in which a plurality of non-adjacent word lines for one or more blocks are concurrently biased to a data dependent voltage level based upon the search pattern.

16. The method of claim 15, wherein the first and second set of word lines belong to the same block of the memory array.

17. The method of claim 15, wherein the first and second set of word lines respective belong to first and second blocks of the memory array, where the first and second blocks are different.

18. The method of claim 15, wherein the data dependent bias voltages are margined high relative to the corresponding bias voltage levels used in a program verify operation.

19. The method of claim 15, wherein the bits of the data patterns are stored along the NAND strings in a non-consecutive order relative to their order as received at the memory system from a host device for one or both of the patterns in non-inverted and inverted form.

20. A method of operating a memory system, the memory system including a memory circuit having an array of non-volatile memory cells arranged into a plurality of blocks, each of the blocks including a first plurality NAND strings and a plurality word lines spanning the NAND strings, each of the word lines connected to a corresponding one of the memory cells thereof, where a first plurality of bit lines span the blocks with each of the blocks having one of the NAND strings thereof connected along a corresponding one of the bit lines, the method comprising:

storing a plurality of data patterns each along a bit line of the memory array, where each of the data patterns a first copy and a second copy are stored along the same bit line, the bits of the first copy being stored along a first set of word lines and the bits of the second copy being stored along a second set of word lines;

receiving a data search query; and performing a search operation on the stored data patterns based upon the data search query, including:

concurrently biasing first and second word lines respectively from the first and second sets of word lines to a voltage level based upon the data search query, where the first and second word lines correspond to the same bit of the data patterns respectively from the first and second copies thereof.

21. The method of claim 20, wherein the first and second set of word lines belong to the same block of the memory array.

22. The method of claim 21, wherein the data dependent bias voltages are margined high relative to the corresponding bias voltage levels used in a program verify operation.

23. The method of claim 20, wherein the first and second set of word lines respective belong to first and second blocks of the memory array, where the first and second blocks are different.

24. The method of claim 23, wherein the data dependent bias voltages are margined low relative to the corresponding bias voltage levels used in a program verify operation.

25. The method of claim 20, wherein the bits of the data patterns are stored along the NAND strings in a non-consecutive order relative to their order as received at the memory system from a host device for one or both copies of the patterns.

26. The method of claim 20, where the data search query is range search for a data value.

* * * * *